United States Patent
Lin et al.

(10) Patent No.: US 12,453,252 B1
(45) Date of Patent: Oct. 21, 2025

(54) OLED SUB-PIXEL CIRCUIT ARCHITECTURE AND RELATED METHODS

(71) Applicant: Applied Materials, Inc., Santa Clara, CA (US)

(72) Inventors: Yu-Hsin Lin, Zhubei (TW); Chung-Chia Chen, Hsinchu (TW); Ji Young Choung, Hwaseong-si (KR); Sheng-Wen Wang, Tainan (TW)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/826,732

(22) Filed: Sep. 6, 2024

(51) Int. Cl.
*H10K 59/122* (2023.01)
*H10K 59/38* (2023.01)
*H10K 59/80* (2023.01)

(52) U.S. Cl.
CPC .......... *H10K 59/122* (2023.02); *H10K 59/38* (2023.02); *H10K 59/80515* (2023.02); *H10K 59/873* (2023.02)

(58) Field of Classification Search
None
See application file for complete search history.

(56) References Cited

U.S. PATENT DOCUMENTS

| | | | |
|---|---|---|---|
| 6,060,728 A | 5/2000 | Ghosh et al. | |
| 6,137,220 A | 10/2000 | Nagayama et al. | |
| 6,476,988 B1 | 11/2002 | Yudasaka | |
| 8,686,629 B2 | 4/2014 | Oh et al. | |
| 8,987,717 B2 | 3/2015 | Kang | |
| 9,324,962 B2 | 4/2016 | Kim | |
| 9,337,244 B2 | 5/2016 | Hatano et al. | |
| 10,170,526 B1 | 1/2019 | Yang | |
| 10,580,843 B2 | 3/2020 | Zhao et al. | |
| 10,615,231 B2 | 4/2020 | Wu et al. | |
| 11,348,983 B1 | 5/2022 | Choung et al. | |
| 11,610,954 B1 | 3/2023 | Lin et al. | |
| 11,839,116 B2 | 12/2023 | Choung et al. | |
| 2002/0014836 A1 | 2/2002 | Codama et al. | |
| 2003/0006697 A1 | 1/2003 | Weaver | |
| 2006/0170340 A1 | 8/2006 | Tzen et al. | |
| 2009/0009069 A1 | 1/2009 | Takata | |

(Continued)

FOREIGN PATENT DOCUMENTS

| | | |
|---|---|---|
| CN | 105742311 A | 7/2016 |
| JP | 2016225319 A | 12/2016 |

*Primary Examiner* — Nduka E Ojeh
(74) *Attorney, Agent, or Firm* — Patterson + Sheridan, LLP

(57) ABSTRACT

The present disclosure provides devices and methods thereof. The devices include a substrate. An inorganic layer is disposed on the substrate. The inorganic layer defines sub-pixels of the device. The inorganic layer includes a plurality of overhang structures. The device includes a first sub-pixel, including a first anode having a first thickness, where a first organic light emitting diode (OLED) material is disposed over the first anode. The device includes a second sub-pixel, including a second anode having a second thickness, where a second OLED material is disposed over the second anode. The device includes a third sub-pixel, including a third anode having a third thickness, where a third OLED material is disposed over the third anode. The first thickness is greater than the second thickness, and the first OLED material and the second OLED material are the same.

30 Claims, 71 Drawing Sheets

(56) References Cited

U.S. PATENT DOCUMENTS

| | | | |
|---|---|---|---|
| 2012/0217516 A1 | 8/2012 | Hatano et al. | |
| 2012/0228603 A1 | 9/2012 | Nakamura | |
| 2014/0103385 A1 | 4/2014 | Hatano et al. | |
| 2014/0131743 A1 | 5/2014 | Jiang et al. | |
| 2014/0183460 A1* | 7/2014 | Kim | H10K 59/124 |
| | | | 438/34 |
| 2016/0336381 A1* | 11/2016 | Won | H10K 59/351 |
| 2019/0058020 A1 | 2/2019 | Tsai et al. | |
| 2019/0088730 A1 | 3/2019 | Lee et al. | |
| 2019/0348482 A1 | 11/2019 | Bae et al. | |
| 2020/0119114 A1 | 4/2020 | Kim et al. | |
| 2021/0135150 A1 | 5/2021 | Wang et al. | |
| 2021/0397302 A1 | 12/2021 | Yang et al. | |
| 2022/0077251 A1 | 3/2022 | Choung et al. | |
| 2022/0077252 A1 | 3/2022 | Choung et al. | |
| 2022/0077257 A1 | 3/2022 | Choung et al. | |
| 2024/0179958 A1* | 5/2024 | Son | H10K 59/1201 |
| 2024/0389398 A1* | 11/2024 | Park | H10K 59/173 |
| 2024/0407234 A1* | 12/2024 | Shin | H10K 59/873 |
| 2024/0423029 A1* | 12/2024 | Shim | H10K 59/124 |

\* cited by examiner

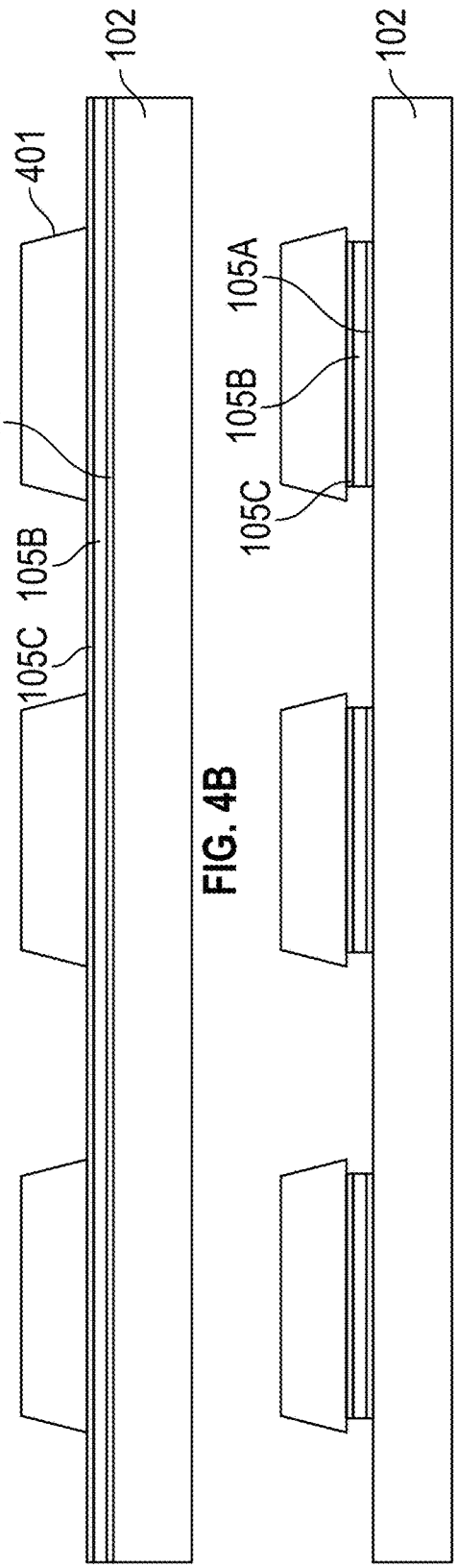

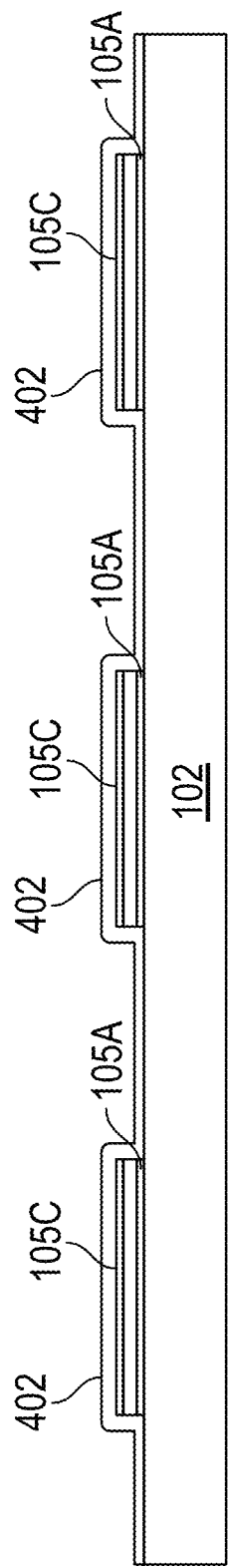
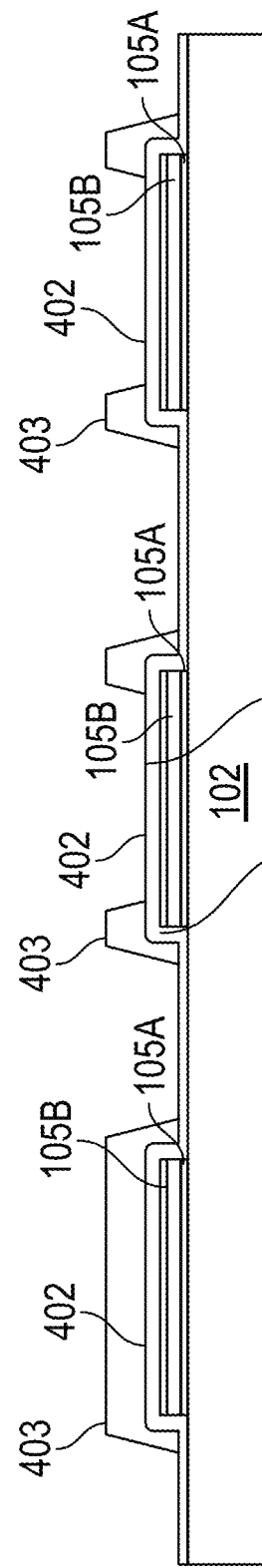
FIG. 4F
FIG. 4G

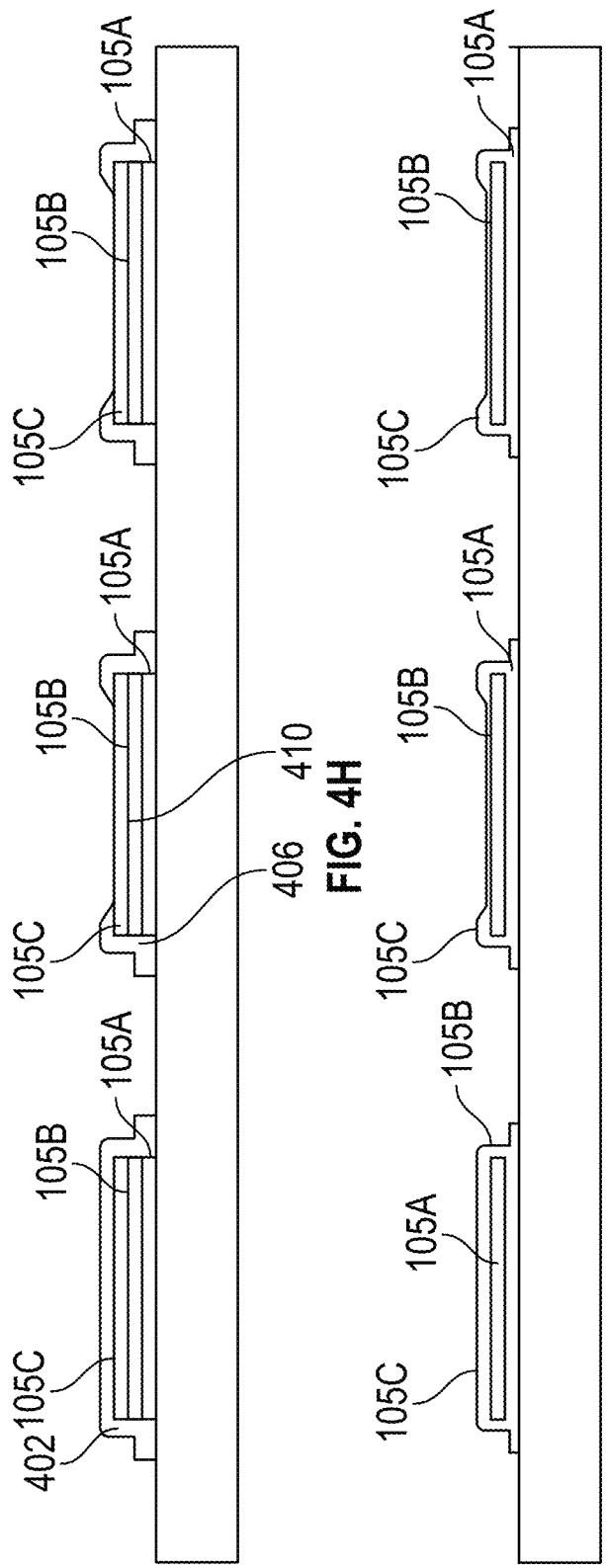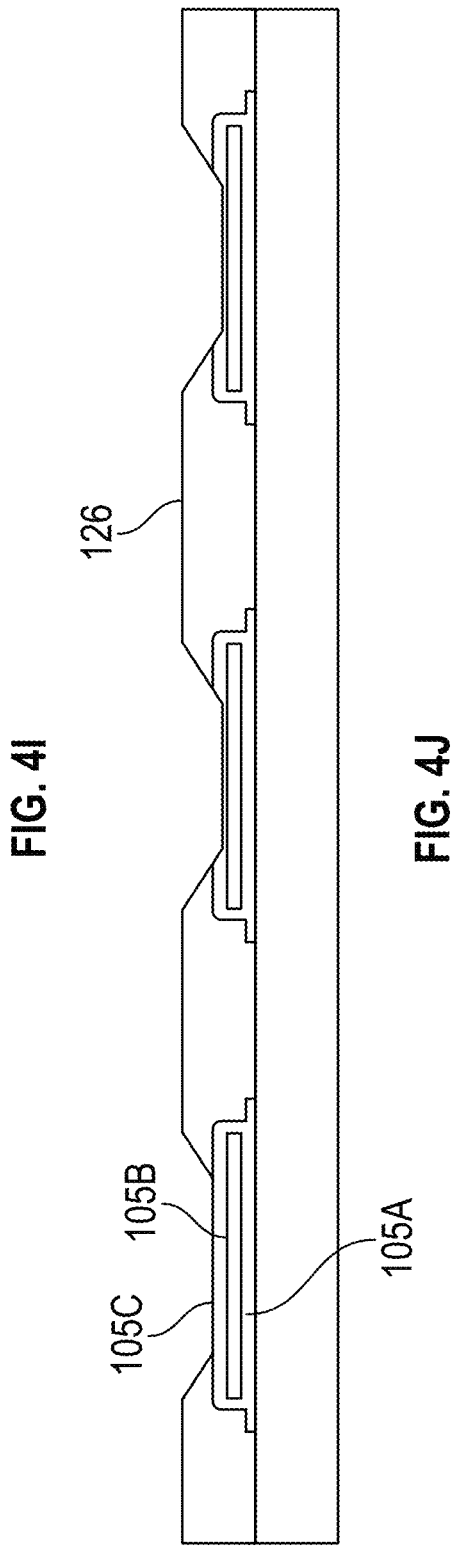

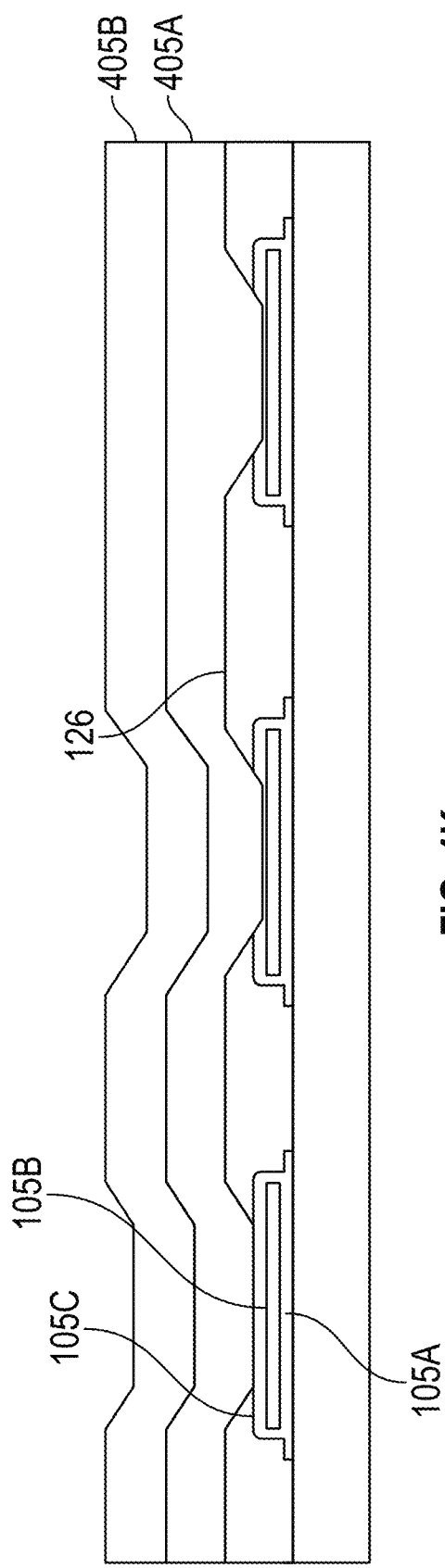
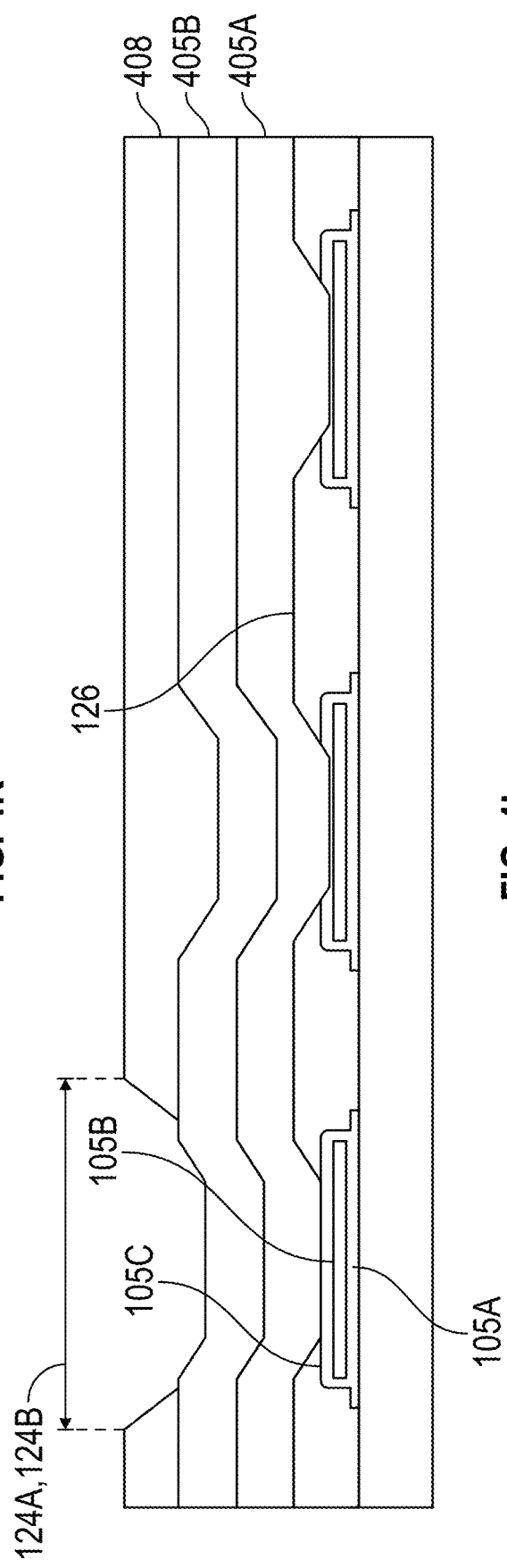
FIG. 4K
FIG. 4L

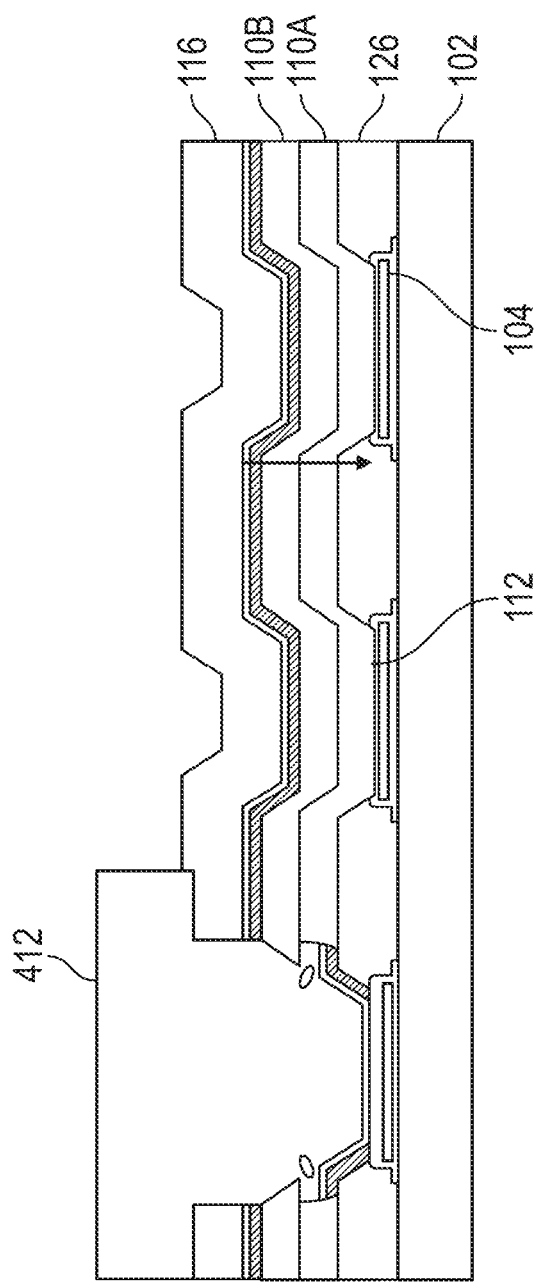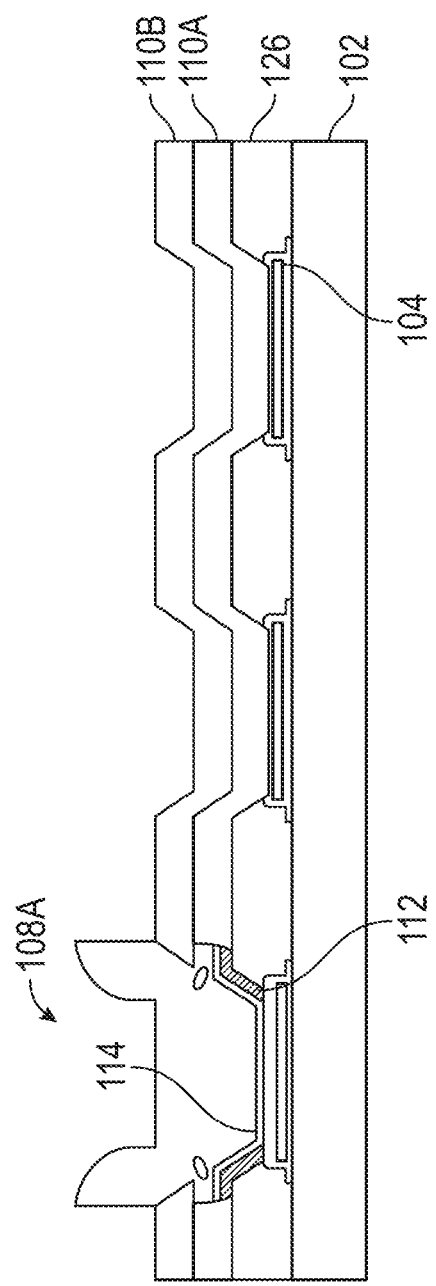

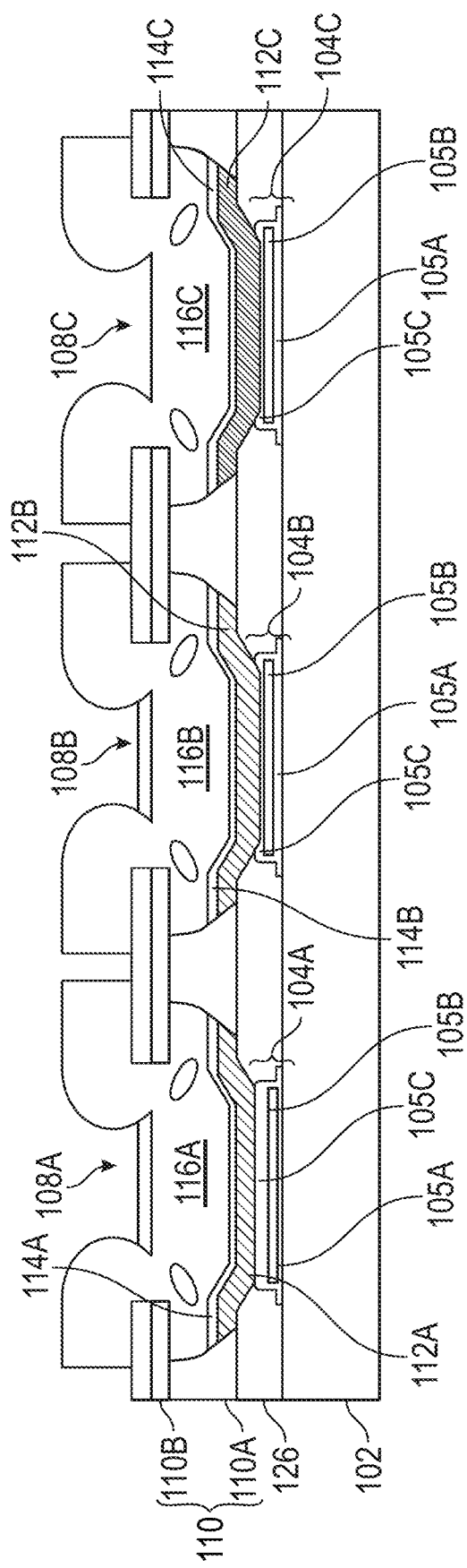
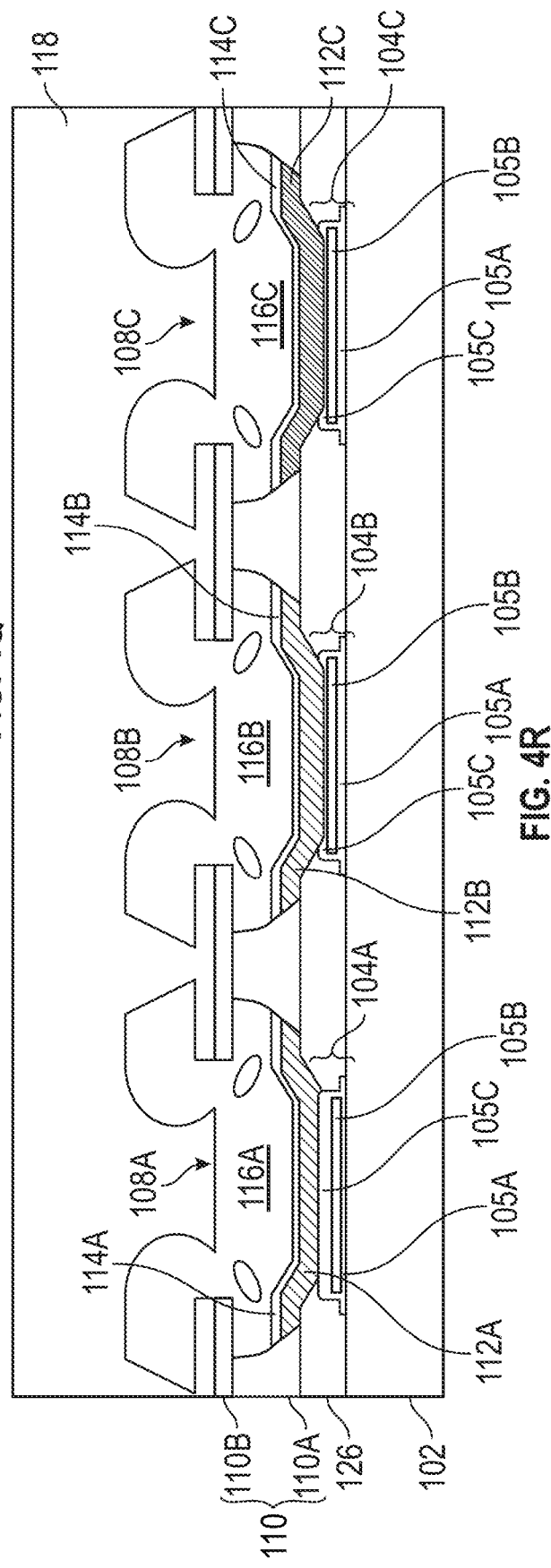
FIG. 4Q
FIG. 4R

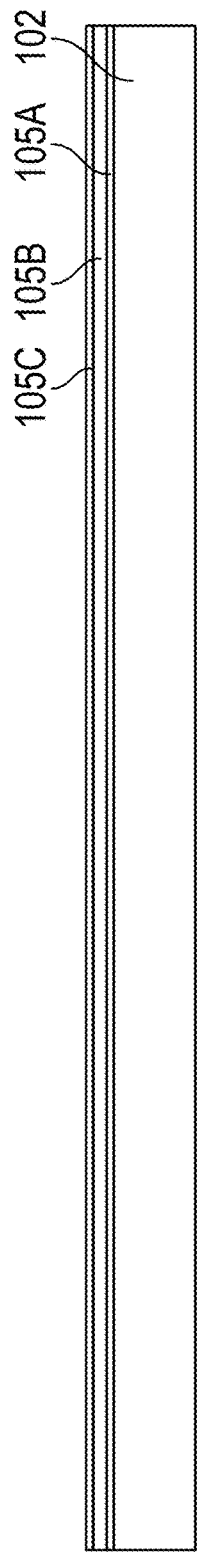
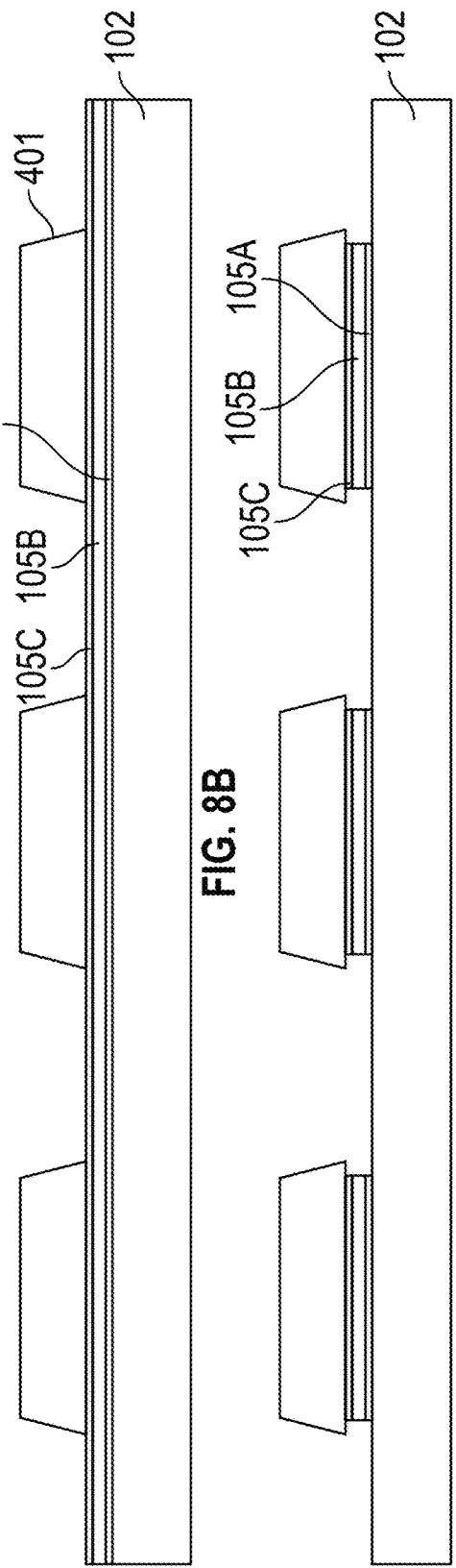
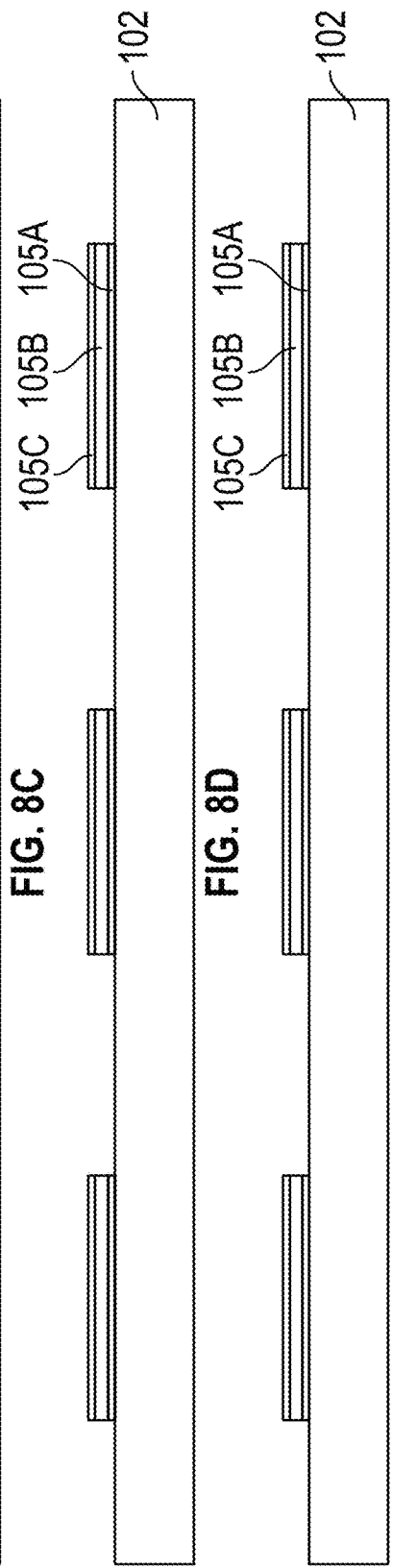
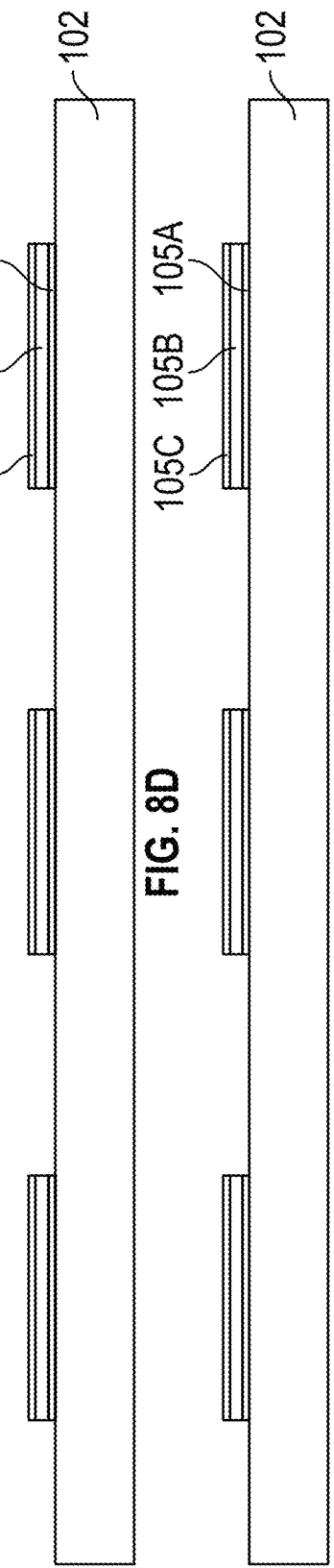

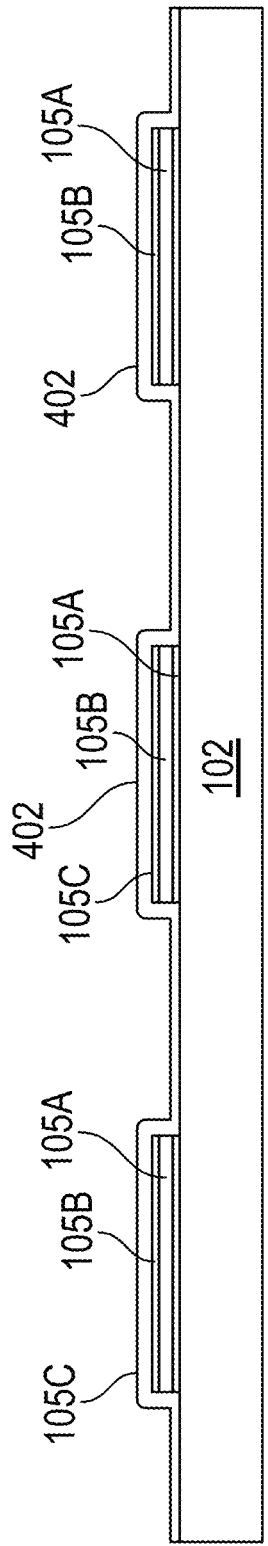
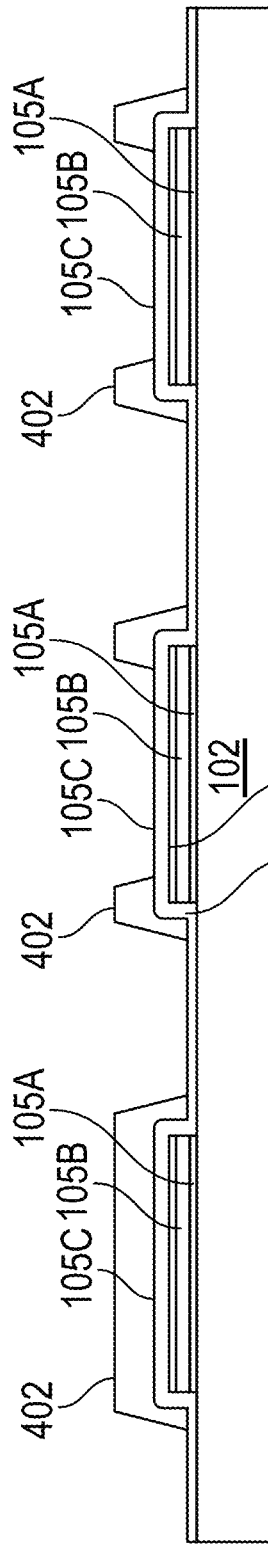

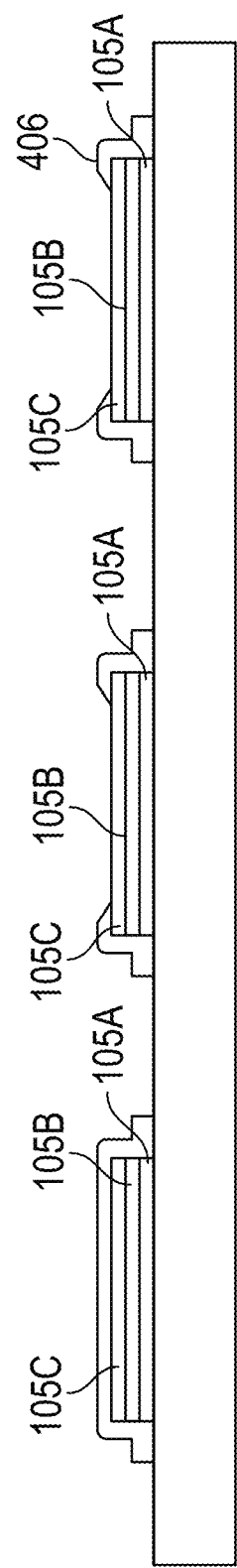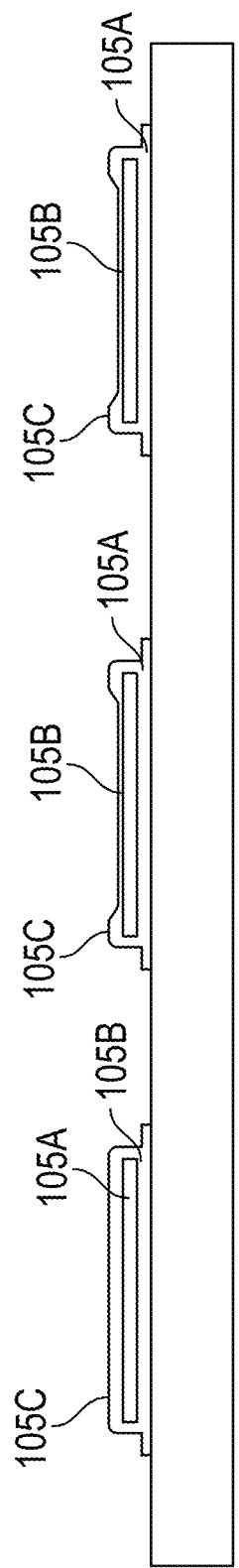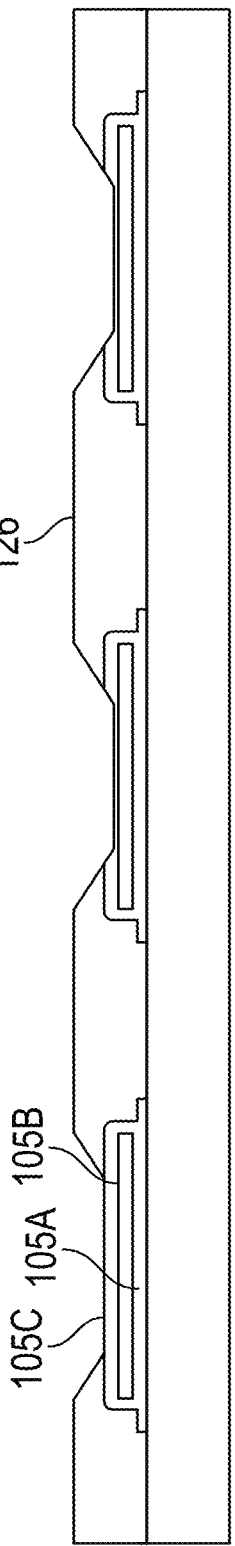

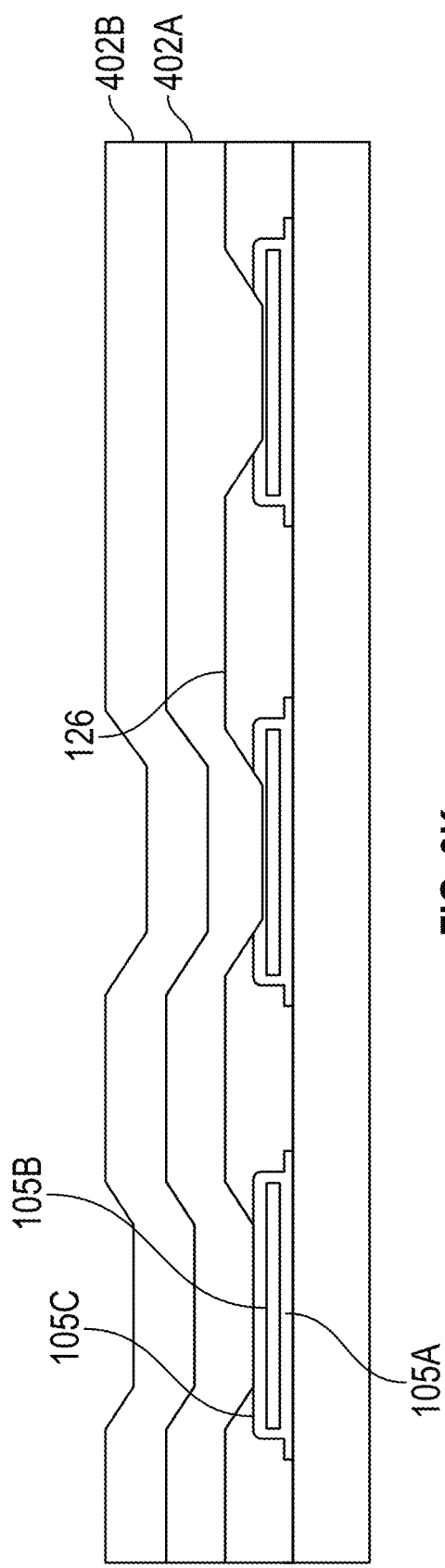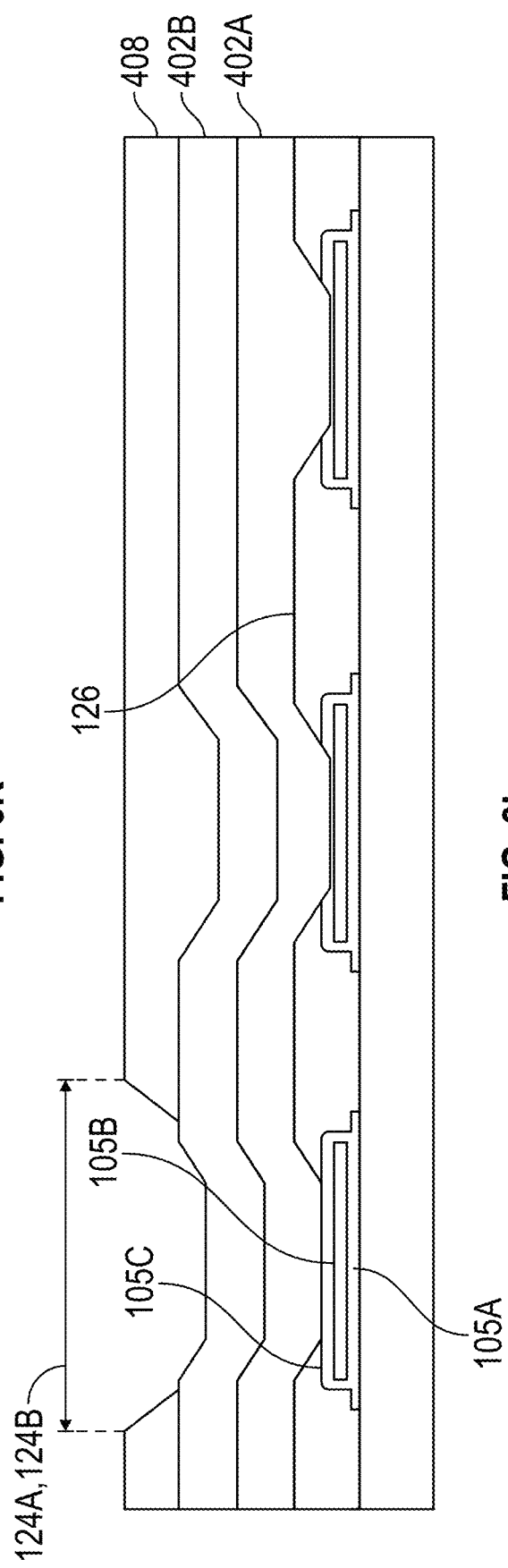

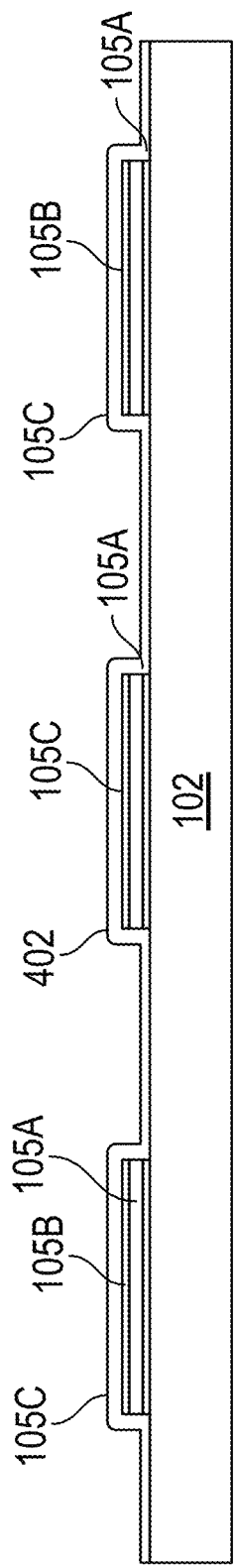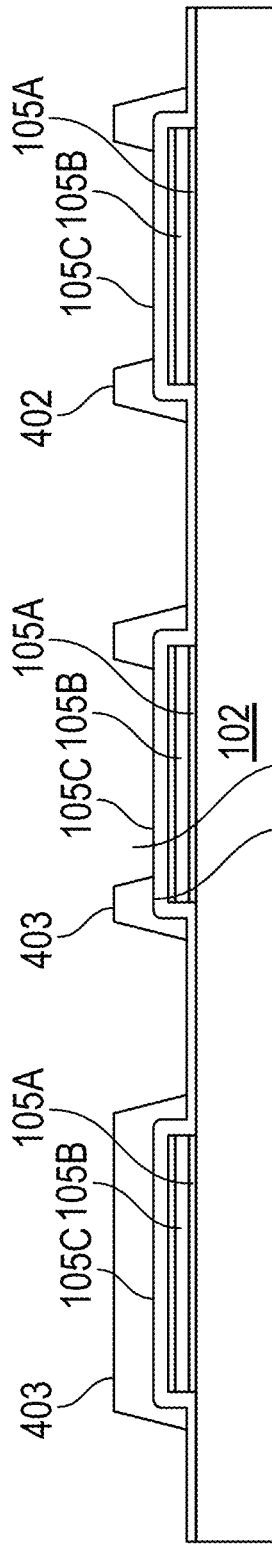

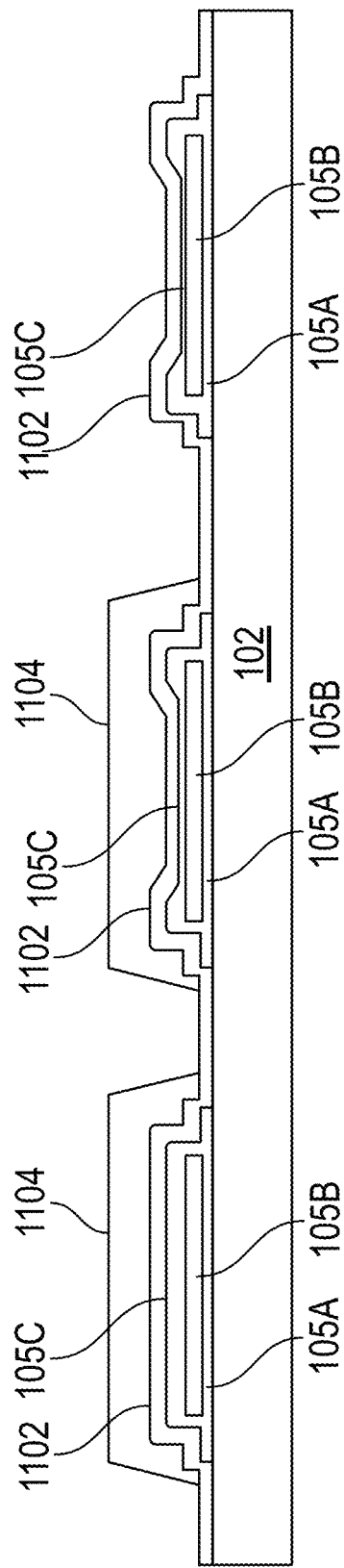
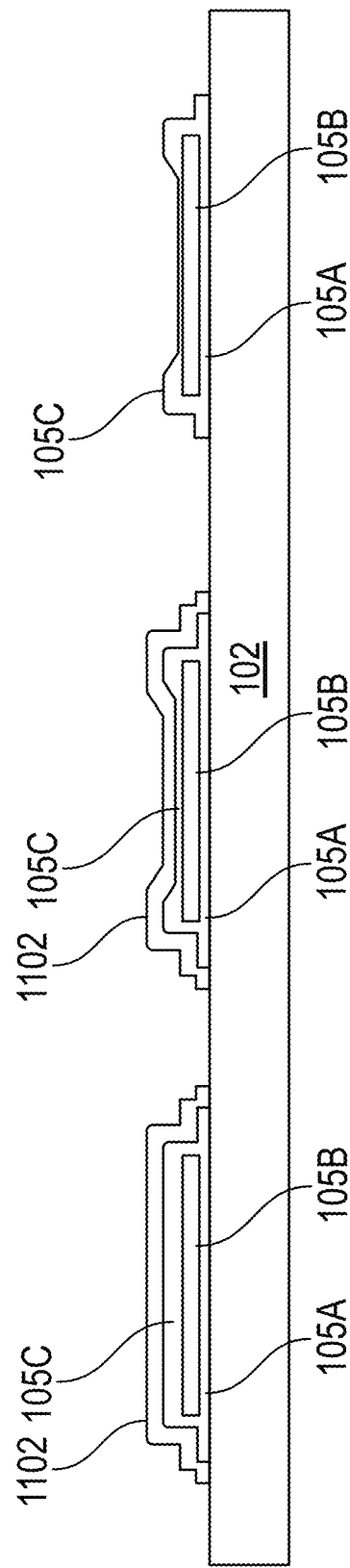

OLED SUB-PIXEL CIRCUIT ARCHITECTURE AND RELATED METHODS

BACKGROUND

Field

Embodiments of the present disclosure generally relate to a display. More specifically, embodiments described herein relate to pixels and methods of forming pixels that may be utilized in a display such as an organic light-emitting diode (OLED) display.

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics today. Today's electronics manufacturers are pushing these display devices to shrink in size while providing higher resolution than just a few years ago.

Generally, OLED pixel patterning utilizes a fine metal mask process, which restricts panel size, pixel resolution, and substrate size. Attempts to overcome the challenges of using a fine metal mask process have involved using photolithography processes to pattern pixels. Unfortunately, conventional photolithography processes and OLED pixel patterning processes can result in oxidation of the organic material, oxidation of an overhang of an inorganic material, poor cathode coverage, residue of an encapsulation layer over an inorganic substrate, and poor deposition under an overhang of the inorganic material, each of which can disrupt OLED performance.

Accordingly, what is needed in the art are OLED pixels and methods of forming OLED pixels to improve OLED performance.

SUMMARY

In an embodiment, the present disclosure provides devices. The devices include a substrate. An inorganic layer is disposed on the substrate. The inorganic layer defines sub-pixels of the device. The inorganic layer includes a plurality of overhang structures. The device includes a first sub-pixel, including a first anode having a first thickness, in which the first anode is disposed over the substrate. The first sub-pixel includes a first organic light emitting diode (OLED) material that is disposed over and in contact with the first anode. The device includes a second sub-pixel, including a second anode having a second thickness, in which the second anode is disposed over the substrate. The second sub-pixel includes a second OLED material that is disposed over and in contact with the second anode. The device includes a third sub-pixel, including a third anode having a third thickness, in which the third anode is disposed over the substrate. The third sub-pixel includes a third OLED material that is disposed over and in contact with the third anode. The first thickness is greater than the second thickness. The first OLED material and the second OLED material are the same.

In another embodiment, the present disclosure provides devices. The devices include a substrate. An inorganic layer is disposed on the substrate. The inorganic layer defines sub-pixels of the device. The inorganic layer includes a plurality of overhang structures. The device includes a first sub-pixel, including a first anode having a first thickness, in which the first anode is disposed over the substrate. The first sub-pixel includes a first organic light emitting diode (OLED) material that is disposed over and in contact with the first anode. The device includes a second sub-pixel, including a second anode having a second thickness, in which the second anode is disposed over the substrate. The second sub-pixel includes a second OLED material that is disposed over and in contact with the second anode. The device includes a third sub-pixel, including a third anode having a third thickness, in which the third anode is disposed over the substrate. The third sub-pixel includes a third OLED material that is disposed over and in contact with the third anode. A global passivation layer is disposed over the first sub-pixel, the second sub-pixel, the third sub-pixel, and the plurality of overhang structures. The first thickness is greater than the second thickness. The first OLED material and the second OLED material are the same.

In another embodiment, the present disclosure provides devices. The devices include a substrate. An inorganic layer is disposed on the substrate. The inorganic layer defines sub-pixels of the device. The inorganic layer includes a plurality of overhang structures. The device includes a first sub-pixel, including a first anode having a first thickness, in which the first anode is disposed over the substrate. The first sub-pixel includes a first organic light emitting diode (OLED) material that is disposed over and in contact with the first anode. The device includes a second sub-pixel, including a second anode having a second thickness, in which the second anode is disposed over the substrate. The second sub-pixel includes a second OLED material that is disposed over and in contact with the second anode. The device includes a third sub-pixel, including a third anode having a third thickness, in which the third anode is disposed over the substrate. The third sub-pixel includes a third OLED material that is disposed over and in contact with the third anode. The first thickness is greater than the second thickness. The second thickness is greater than the third thickness. The first OLED material and the second OLED material are the same.

In another embodiment, the present disclosure provides devices. The devices include a substrate. An inorganic layer is disposed on the substrate. The inorganic layer defines sub-pixels of the device. The inorganic layer includes a plurality of overhang structures. The device includes a plurality of sub-pixels. Each sub-pixel including an anode. The anode including a first sub-layer, a second sub-layer disposed over the first sub-layer, and a third sub-layer disposed over the second sub-layer. An organic light-emitting diode (OLED) material is disposed over and in contact with the anode. The OLED material includes a first emission material, a charge generation layer, and a second emission material. A cathode is disposed over and in direct contact with the OLED material. An encapsulation layer is disposed over the encapsulation layer. The device includes at least a first anode having a first thickness, a second anode having a second thickness, and a third anode having a third thickness.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
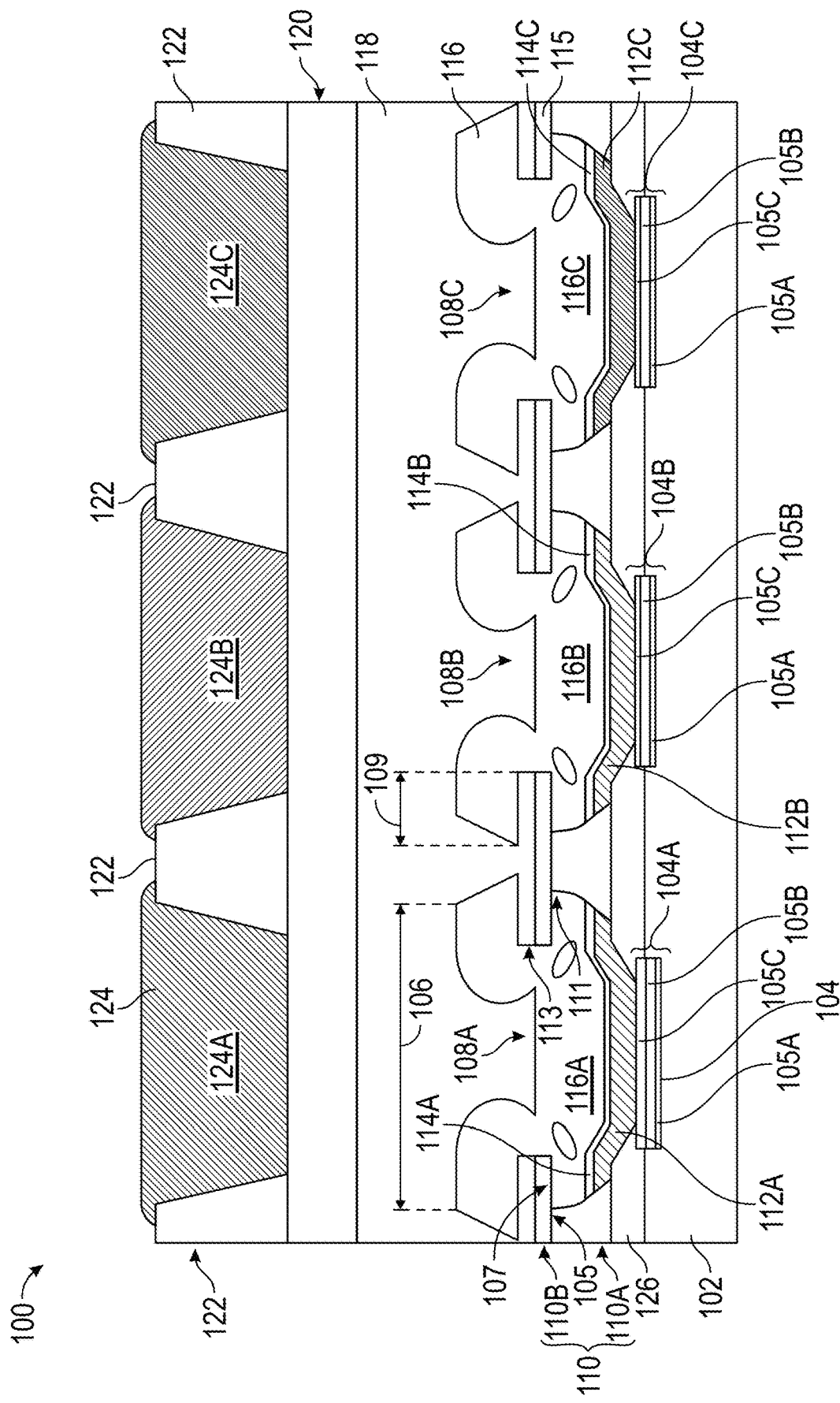
FIGS. 1A-1C are schematic, cross-sectional views of a sub-pixel circuit for an organic light-emitting diode (OLED) display, according to embodiments described herein.

Embodiments of the present disclosure generally relate to a display. More specifically, embodiments described herein relate to pixels and methods of forming pixels that may be utilized in a display, such as an organic light-emitting diode (OLED) display.

The sub-pixel circuit and methods thereof have an inorganic layer is disposed on the substrate, the inorganic layer defining sub-pixels of the device. The inorganic layer including at least an overhang structure. Each sub-pixel includes an anode, an organic light-emitting diode (OLED) material disposed over and in direct contact with the anode, a local passivation layer disposed over the OLED material, a device resist material disposed over and in direct contact with the local passivation layer. A global passivation layer and/or an intermediate layer can be disposed over and in direct contact with the plurality of overhang structures and the device resist material of each of the sub-pixels. As used herein, the term "direct contact" refers to directly touching with no deposited layer there between for at least some points of contacts.

Each of the embodiments described herein of the sub-pixel circuit include a plurality of sub-pixels with each of the sub-pixels defined by adjacent inorganic overhang structures that are permanent to the sub-pixel circuit. While the Figures depict three sub-pixels with each sub-pixel defined by adjacent inorganic overhang structures, the sub-pixel circuit of the embodiments described herein can include a plurality of sub-pixels, such as three or more sub-pixels. Each sub-pixel has the OLED material configured to emit a white, red, green, blue or other color light when energized, e.g., the OLED material of a first sub-pixel emits a white and/or red light when energized, the OLED material of a second sub-pixel emits a white and/or green light when energized, and the OLED material of a third sub-pixel emits a white and/or blue light when energized.

The inorganic overhang structures, when present, are permanent to the sub-pixel circuit and include at least an upper portion disposed on a lower portion. A first configuration of the inorganic overhang structure includes the upper portion of a non-conductive inorganic material and the lower portion of a conductive inorganic material. A second configuration of the inorganic overhang structure includes the upper portion of a conductive inorganic material and the lower portion of a conductive inorganic material. A third configuration of the inorganic overhang structures includes the upper portion of a non-conductive inorganic material, the lower portion of a non-conductive inorganic material, and an optional assistant cathode disposed under the lower portion. A fourth configuration of the inorganic overhang structures includes the upper portion of a conductive inorganic material, the lower portion of a non-conductive inorganic material, and an optional assistant cathode disposed under the lower portion. Any of the first, second, third, and fourth embodiments include inorganic overhang structures of at least one of the first, second, third, or fourth configurations.

The adjacent inorganic overhang structures defining each sub-pixel of the sub-pixel circuit of the display provide for formation of the sub-pixel circuit using evaporation deposition and provide for the inorganic overhang structures to remain in place after the sub-pixel circuit is formed. Evaporation deposition may be utilized for deposition of an OLED material (including a hole injection layer (HIL), a hole transport layer (HTL), an emissive layer (EML), and an electron transport layer (ETL)) and cathode. One or more of an encapsulation layer, and a global passivation layer may be disposed via evaporation deposition. The encapsulation layer of a respective sub-pixel is disposed over the cathode with the encapsulation layer extending under at least a portion of each of the adjacent inorganic overhang structures.

Overall the sub-pixel circuit and methods thereof can improve OLED pixel patterning processes by preventing oxidation of the organic material, preventing oxidation of an overhang of an inorganic material, preventing poor cathode coverage, preventing residue of an encapsulation layer over an inorganic substrate, and preventing poor deposition under an overhang of the inorganic material, each of which can disrupt OLED performance.

FIG. 1A is a schematic, cross-sectional view of a sub-pixel circuit 100. The sub-pixel circuit 100 includes a substrate 102. Metal layers 104 are be patterned on the substrate 102. The metal layers 104 are configured to operate anodes of respective sub-pixels. The metal layers 104 are a layer stack of a first sub-layer 105A, a second sub-layer 105B disposed over the first sub-layer 105A, and a third sub-layer 105C disposed over the second sub-layer 105B. The first sub-layer 105A includes a transparent conductive oxide (TCO) layer, e.g., indium tin oxide or indium zinc oxide. The first sub-layer 105A can include a thickness of about 1 nm to about 50 nm.

The second sub-layer 105B includes a metal layer, e.g., chromium, titanium, gold, silver, copper, aluminum, or a combination thereof, disposed on the first sub-layer 105A. The second sub-layer 105B can include a thickness of about 50 nm to about 200 nm.

The third sub-layer 105C includes a transparent conductive oxide (TCO) layer, e.g., indium tin oxide or indium zinc oxide. The third sub-layer 105C can include a thickness of about 1 nm to about 200 nm. Optionally, the third sub-layer 105C has a thickness that is greater than the thickness of the first sub-layer 105A and/or the second sub-layer 105B. Without being bound by theory, a thicker third sub-layer 105C can allow for controllable wavelength emission of the OLED material, thereby reducing power requirements during operation of the sub-pixel circuit 100.

In an embodiment, which can be combined with other embodiments described herein, the third sub-layer 105C of a first sub-pixel 108A is thicker than a third sub-layer 105C of a second sub-pixel 108B and/or a third sub-pixel 108C. Without being bound by theory, by having the third sub-layer 105C of a first sub-pixel 108A be thicker than the third sub-layer 105C of the second sub-pixel 108B and/or the third sub-pixel 108C, the light emitted from the first OLED material 112A may be red-shifted, thereby causing emission of a yellow and/or white emitting OLED material to be more red.

In one embodiment, which can be combined with other embodiments described herein, the metal layers 104 are pre-patterned on the substrate 102, e.g., the substrate 102 is a pre-patterned indium tin oxide (ITO) glass substrate. In one embodiment, which can be combined with other embodiments described herein, the metal layers 104 are pre-patterned on the substrate 102, e.g., the metal layers 104 include a first sub-layer 105A of indium tin oxide, a second sub-layer 105B of silver, and a third sub-layer 105C of indium tin oxide.

The pixels are defined by adjacent pixel defining layer (PDL) structures disposed on the substrate 102. The PDL structures 126 can be disposed on the substrate 102. The PDL structures 126 include one of an organic material, an organic material with an inorganic coating disposed thereover, or an inorganic material. The organic material of the PDL structures 126 includes, but is not limited to, polyimides. The inorganic material of the PDL structures 126 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent PDL structures define a respective sub-pixel and expose the anode (i.e., metal layer 104) of the respective sub-pixel of the sub-pixel circuit 100.

The sub-pixel circuit 100 has a plurality of sub-pixels 106 including at least a first sub-pixel 108A, a second sub-pixel 108B, and a third sub-pixel 108C. While the Figures depict the first sub-pixel 108A, the second sub-pixel 108B, and the third sub-pixel 108C, the sub-pixel circuit 100 of the embodiments described herein may include three or more sub-pixels 106, such as a fourth and a fifth sub-pixel. Each sub-pixel 106 has an OLED material, e.g., first OLED material 112A, second OLED material 112B, and third OLED material 112C, configured to emit a white, red, green, blue or other color light when energized, e.g., the first OLED material 112A of the first sub-pixel 108A emits a yellow light when energized, the second OLED material 112B of the second sub-pixel 108B emits a yellow light when energized, the third OLED material 112C of the third sub-pixel 108C emits a blue light when energized, and the OLED material of a fourth sub-pixel emits a different color light when energized. The third OLED material 112C may be configured to emit a wavelength of light of about 380 nm to about 500 nm.

Inorganic overhang structures 110 are disposed over the substrate 102, thereby defining each sub-pixel of the plurality of sub-pixels. In some embodiments, as shown in FIG. 1A, the inorganic overhang structures 110 are disposed over each of the PDL structures 126. The inorganic overhang structures 110 are permanent to the sub-pixel circuit. The inorganic overhang structures 110 further define each sub-pixel 106 of the sub-pixel circuit 100. The inorganic overhang structures 110 include at least an upper portion 110B disposed on a lower portion 110A. A first configuration of the inorganic overhang structures 110 includes the upper portion 110B of a non-conductive inorganic material and the lower portion 110A of a conductive inorganic material. A second configuration of the inorganic overhang structures 110 includes the upper portion 110B of a conductive inorganic material and the lower portion 110A of a conductive inorganic material. A third configuration of the inorganic overhang structures 110 includes the upper portion 110B of a non-conductive inorganic material, the lower portion 110A of a non-conductive inorganic material, and an optional assistant cathode (not shown) disposed under the lower portion 110A. A fourth configuration of the inorganic overhang structures 110 includes the upper portion 110B of a conductive inorganic material, the lower portion 110A of a non-conductive inorganic material, and an optional assistant cathode (not shown) disposed under the lower portion 110A. The first, second, third, and fourth embodiments of the sub-pixel circuit 100 include inorganic overhang structures 110 of at least one of the first, second, third, or fourth configurations. The inorganic overhang structures 110 are able to remain in place, e.g., are permanent.

The non-conductive inorganic material includes, but is not limited to, an inorganic silicon-containing material, e.g., the silicon-containing material includes oxides or nitrides of silicon, or combinations thereof. The conductive inorganic material includes, but is not limited to, a metal-containing material, e.g., the metal-containing material includes copper, titanium, aluminum, molybdenum, silver, indium tin oxide, indium zinc oxide, or combinations thereof.

At least a bottom surface 107 of the upper portion 110B is wider than a top surface 105 of the lower portion 110A to form an overhang 109. The bottom surface 107 larger than the top surface 105 forming the overhang 109 allows for the upper portion 110B to shadow the lower portion 110A. The shadowing of the overhang 109 provides for evaporation deposition each of the OLED material 112 and a cathode 114.

The OLED material, e.g., e.g., first OLED material 112A, second OLED material 112B, and third OLED material 112C, may include one or more of a HIL, a HTL, an EML, and an ETL. The OLED material, e.g., first OLED material 112A, second OLED material 112B, and third OLED material 112C, is disposed on the metal layer 104. In some embodiments, which can be combined with other embodiments described herein, the OLED material, e.g., first OLED material 112A, second OLED material 112B, and third OLED material 112C, is disposed on the metal layer 104 and over a portion of the PDL structures 126. A first cathode 114A, a second cathode 114B, and a third cathode 114C is disposed over the first OLED material 112A, second OLED material 112B, and third OLED material 112C, respectively, of the PDL structures 126 in each sub-pixel 106. The first cathode 114A, the second cathode 114B, and the third cathode 114C may be disposed on a portion of a sidewall 111 of the lower portion 110A. The first cathode 114A, the second cathode 114B, and the third cathode 114C includes a conductive material, such as a metal, e.g., chromium, titanium, aluminum, ITO, or a combination thereof. In other embodiments, which can be combined with other embodiments described herein, the first OLED material 112A, second OLED material 112B, and third OLED material 112C and the first cathode 114A, the second cathode 114B, and the third cathode 114C are disposed over a top surface 115 of the upper portion 110B of the inorganic overhang structures 110, respectively.

Each sub-pixel 106 includes include an encapsulation layer 116. The encapsulation layer 116 may be or may correspond to a local passivation layer. The encapsulation layer 116 of a respective sub-pixel, e.g., first encapsulation layer 116A, second encapsulation layer 116B, and third encapsulation layer 116C, is disposed over the first cathode 114A, the second cathode 114B, and the third cathode 114C, respectively, with the encapsulation layer 116 extending under at least a portion of each of the inorganic overhang structures 110 and along a sidewall of each of the inorganic overhang structures 110. The encapsulation layer 116 is disposed over the cathode and over at least the sidewall 111 of the lower portion 110A. In some embodiments, which can be combined with other embodiments described herein, the encapsulation layer 116 is disposed over the sidewall 113 of the upper portion 110B. In some embodiments, which can be combined with other embodiments described herein, the encapsulation layer 116 is disposed over the top surface 115 of the upper portion 110B of the inorganic overhang structures 110. The encapsulation layer 116 can include a non-conductive inorganic material, such as the silicon-containing material. The silicon-containing material may include $Si_3N_4$ containing materials.

An intermediate layer 118 may be deposited over the encapsulation layers, as shown in FIG. 1A. The intermediate layer 118 can include a monomer and/or a polymer, e.g., an inorganic polymer or an organic polymer. In some embodiments, the intermediate layer 118 can include a thickness of about 1 μm to about 10 μm, e.g., about 1 μm to about 5 μm, about 2 μm to about 8 μm, or about 4 μm to about 6 μm. Optionally, a second encapsulation layer 120 may be deposited over the intermediate layer 118. The second encapsulation layer 120 can include any of the encapsulation layer 116. The second encapsulation layer 120 can include a thickness of about 1 μm to about 10 μm, e.g., about 1 μm to about 5 μm, about 2 μm to about 8 μm, or about 4 μm to about 6 μm.

A plurality of mask structures 122 may be disposed over the second encapsulation layer 120. The plurality of mask structures 122 can be a material suitable to absorb external and/or internal light, e.g., a black material such as a black absorbing material. The plurality of mask structures 122 are disposed according to the first sub-pixel 108A, a second sub-pixel 108B, and a third sub-pixel 108C. For example, the plurality of mask structures 122 are disposed to such that the plurality of mask structures are aligned with the PDL structures 126 and/or the inorganic overhang structures 110, thereby allowing light emission from the OLED materials through an opening between the plurality of mask structures 122.

A color filter is disposed in the opening between the plurality of mask structures 122. A first color filter 124A may be aligned with the first sub-pixel 108A, a second color filter 124B may be aligned with the second sub-pixel 108B, and a third color filter 124C may be aligned with the third sub-pixel 108C. Each of the first color filter 124A, the second color filter 124B, or the third color filter 124C may be configured to restrict light transparency from a bottom surface of the color filter to a top surface of the color filter to a specific color and/or wavelength, e.g., red, green, and/or blue. The third color filter may be configured to emit a wavelength of light of about 380 nm to about 500 nm. For example, the first color filter 124A may receive a yellow, white, and/or red light and restrict light transparency to the color red, thereby only emitting red emission from the first sub-pixel 108A. As a further example, the second color filter 124B may receive a yellow, white, and/or red light and may restrict light transparency to the color green, thereby only emitting green emission from the second sub-pixel 108B. As a further example, the third color filter 124C may receive a blue, white, and/or yellow light and may restrict light transparency to the color blue, thereby only emitting blue emission from the third sub-pixel 108C.

Figure 1B:
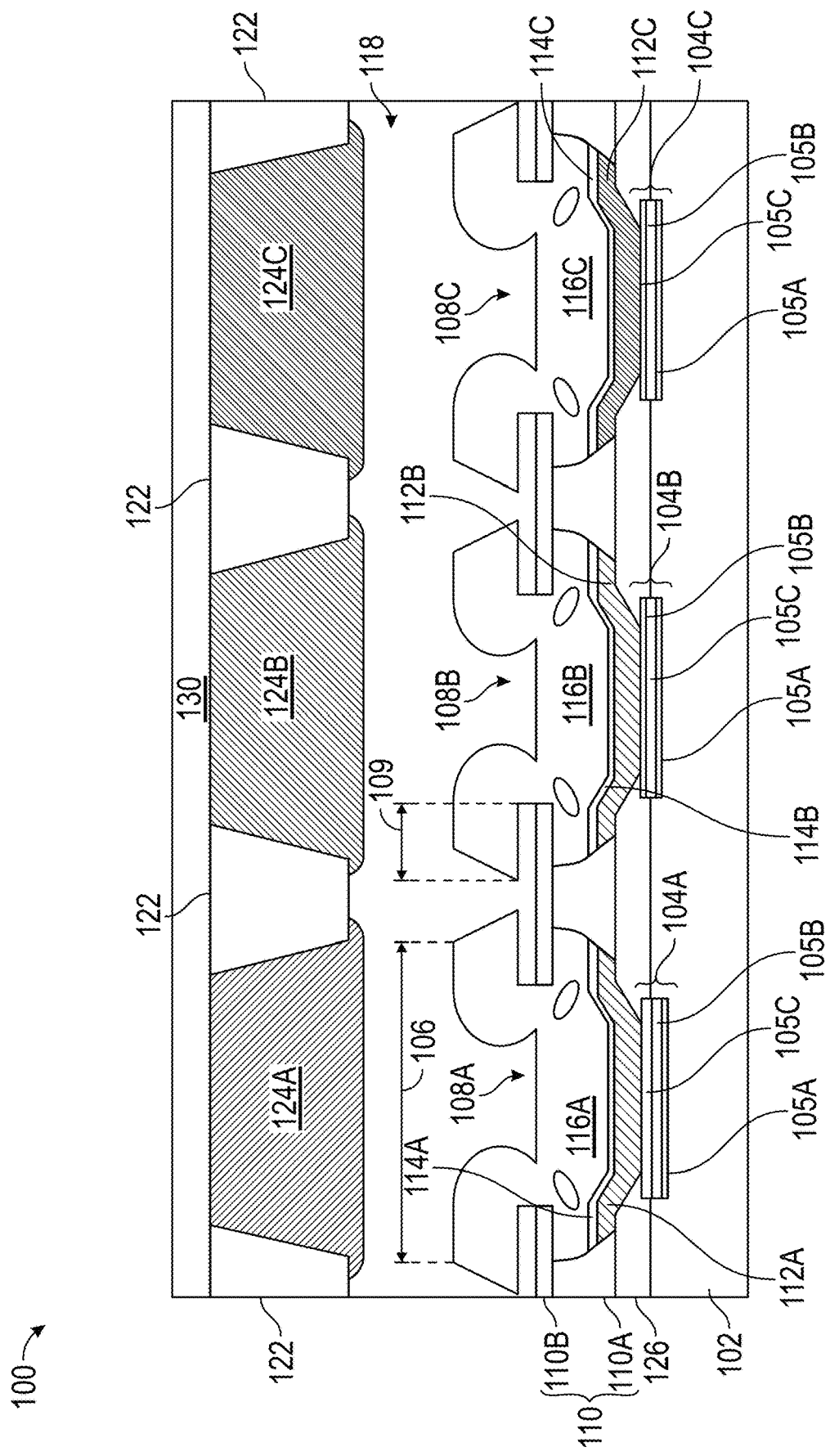

Optionally, the plurality of mask structures 122 and the color filters, e.g., the first color filter 124A, the second color filter 124B, or the third color filter 124C may be disposed on a backing material 130, as shown in FIG. 1B. The backing material 130 can include a transparent material suitable for supporting the plurality of mask structures 122 and the color filters, e.g., the first color filter 124A, the second color filter 124B, or the third color filter 124C. The plurality of mask structures 122 and the color filters, e.g., the first color filter 124A, the second color filter 124B, or the third color filter 124C may be disposed on the backing material 130, inverted, and placed on the intermediate layer 118, as shown in FIG. 1B, thereby allowing for manufacturing of the color filters to occur in parallel with the manufacturing of the sub-pixels, and reducing the time for manufacturing.

Figure 1C:
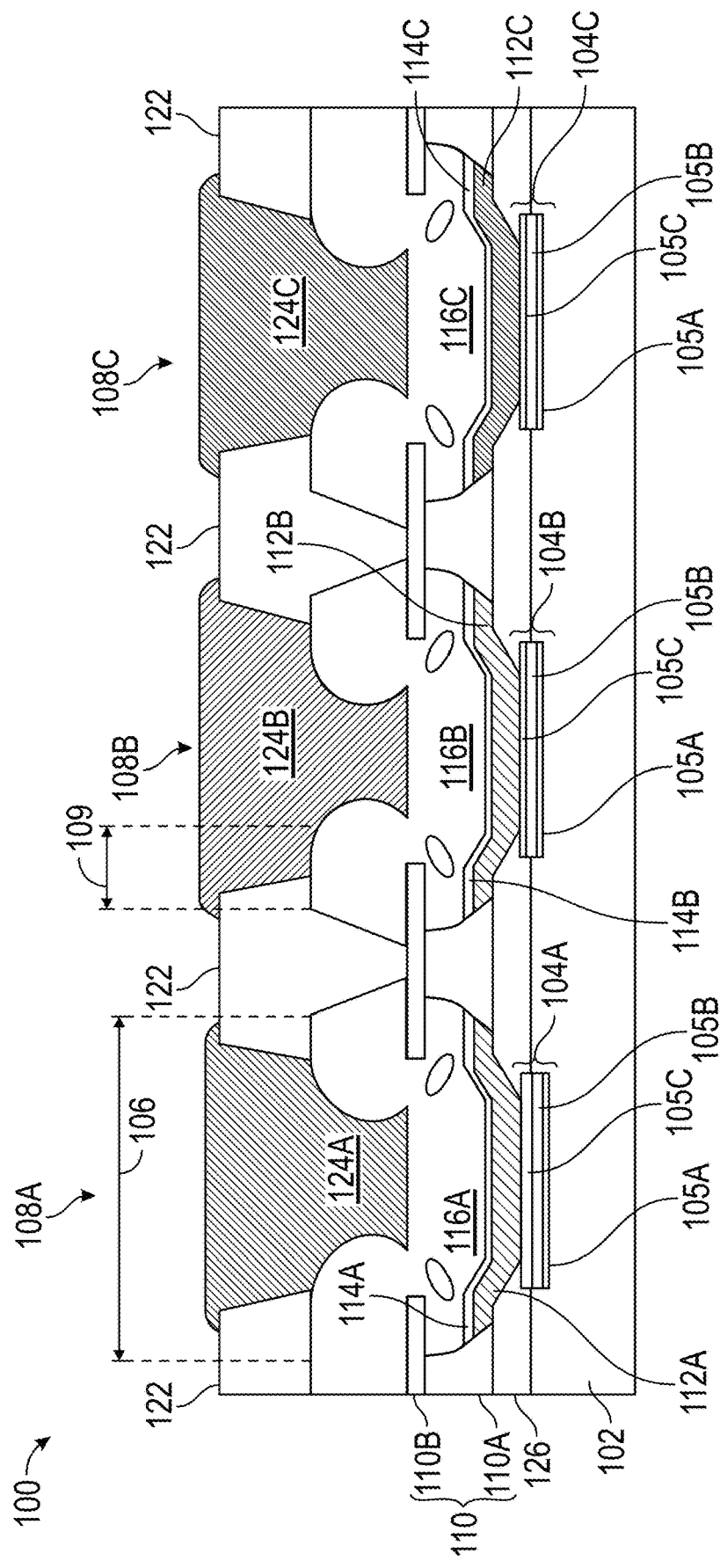

Optionally, the plurality of mask structures 122 may be deposited over the encapsulation layer 116, e.g., the first encapsulation layer 116A, the second encapsulation layer 116B, and/or the third encapsulation layer 116C, as shown in FIG. 1C. The color filters, e.g., the first color filter 124A, the second color filter 124B, or the third color filter 124C, are disposed over the first encapsulation layer 116A, and between the plurality of mask structures 122. Without being bound by theory, by disposing the color filters over the first encapsulation layer 116A, a reduction of manufacturing costs may occur.

Figure 2A:
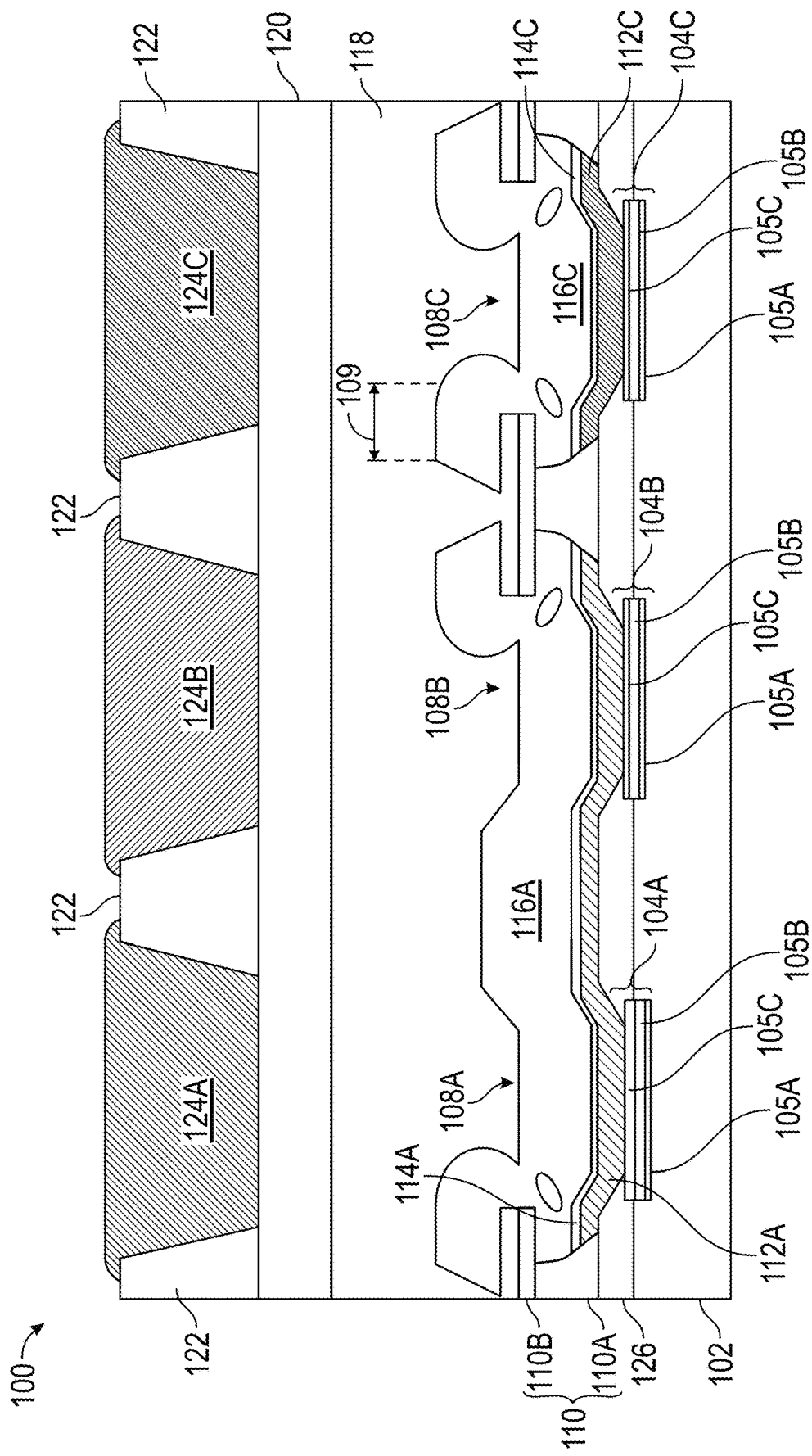
FIGS. 2A-2C are schematic, cross-sectional views of a sub-pixel circuit for an organic light-emitting diode (OLED) display, according to embodiments described herein.

FIG. 2A is a schematic, cross-sectional view of a sub-pixel circuit 100 having the first OLED material 112A and the first cathode 114A shared across the first sub-pixel 108A and the second sub-pixel 108B. The first OLED material 112A can include a yellow and/or white emitting OLED material, as described herein. The first OLED material 112A and the first cathode 114A may be shared due to a removal of an inorganic overhangs structure 110 between the first sub-pixel 108A and the second sub-pixel 108B.

The third sub-layer 105C of the first sub-pixel 108A is thicker than a third sub-layer 105C of the second sub-pixel 108B. Without being bound by theory, by having the third sub-layer 105C of the first sub-pixel 108A be thicker than the third sub-layer 105C of the second sub-pixel 108B, the light emitted from the first OLED material 112A over the first sub-pixel 108A may be red-shifted compared to the light emission from the second OLED material 112B of the second sub-pixel 108B. Additionally, and without being bound by theory, a reduction of manufacturing costs occurs due to the reduced materials required to produce the sub-pixel circuit 100, e.g., reduction of overhang structures, and reduction of individualized OLED materials.

Figure 2B:
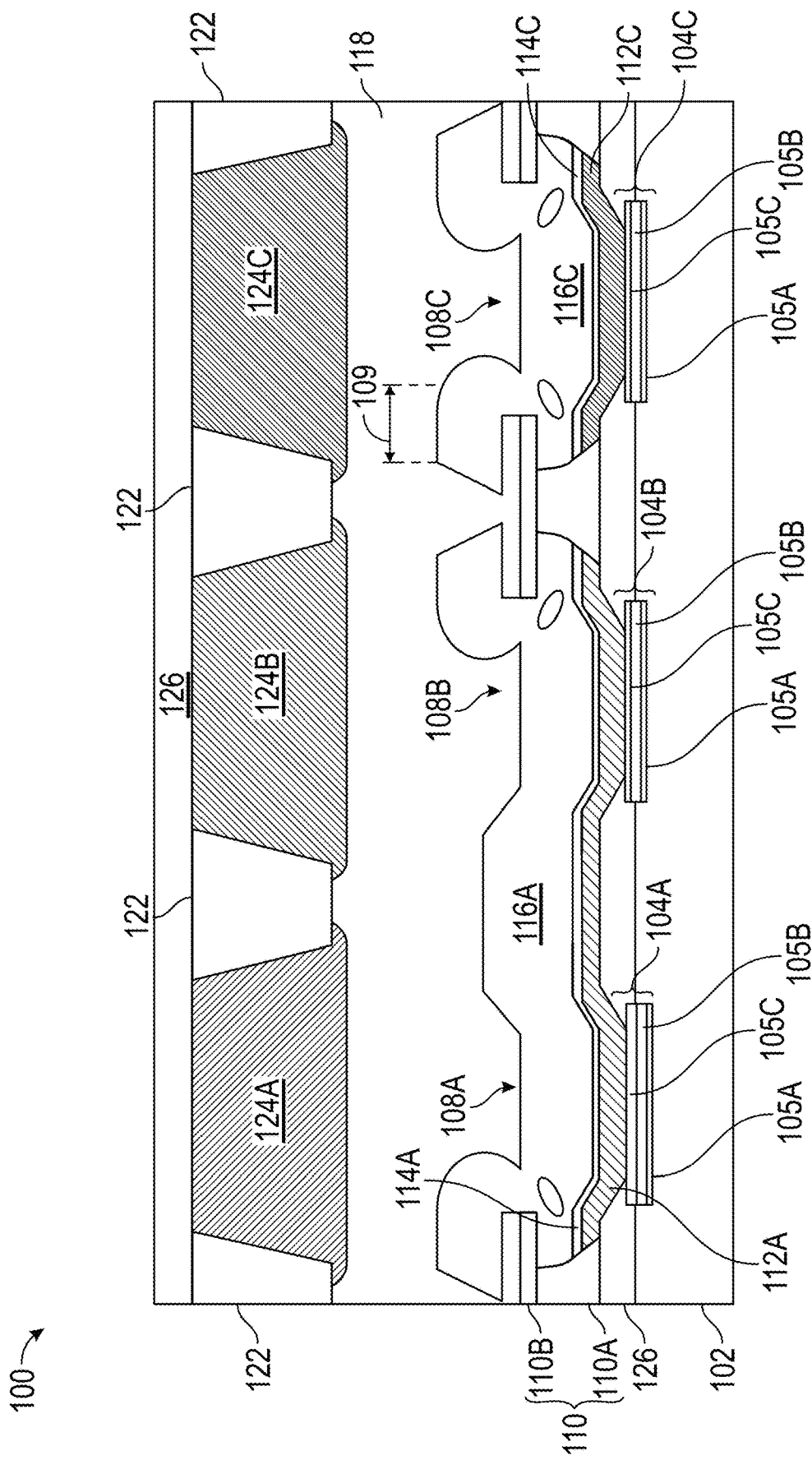

Optionally, the plurality of mask structures 122 and the color filters, e.g., the first color filter 124A, the second color filter 124B, or the third color filter 124C may be disposed on a backing material 130, as shown in FIG. 2B. The backing material 130 can include a transparent material suitable for supporting the plurality of mask structures 122 and the color filters, e.g., the first color filter 124A, the second color filter 124B, or the third color filter 124C. The plurality of mask structures 122 and the color filters, e.g., the first color filter 124A, the second color filter 124B, or the third color filter 124C may be disposed on the backing material 130, inverted, and placed on the intermediate layer 118, as shown in FIG. 2B, thereby allowing for manufacturing of the color filters to occur in parallel with the manufacturing of the sub-pixels, and reducing the time for manufacturing.

Figure 2C:
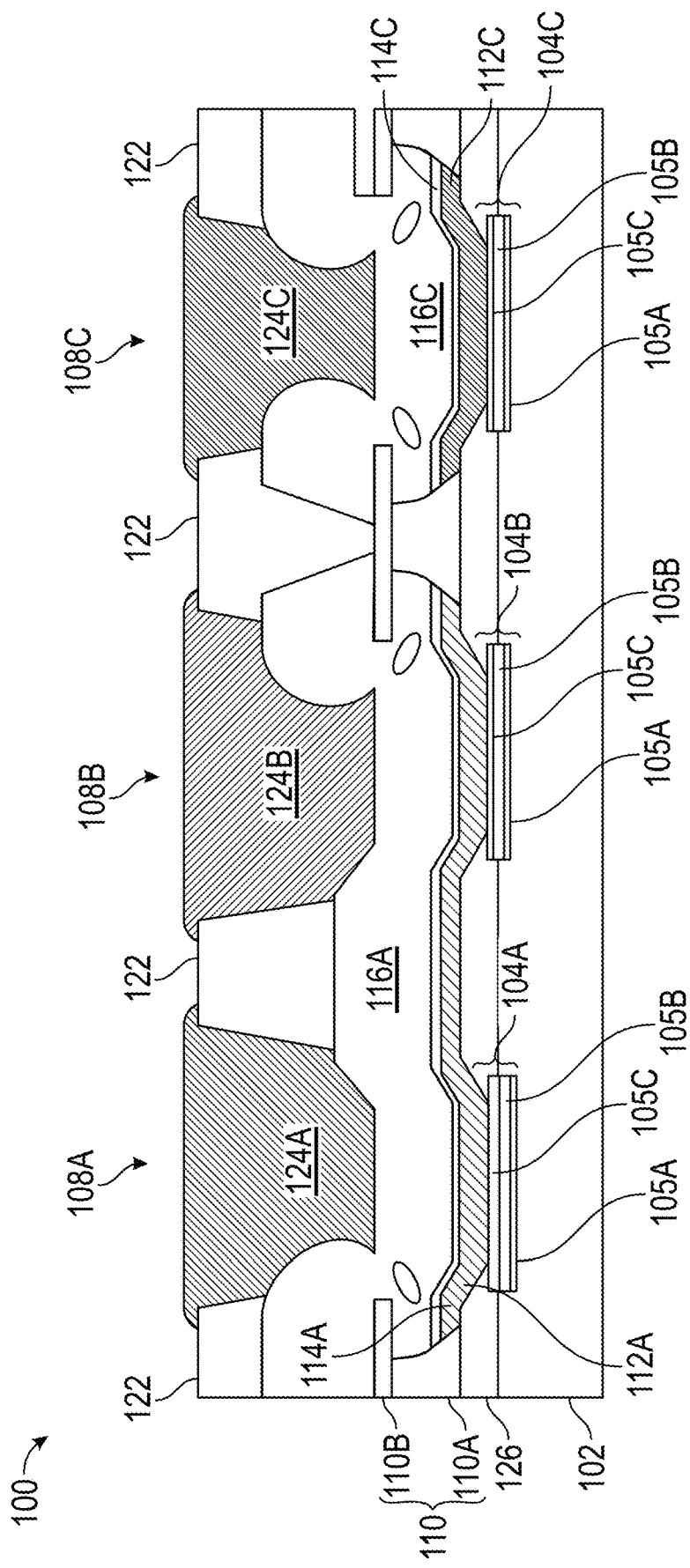

Optionally, the plurality of mask structures 122 may be patterned over the encapsulation layer 116, e.g., the first encapsulation layer 116A, the second encapsulation layer 116B, and/or the third encapsulation layer 116C, as shown in FIG. 2C. The plurality of mask structures 122 may be patterned such that the plurality of mask structures directly contacts the top surface 115 of the upper portion 110B. The color filters, e.g., the first color filter 124A, the second color filter 124B, or the third color filter 124C, are disposed over the first encapsulation layer 116A, and between the plurality of mask structures 122. Without being bound by theory, by disposing the color filters over the first encapsulation layer 116A, a reduction of manufacturing costs may occur.

Figure 3:
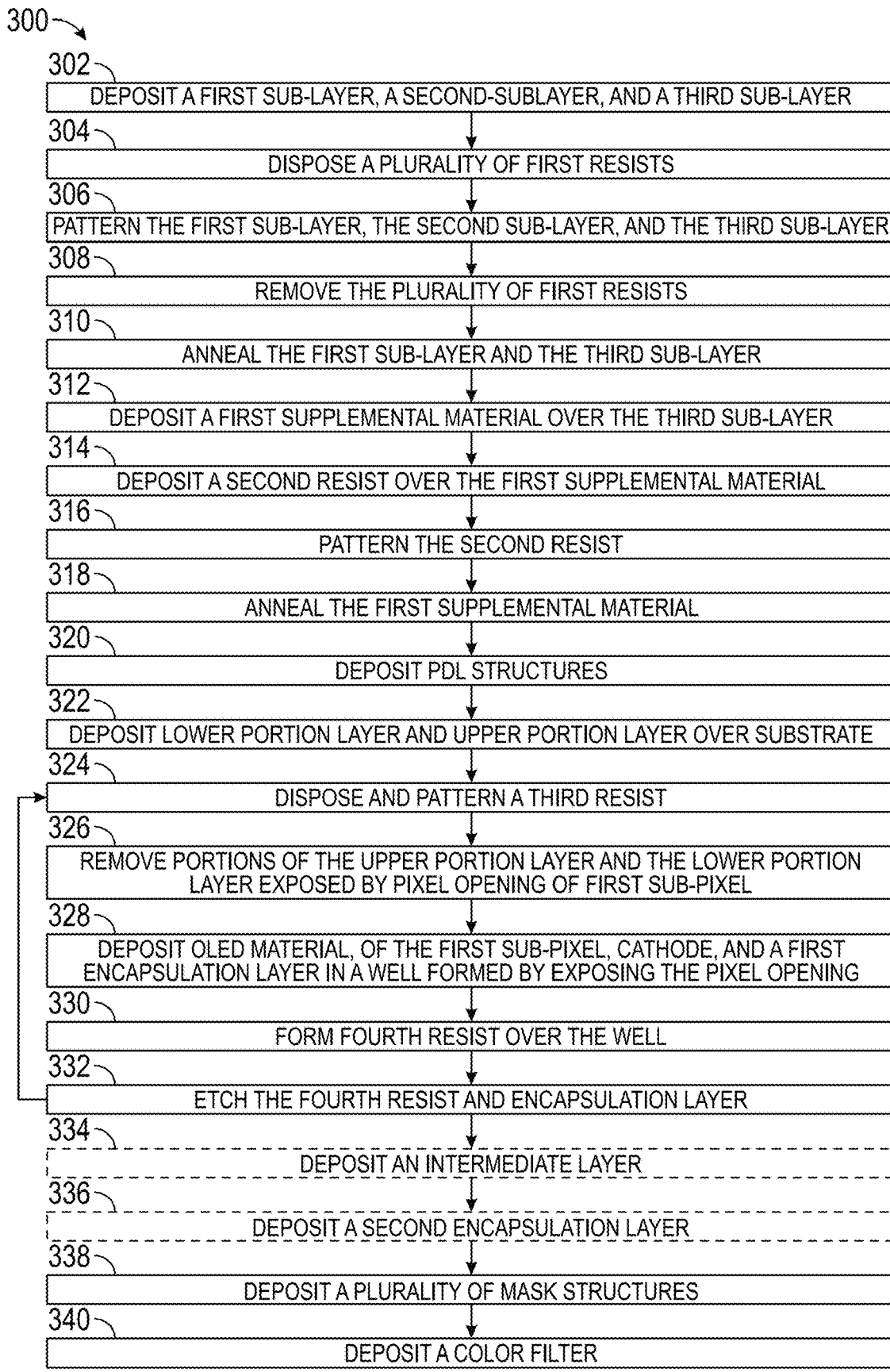
FIG. 3 is a flow diagram of a method for forming a sub-pixel circuit, according embodiments described herein.

FIG. 3 is a flow a flow diagram of a method 300 for forming a sub-pixel circuit 100. FIGS. 4A-4U are schematic, cross-sectional views of a substrate 102 during the method 300 for forming the sub-pixel circuit 100 according embodiments described herein.

At operation 302, as shown in FIG. 4A, a first sub-layer 105A, a second sub-layer 105B, and a third sub-layer 105C is deposited on a substrate 102. The first sub-layer 105A, and the third sub-layer 105C include an amorphous transparent conductive oxide, e.g., amorphous indium tin oxide. The second sub-layer 105B includes a metal layer such as a silver layer. At operation 304, as shown in FIG. 4B, a plurality of first resists 401 are disposed the third sub-layer 105C. The plurality of first resists are deposited over the third sub-layer 105C such that each of a first metal layer 104A, a second metal layer 104B, and a third metal layer 104C is covered by each first resist of the plurality of first resists 401. At operation 306, as shown in FIG. 4C, the first sub-layer 105A, the second sub-layer 105B, and the third sub-layer 105C is patterned to form the first metal layer 104A, the second metal layer 104B, and the third metal layer 104C. The patterning is one of a photolithography, digital lithography process, or laser ablation process.

At operation 308, as shown in FIG. 4D, plurality of first resists 401 are removed to expose the first metal layer 104A, the second metal layer 104B, and the third metal layer 104C. At operation 310, as shown in FIG. 4E, the first sub-layer 105A and the third sub-layer 105C are annealed according to an annealing process. The first sub-layer 105A and the third sub-layer 105C are annealed to produce a poly-crystallized transparent conductive oxide from the amorphous transparent conductive oxide. For example, the first sub-layer 105A and the third sub-layer 105C may be annealed to form a poly-crystallized indium tin oxide.

At operation 312, as shown in FIG. 4F, a first supplemental material 402 is deposited over the third sub-layer 105C. The first supplemental material 402 includes an amorphous transparent conductive oxide, e.g., amorphous indium tin oxide. The first supplemental material 402 can be deposited to provide a thickness of about 50 nm to about 100 nm.

At operation 314, as shown in FIG. 4G, a second resist 403 is deposited over the first supplemental material 402. The second resist 403 is deposited over the first supplemental material 402 such that a first metal layer 104A is covered by the second resist 403. Optionally, the second resist 403 may be deposited over a lateral edge 406 of a second metal layer 104B and a third metal layer 104C, thereby exposing a top central surface 410 of the second metal layer 104B and the third metal layer 104C. Without being bound by theory, the second resist 403 may be deposited over the lateral edge of the second metal layer 104B and the third metal layer 104C such that the third sub-layer 105C does not get etched over the lateral edge, thereby providing enhanced protection of the edge of the second sub-layer 105B.

The second resist 403 is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the second resist 403 determines whether the resist is a positive resist or a negative resist.

At step 316, as shown in FIG. 4H, the second resist 403 is patterned to form an opening at the top central surface 410 of the second metal layer 104B and the third metal layer 104C. The patterning is one of a photolithography, digital lithography process, or laser ablation process. At step 318, as shown in FIG. 4I, the first supplemental material 402 is annealed. The first supplemental material 402 is annealed to produce a poly-crystallized transparent conductive oxide from the amorphous transparent conductive oxide. For example, the first supplemental material 402 may be annealed to form a poly-crystallized indium tin oxide. In some embodiments, which may be combined with other embodiments, by annealing the first supplemental material 402 to produce a poly-crystallized transparent conductive oxide, the first supplemental material 402 may be similar to the third sub-layer 105C. For example, the first supplemental material 402, when annealed, may become the third sub-layer 105C. At step 320, as shown in FIG. 4J, PDL structures 126 are deposited over the substrate 102 such that only the metal layers 104 remain exposed.

At operation 322, as shown in FIG. 4K, a lower portion layer 405A and an upper portion layer 405B are deposited over the substrate 102. The lower portion layer 405A is disposed over the PDL structures 126 and the metal layers 104, e.g., the first metal layer 104A, the second metal layer 104B, and the third metal layer 104C. The upper portion layer 405B is disposed over the lower portion layer 405A. In various embodiments, the lower portion layer 405A corresponds to the lower portion 110A and the upper portion layer 405B corresponds to the upper portion 110B of the inorganic overhang structures 110. In some embodiments, an assistant cathode layer is disposed between the lower portion layer 405A and the PDL structures 126 and the metal layers 104.

At operation 324, as shown in FIG. 4L, a third resist 408 is disposed and patterned. The third resist 408 is disposed over the upper portion layer 405B. The third resist 408 is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the third resist 408 determines whether the resist is a positive resist or a negative resist. The third resist 408 is patterned to form one of a pixel opening of a first sub-pixel 108a. The patterning is one of a photolithography, digital lithography process, or laser ablation process.

Figure 4M:
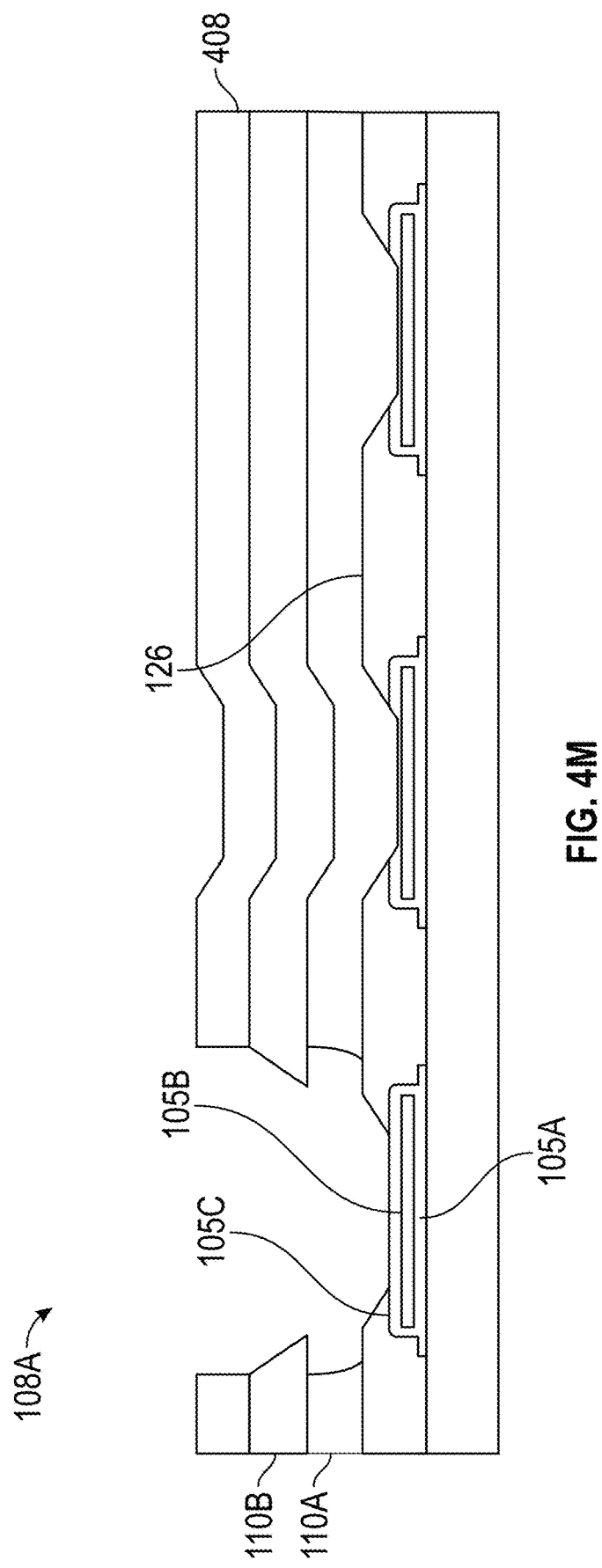
FIGS. 4A-4U are schematic, cross-sectional views of a substrate during a method for forming a sub-pixel circuit, according embodiments described herein.

At operation 326, as shown in FIG. 4M, portions of the upper portion layer 405B and the lower portion layer 405A exposed by the pixel opening are removed. The upper portion layer 405B exposed by the pixel opening may be removed by a dry etch process. The lower portion layer 405A exposed by the pixel opening may be removed by a wet etch process. In embodiments including the assistant cathode layer, a portion of the assistant cathode layer may be removed by a dry etch process or a wet etch process to form an assistant cathode (not shown) disposed under the lower portion 110A. Operation 326 forms the inorganic overhang structures 110 of the first sub-pixel 108a. The etch selectivity of the materials of the upper portion layer 405B (corresponding to the upper portion 110B) and the lower portion layer 405A (corresponding to the lower portion 110A) coupled with the etch processes can remove the exposed portions of the upper portion layer 405B and the lower portion layer 405A. This can provide for the bottom surface 107 of the upper portion 110B being wider than the top surface 105 of the lower portion 110A, thereby forming the overhang 109 (as shown in FIGS. 1A-1C).

Figure 4N:
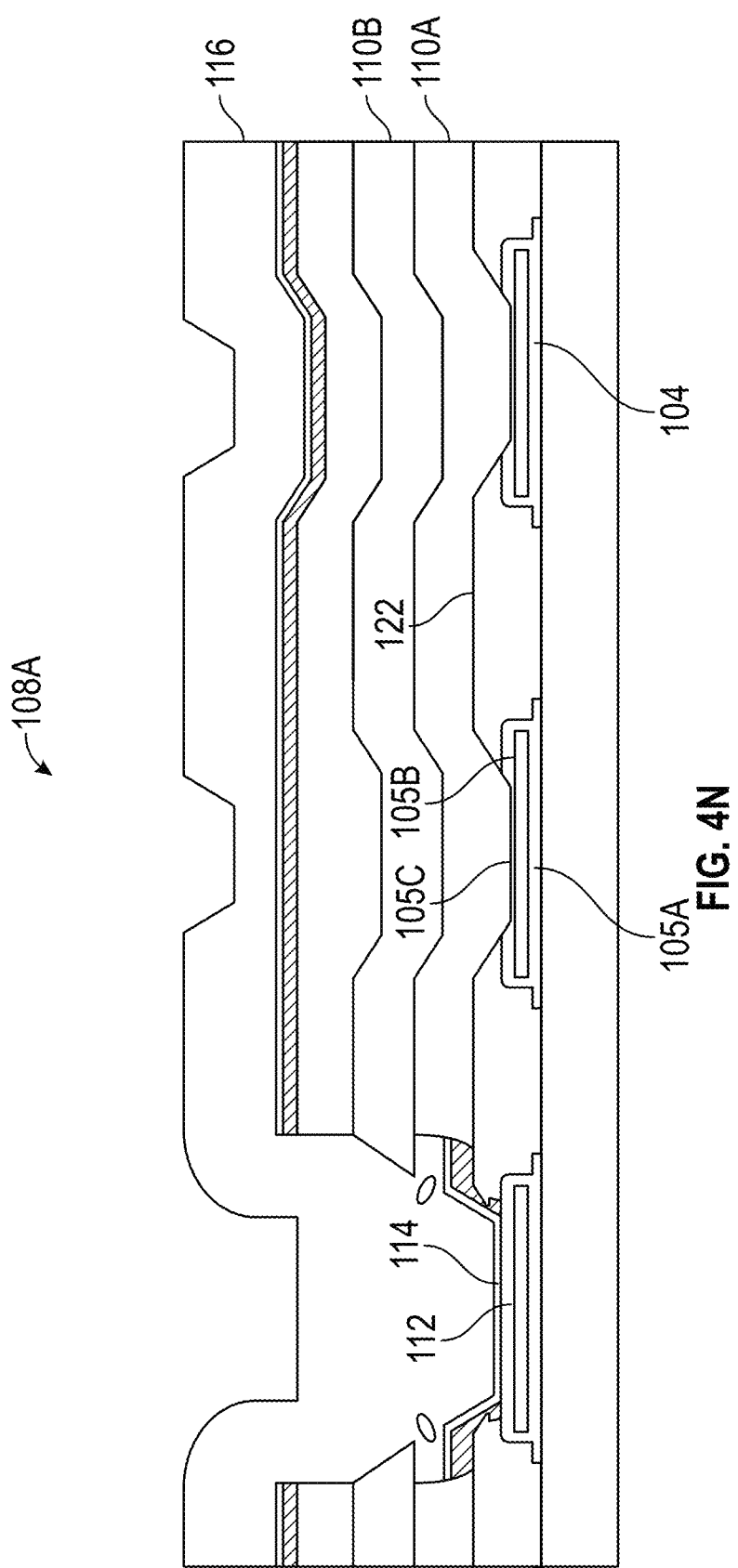

At operation 328, as shown in FIG. 4N, the first OLED material 112A of the first sub-pixel 108a, the first cathode 114A, and the first encapsulation layer 116A are deposited. In some embodiments, the first OLED material 112A does not contact the lower portion 110A and the first cathode 114A directly contacts the lower portion 110A of the inorganic overhang structures 110. The first encapsulation layer 116A is deposited over the first cathode 114A. In embodiments including capping layers (not shown), the capping layers are deposited between the first cathode 114A and the first encapsulation layer 116A. The capping layers may be deposited by evaporation deposition.

At operation 330, as shown in FIG. 4O, a fourth resist 412 is formed in a well of the first sub-pixel 108a and over the first encapsulation layer 116A disposed on the upper portion layer 402B. The fourth resist 412 can be formed in the well, in which the fourth resist 412 can fill the sub-pixel and produce a second resist thickness of about 0.1 µm to about 10 µm, e.g., about 0.1 µm to about 8 µm, about 0.5 µm to about 5 µm, or about 0.9 µm to about 1.1 µm, over the upper portion 110B. At operation 332, as shown in FIG. 4P, a portion of the fourth resist 412 can be removed, wherein the portion of the fourth resist 412 that is removed is disposed outside of the well. For example, the portion of the fourth resist 412 that is removed can include the portion of the fourth resist that is disposed over the upper portion 110B. The fourth resist 412 may be removed by a plasma ashing process.

Operations 324-332 are repeated to produce the second sub-pixel 108B and the third sub-pixel 108C, as shown in FIG. 4Q. In some embodiments, which can be combined with other embodiments, operations 324-332 can be iteratively repeated to provide for the formation of a plurality of sub-pixels. Each sub-pixel of the plurality of sub-pixels can include an OLED for a specific color, e.g., white, green, red, blue, or a combination thereof.

Figure 4S:
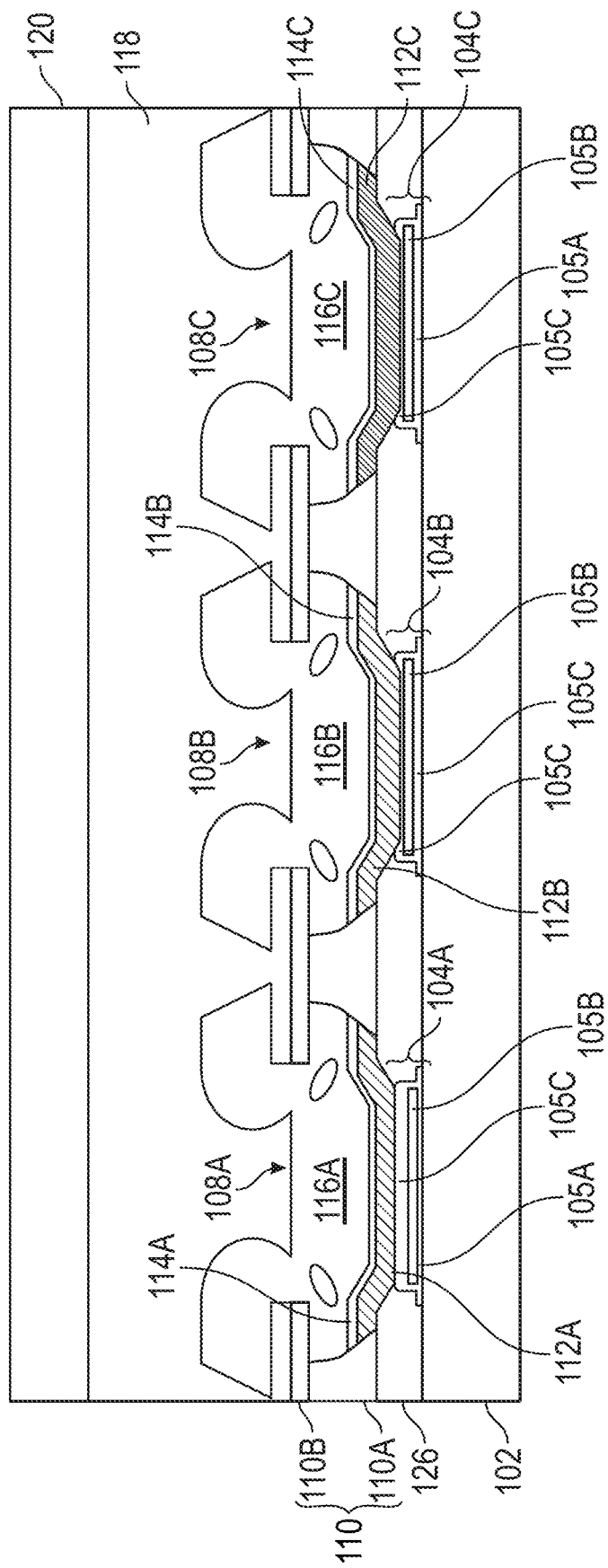

Optionally, at operation 334, as shown in FIG. 4R, an intermediate layer 118 may be deposited over the first encapsulation layer 116A, the second encapsulation layer 116B, the third encapsulation layer 116C, and the plurality of inorganic overhang structures 110. The intermediate layer 118 can include a monomer and/or a polymer, e.g., an inorganic polymer or an organic polymer. In some embodiments, the intermediate layer 118 can include a thickness of about 1 µm to about 10 µm, e.g., about 1 µm to about 5 µm, about 2 µm to about 8 µm, or about 4 µm to about 6 µm. Optionally, at operation 336, as shown in FIG. 4S, a second encapsulation layer 120 is deposited over the intermediate layer 118. The second encapsulation layer 120 can include any of the encapsulation layer 116. The second encapsulation layer 120 can have a thickness of about 1 µm to about 10 µm, e.g., about 1 µm to about 5 µm, about 2 µm to about 8 µm, or about 4 µm to about 6 µm.

Figure 4T:
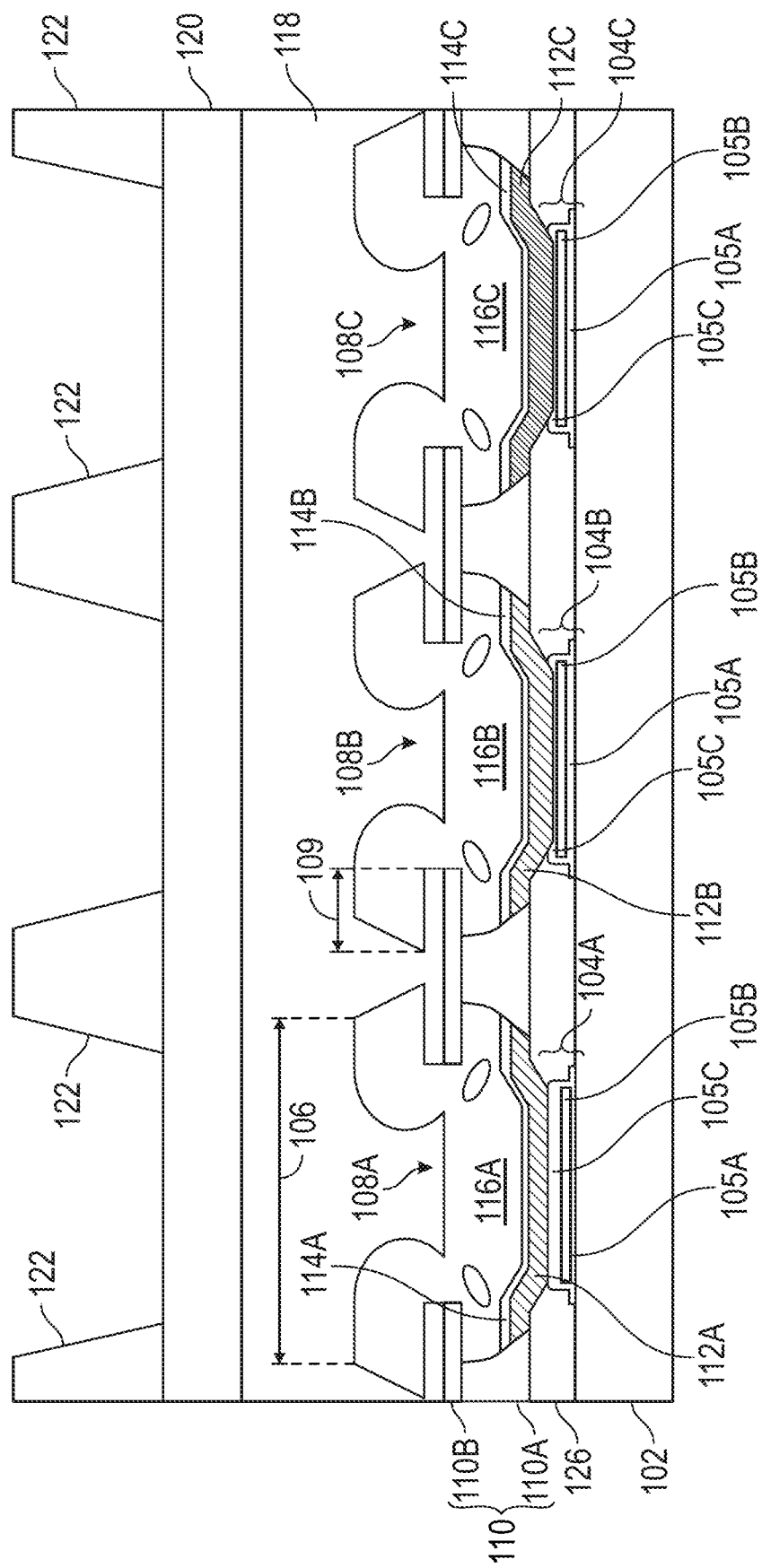
Figure 4U:
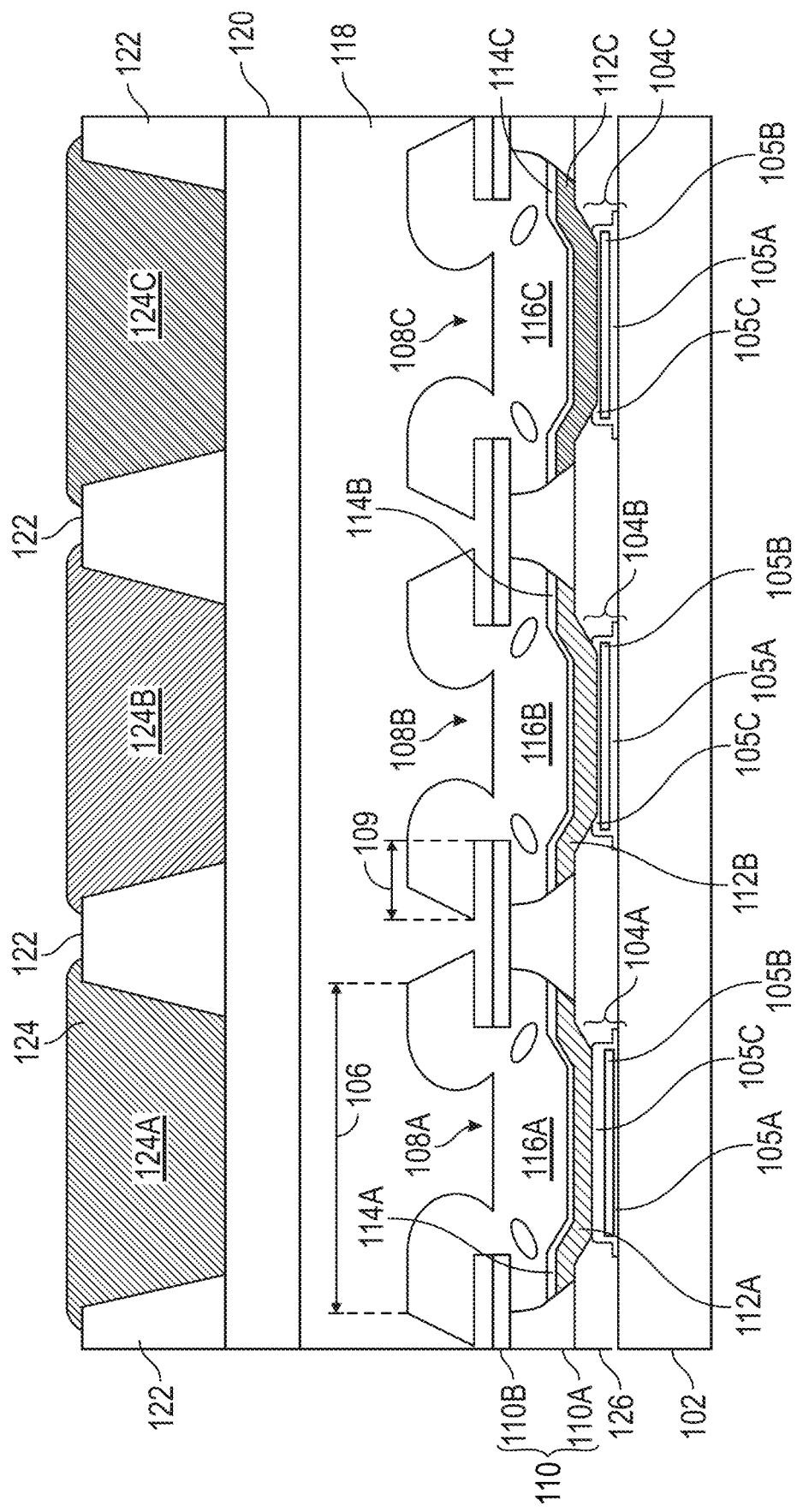

At operation 338, as shown in FIG. 4T, a plurality of mask structures 122 are disposed over the encapsulation layer 116, the intermediate layer 118, and/or the second encapsulation layer 120. The plurality of mask structures 122 may be disposed according to the first sub-pixel 108A, a second sub-pixel 108B, and a third sub-pixel 108C. For example, the plurality of mask structures 122 may be disposed such that the mask structures align with the PDL structures 126 and/or the inorganic overhang structures 110, thereby allowing light emission emitted from the OLED materials through an opening between the plurality of mask structures 122.

At operation 340, as shown in FIG. 4U, a color filter 124 is disposed in the opening between the plurality of mask structures 122. A first color filter 124A may be aligned with the first sub-pixel 108A, a second color filter 124B may be aligned with the second sub-pixel 108B, and a third color filter 124C may be aligned with the third sub-pixel 108C. Each of the first color filter 124A, the second color filter 124B, or the third color filter 124C may be configured to restrict light transparency from a bottom surface of the color filter to a top surface of the color filter to a specific color and/or wavelength, e.g., red, green, and/or blue. For example, the first color filter 124A may receive a yellow, white, and/or red light and restrict light transparency to the color red, thereby only emitting red emission from the first sub-pixel 108A. As a further example, the second color filter 124B may receive a yellow, white, and/or red light and may restrict light transparency to the color green, thereby only emitting green emission from the second sub-pixel 108B. As a further example, the third color filter 124C may receive a blue, white, and/or yellow light and may restrict light transparency to the color blue, thereby only emitting blue emission from the third sub-pixel 108C.

Figure 5A:
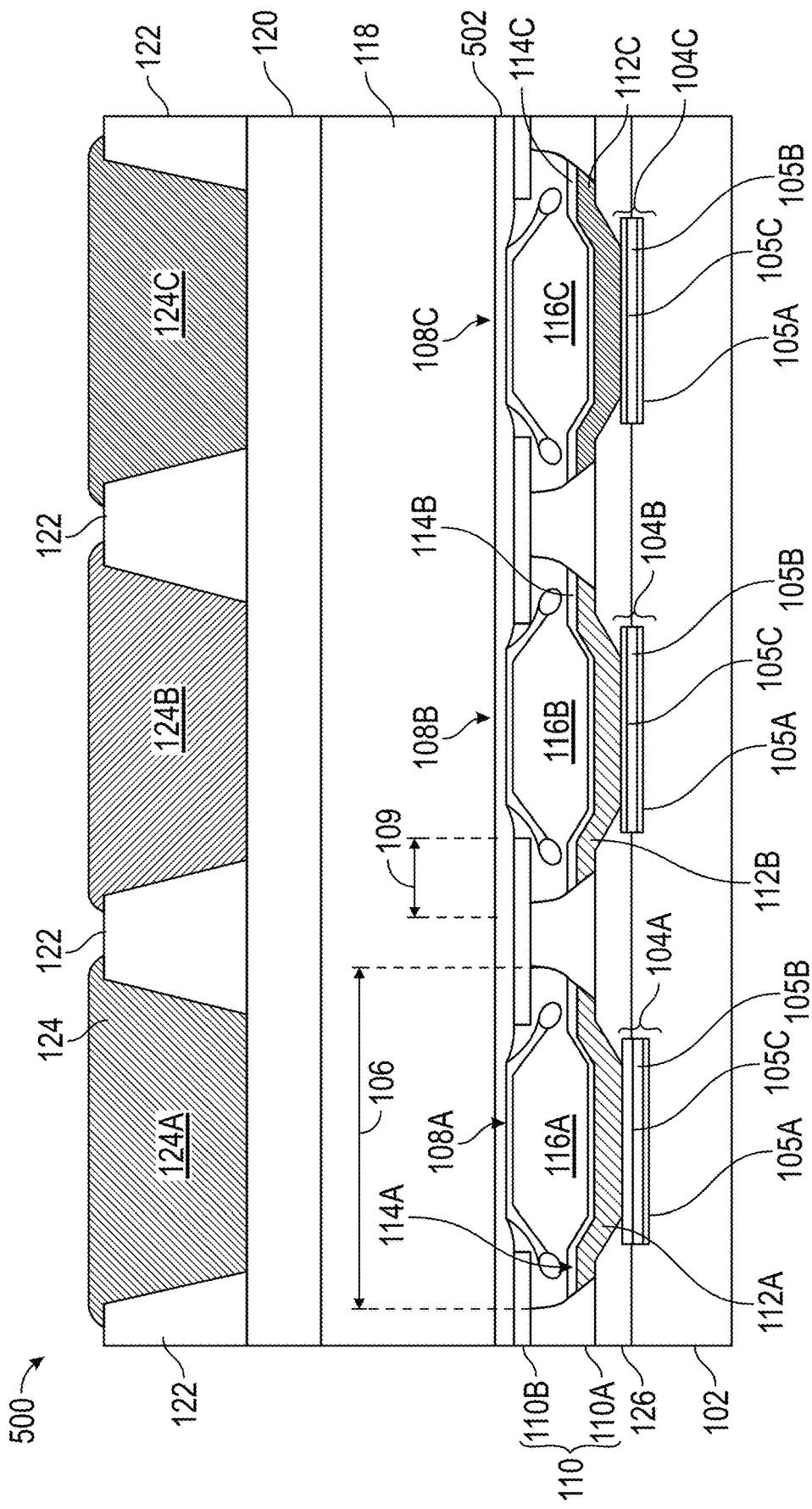
FIGS. 5A-5C are schematic, cross-sectional views of sub-pixel circuits, according to embodiments described herein.

FIG. 5A is a schematic, cross-sectional view of a sub-pixel circuit 500. The sub-pixel circuit 500 includes a substrate 102. Metal layers 104 are be patterned on the substrate 102. The metal layers 104 are configured to operate anodes of respective sub-pixels. The metal layers 104 are a layer stack of a first sub-layer 105A, a second sub-layer 105B disposed over the first sub-layer 105A, and a third sub-layer 105C disposed over the second sub-layer 105B. The first sub-layer 105A includes a transparent conductive oxide (TCO) layer, e.g., indium tin oxide or indium zinc oxide. The first sub-layer 105A can include a thickness of about 1 nm to about 50 nm.

The second sub-layer 105B includes a metal layer, e.g., chromium, titanium, gold, silver, copper, aluminum, or a combination thereof, disposed on the first sub-layer 105A. The second sub-layer 105B can include a thickness of about 50 nm to about 200 nm.

The third sub-layer 105C includes a transparent conductive oxide (TCO) layer, e.g., indium tin oxide or indium zinc oxide. The third sub-layer 105C can include a thickness of about 1 nm to about 200 nm. Optionally, the third sub-layer 105C has a thickness that is greater than the thickness of the first sub-layer 105A and/or the second sub-layer 105B. Without being bound by theory, a thicker third sub-layer 105C can allow for controllable wavelength emission of the OLED material, thereby reducing power requirements during operation of the sub-pixel circuit 500.

In an embodiment, which can be combined with other embodiments described herein, the third sub-layer 105C of a first sub-pixel 108A is thicker than a third sub-layer 105C of a second sub-pixel 108B and/or a third sub-pixel 108C. Without being bound by theory, by having the third sub-layer 105C of a first sub-pixel 108A be thicker than the third sub-layer 105C of the second sub-pixel 108B and/or the third sub-pixel 108C, the light emitted from the first OLED material 112A may be red-shifted, thereby causing emission of a yellow and/or white emitting OLED material to be more red.

In one embodiment, which can be combined with other embodiments described herein, the metal layers 104 are pre-patterned on the substrate 102, e.g., the substrate 102 is a pre-patterned indium tin oxide (ITO) glass substrate. In one embodiment, which can be combined with other embodiments described herein, the metal layers 104 are pre-patterned on the substrate 102, e.g., the metal layers 104 include a first sub-layer 105A of indium tin oxide, a second sub-layer 105B of silver, and a third sub-layer 105C of indium tin oxide.

The pixels are defined by adjacent pixel-defining layer (PDL) structures disposed on the substrate 102. The PDL structures 126 can be disposed on the substrate 102. The PDL structures 126 include one of an organic material, an organic material with an inorganic coating disposed thereover, or an inorganic material. The organic material of the PDL structures 126 includes, but is not limited to, polyimides. The inorganic material of the PDL structures 126 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent PDL structures define a respective sub-pixel and expose the anode (i.e., metal layer 104) of the respective sub-pixel of the sub-pixel circuit 100.

The sub-pixel circuit 500 has a plurality of sub-pixels 106 including at least a first sub-pixel 108A, a second sub-pixel 108B, and a third sub-pixel 108C. While the Figures depict the first sub-pixel 108A, the second sub-pixel 108B, and the third sub-pixel 108C, the sub-pixel circuit 100 of the embodiments described herein may include three or more sub-pixels 106, such as a fourth and a fifth sub-pixel. Each sub-pixel 106 has an OLED material, e.g., first OLED material 112A, second OLED material 112B, and third OLED material 112C, configured to emit a white, red, green, blue or other color light when energized, e.g., the first OLED material 112A of the first sub-pixel 108A emits a yellow light when energized, the second OLED material 112B of the second sub-pixel 108B emits a yellow light when energized, the third OLED material 112C of the third sub-pixel 108C emits a blue light when energized, and the OLED material of a fourth sub-pixel emits a different color light when energized.

Inorganic overhang structures 110 are disposed over the substrate 102, thereby defining each sub-pixel of the plurality of sub-pixels. In some embodiments, as shown in FIG. 5A, the inorganic overhang structures 110 are disposed over each of the PDL structures 126. The inorganic overhang structures 110 are permanent to the sub-pixel circuit. The inorganic overhang structures 110 further define each sub-pixel 106 of the sub-pixel circuit 100. The inorganic overhang structures 110 include at least an upper portion 110B disposed on a lower portion 110A. A first configuration of the inorganic overhang structures 110 includes the upper portion 110B of a non-conductive inorganic material and the lower portion 110A of a conductive inorganic material. A second configuration of the inorganic overhang structures 110 includes the upper portion 110B of a conductive inorganic material and the lower portion 110A of a conductive inorganic material. A third configuration of the inorganic overhang structures 110 includes the upper portion 110B of a non-conductive inorganic material, the lower portion 110A of a non-conductive inorganic material, and an optional assistant cathode (not shown) disposed under the lower portion 110A. A fourth configuration of the inorganic overhang structures 110 includes the upper portion 110B of a conductive inorganic material, the lower portion 110A of a non-conductive inorganic material, and an optional assistant cathode (not shown) disposed under the lower portion 110A. The first, second, third, and fourth embodiments of the sub-pixel circuit 100 include inorganic overhang structures 110 of at least one of the first, second, third, or fourth configurations. The inorganic overhang structures 110 are able to remain in place, e.g., are permanent.

The non-conductive inorganic material includes, but is not limited to, an inorganic silicon-containing material, e.g., the silicon-containing material includes oxides or nitrides of silicon, or combinations thereof. The conductive inorganic material includes, but is not limited to, a metal-containing material, e.g., the metal-containing material includes copper, titanium, aluminum, molybdenum, silver, indium tin oxide, indium zinc oxide, or combinations thereof.

At least a bottom surface 107 of the upper portion 110B is wider than a top surface 105 of the lower portion 110A to form an overhang 109. The bottom surface 107 larger than the top surface 105 forming the overhang 109 allows for the upper portion 110B to shadow the lower portion 110A. The shadowing of the overhang 109 provides for evaporation deposition each of the OLED material 112 and a cathode 114.

The OLED material, e.g., e.g., first OLED material 112A, second OLED material 112B, and third OLED material 112C, may include one or more of a HIL, a HTL, an EML, and an ETL. The OLED material, e.g., first OLED material 112A, second OLED material 112B, and third OLED material 112C, is disposed on the metal layer 104. In some embodiments, which can be combined with other embodiments described herein, the OLED material, e.g., first OLED material 112A, second OLED material 112B, and third OLED material 112C, is disposed on the metal layer 104 and over a portion of the PDL structures 126. A first cathode 114A, a second cathode 114B, and a third cathode 114C is disposed over the first OLED material 112A, second OLED material 112B, and third OLED material 112C, respectively, of the PDL structures 126 in each sub-pixel 106. The first cathode 114A, the second cathode 114B, and the third cathode 114C may be disposed on a portion of a sidewall 111 of the lower portion 110A. The first cathode 114A, the second cathode 114B, and the third cathode 114C includes a conductive material, such as a metal, e.g., chromium, titanium, aluminum, ITO, or a combination thereof. In other embodiments, which can be combined with other embodiments described herein, the first OLED material 112A, second OLED material 112B, and third OLED material 112C and the first cathode 114A, the second cathode 114B, and the third cathode 114C are disposed over a top surface 115 of the upper portion 110B of the inorganic overhang structures 110, respectively.

Each sub-pixel 106 includes include an encapsulation layer 116. The encapsulation layer 116 may be or may correspond to a local passivation layer. The encapsulation layer 116 of a respective sub-pixel, e.g., first encapsulation layer 116A, second encapsulation layer 116B, and third encapsulation layer 116C, is disposed over the first cathode 114A, the second cathode 114B, and the third cathode 114C, respectively, with the encapsulation layer 116 extending under at least a portion of each of the inorganic overhang structures 110 and along a sidewall of each of the inorganic overhang structures 110. The encapsulation layer 116 is disposed over the cathode and over at least the sidewall 111 of the lower portion 110A. In some embodiments, which can be combined with other embodiments described herein, the encapsulation layer 116 is disposed over the sidewall 113 of the upper portion 110B. In some embodiments, which can be combined with other embodiments described herein, the encapsulation layer 116 is disposed over the top surface 115 of the upper portion 110B of the inorganic overhang structures 110. The encapsulation layer 116 can include a non-conductive inorganic material, such as the silicon-containing material. The silicon-containing material may include $Si_3N_4$ containing materials.

A global passivation layer 502 can be disposed over the encapsulation layer 116 and the upper portion 110B. The global passivation layer 502 can include a thickness of about 1 nm to about 3 µm, e.g., about 1 nm to about 1.8 µm, about 120 nm to about 1.5 µm, or about 500 nm to about 1 µm. In some embodiments, the global passivation layer 502 can include one or more non-conductive inorganic materials, such as the silicon-containing material. The silicon-containing material may include $Si_3N_4$ containing materials. Without being bound by theory, the global passivation layer 502 can have a uniform thickness across the encapsulation layer 116 and the upper portion 110B.

An intermediate layer 118 may be deposited over the global passivation layer 502, as shown in FIG. 5A. The intermediate layer 118 can include a monomer and/or a polymer, e.g., an inorganic polymer or an organic polymer. In some embodiments, the intermediate layer 118 can include a thickness of about 1 µm to about 10 µm, e.g., about 1 µm to about 5 µm, about 2 µm to about 8 µm, or about 4 µm to about 6 µm. Optionally, a second encapsulation layer 120 may be deposited over the intermediate layer 118. The second encapsulation layer 120 can include any of the encapsulation layer 116. The second encapsulation layer 120 can include a thickness of about 1 µm to about 10 µm, e.g., about 1 µm to about 5 µm, about 2 µm to about 8 µm, or about 4 µm to about 6 µm.

A plurality of mask structures 122 may be disposed over the second encapsulation layer 120. The plurality of mask structures 122 can be a material suitable to absorb external and/or internal light, e.g., a black material such as a black absorbing material. The plurality of mask structures 122 are disposed according to the first sub-pixel 108A, a second sub-pixel 108B, and a third sub-pixel 108C. For example, the plurality of mask structures 122 are disposed to such that the plurality of mask structures are aligned with the PDL structures 126 and/or the inorganic overhang structures 110, thereby allowing light emission from the OLED materials through an opening between the plurality of mask structures 122.

A color filter is disposed in the opening between the plurality of mask structures 122. A first color filter 124A may be aligned with the first sub-pixel 108A, a second color filter 124B may be aligned with the second sub-pixel 108B, and a third color filter 124C may be aligned with the third sub-pixel 108C. Each of the first color filter 124A, the second color filter 124B, or the third color filter 124C may be configured to restrict light transparency from a bottom surface of the color filter to a top surface of the color filter to a specific color and/or wavelength, e.g., red, green, and/or blue. For example, the first color filter 124A may receive a yellow, white, and/or red light and restrict light transparency to the color red, thereby only emitting red emission from the first sub-pixel 108A. As a further example, the second color filter 124B may receive a yellow, white, and/or red light and may restrict light transparency to the color green, thereby only emitting green emission from the second sub-pixel 108B. As a further example, the third color filter 124C may receive a blue, white, and/or yellow light and may restrict light transparency to the color blue, thereby only emitting blue emission from the third sub-pixel 108C.

Figure 5B:
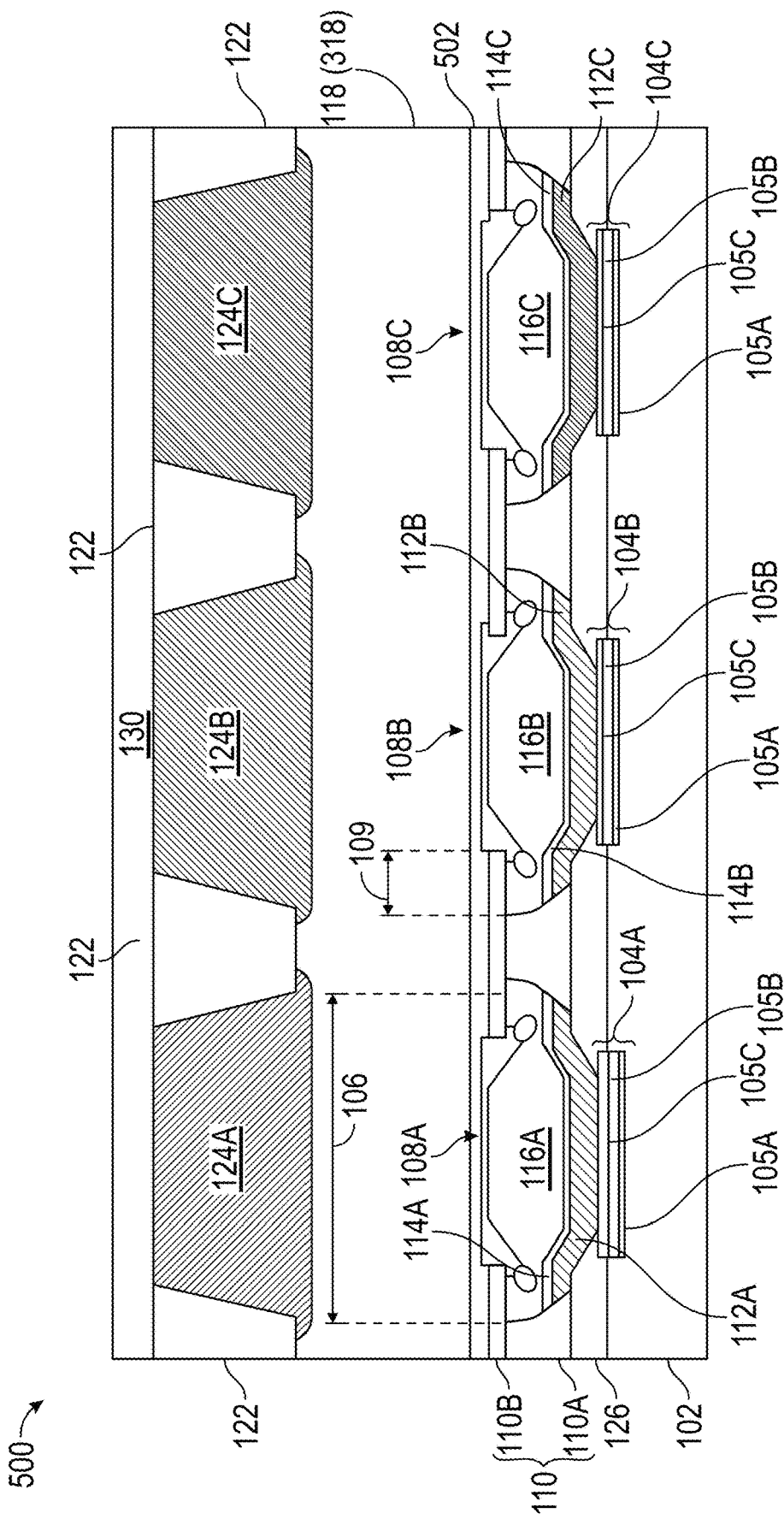

Optionally, the plurality of mask structures 122 and the color filters, e.g., the first color filter 124A, the second color filter 124B, or the third color filter 124C may be disposed on a backing material 130, as shown in FIG. 5B. The backing material 130 can include a transparent material suitable for supporting the plurality of mask structures 122 and the color filters, e.g., the first color filter 124A, the second color filter 124B, or the third color filter 124C. The plurality of mask structures 122 and the color filters, e.g., the first color filter 124A, the second color filter 124B, or the third color filter 124C may be disposed on the backing material 130, inverted, and placed on the intermediate layer 118, as shown in FIG. 5B, thereby allowing for manufacturing of the color filters to occur in parallel with the manufacturing of the sub-pixels, and reducing the time for manufacturing.

Figure 5C:
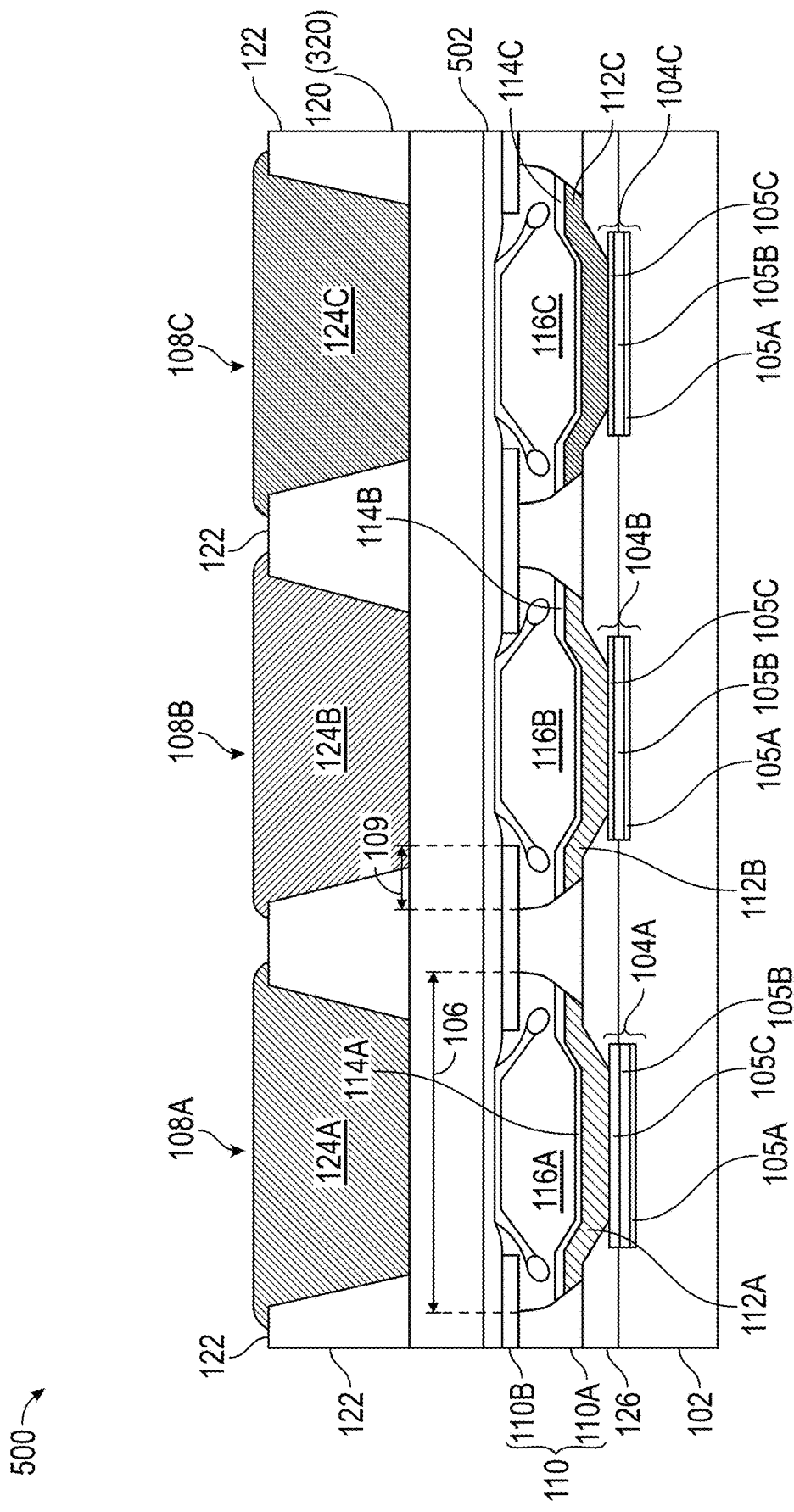

Optionally, the plurality of mask structures 122 may be deposited over the second encapsulation layer 120, where no intermediate layer 118 separates the global passivation layer 502 and the second encapsulation layer 120, as shown in FIG. 5C. The color filters, e.g., the first color filter 124A, the second color filter 124B, or the third color filter 124C, are disposed over the second encapsulation layer 120, and between the plurality of mask structures 122. Without being bound by theory, by disposing the color filters over the second encapsulation layer 120, a reduction of manufacturing costs may occur.

Figure 6A:
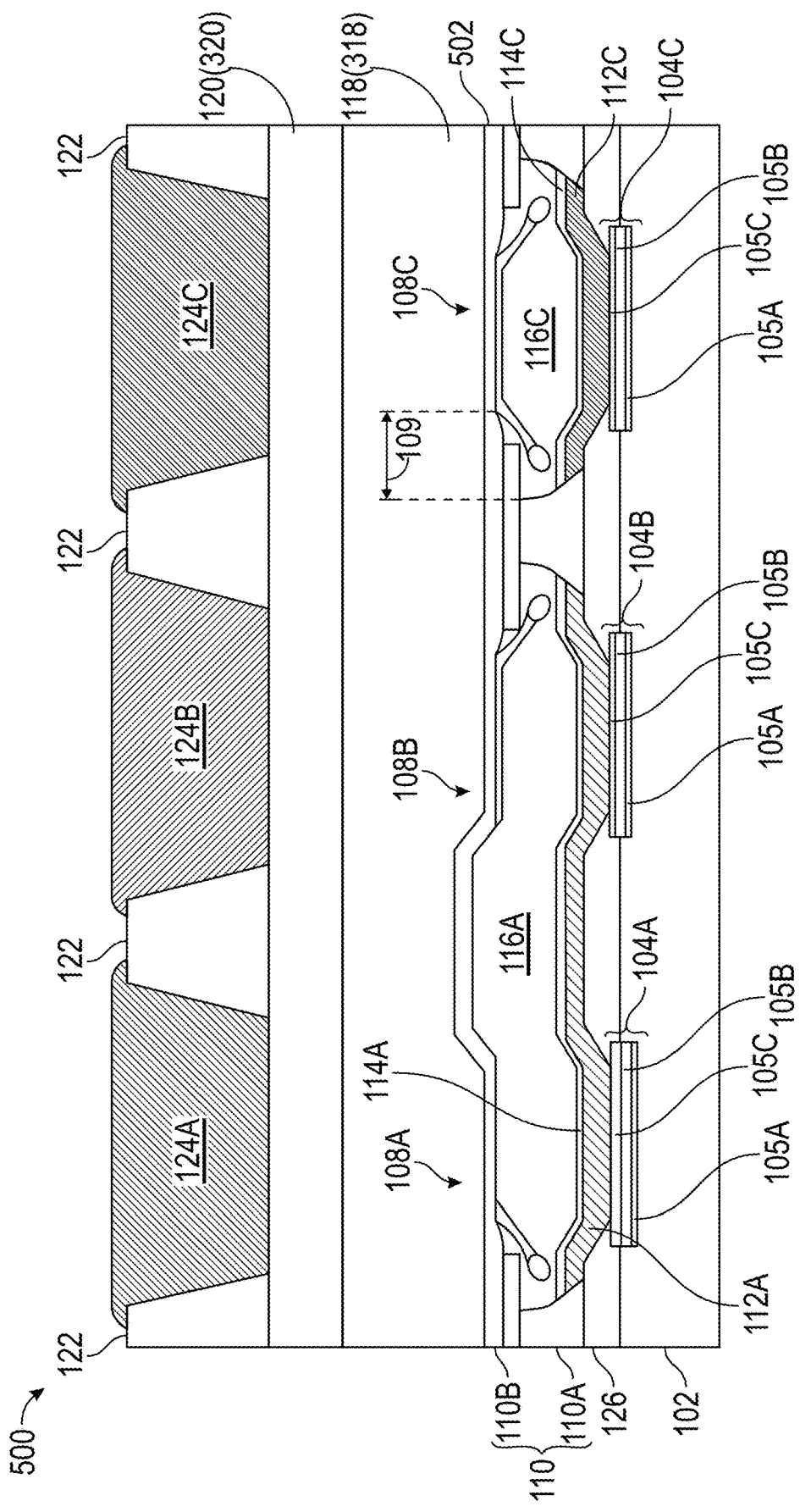
FIGS. 6A-6C are schematic, cross-sectional views of a sub-pixel circuit for an organic light-emitting diode (OLED) display, according to embodiments described herein.

FIG. 6A is a schematic, cross-sectional view of a sub-pixel circuit 500 having a global passivation layer 502, in which the sub-pixel circuit 500 has the first OLED material 112A and the first cathode 114A shared across the first sub-pixel 108A and the second sub-pixel 108B. The first OLED material 112A can include a yellow and/or white emitting OLED material, as described herein. The first OLED material 112A and the first cathode 114A may be shared due to a removal of an inorganic overhangs structure 110 between the first sub-pixel 108A and the second sub-pixel 108B.

The third sub-layer 105C of the first sub-pixel 108A is thicker than a third sub-layer 105C of the second sub-pixel 108B. Without being bound by theory, by having the third sub-layer 105C of the first sub-pixel 108A be thicker than the third sub-layer 105C of the second sub-pixel 108B, the light emitted from the first OLED material 112A over the first sub-pixel 108A may be red-shifted compared to the light emission from the second OLED material 112B of the second sub-pixel 108B. Additionally, and without being bound by theory, a reduction of manufacturing costs occurs due to the reduced materials required to produce the sub-pixel circuit 100, e.g., reduction of overhang structures, and reduction of individualized OLED materials.

Figure 6B:
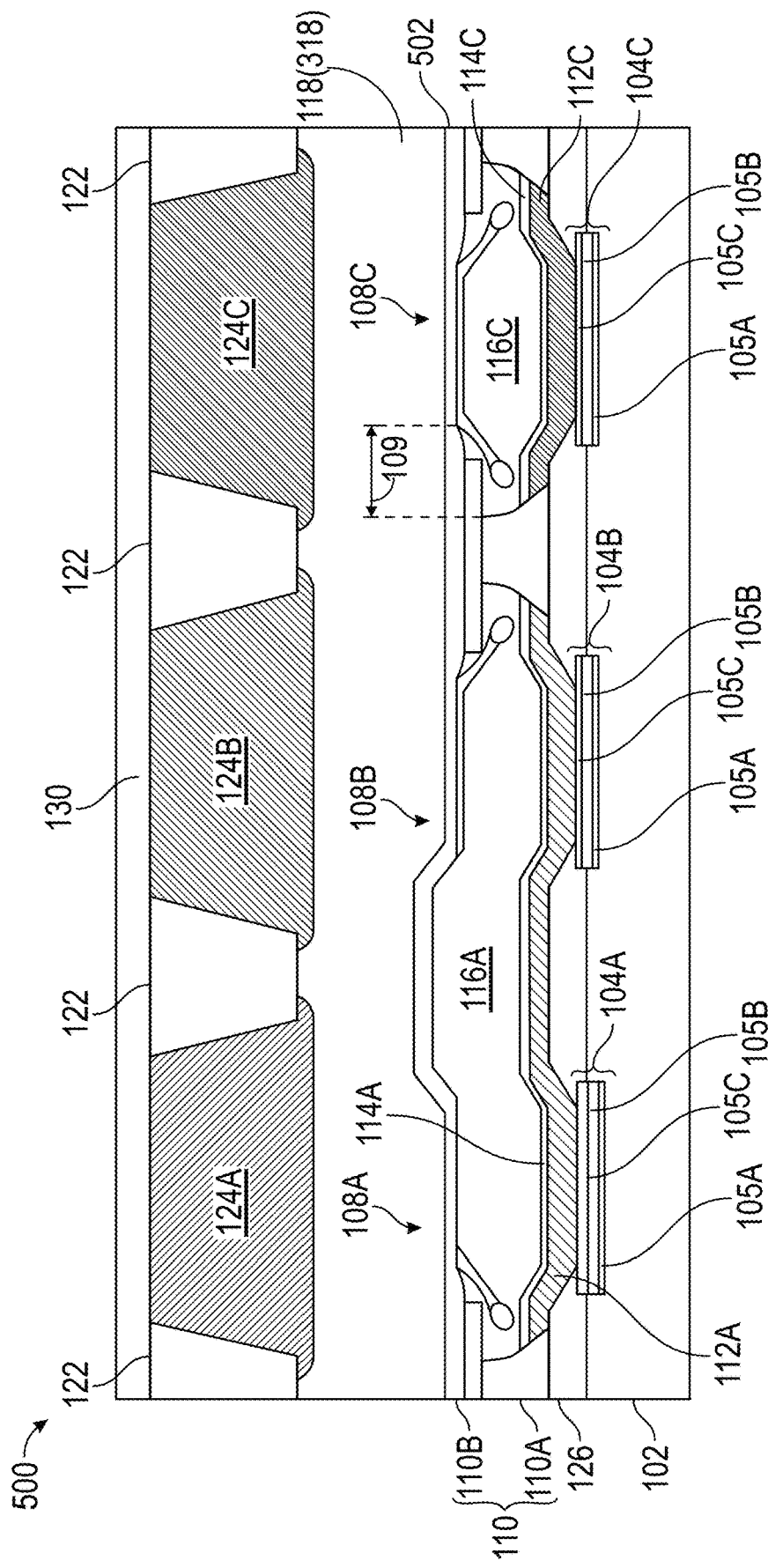

Optionally, the plurality of mask structures 122 and the color filters, e.g., the first color filter 124A, the second color filter 124B, or the third color filter 124C may be disposed on a backing material 130, as shown in FIG. 6B. The backing material 130 can include a transparent material suitable for supporting the plurality of mask structures 122 and the color filters, e.g., the first color filter 124A, the second color filter 124B, or the third color filter 124C. The plurality of mask structures 122 and the color filters, e.g., the first color filter 124A, the second color filter 124B, or the third color filter 124C may be disposed on the backing material 130, inverted, and placed on the intermediate layer 118, as shown in FIG. 6B, thereby allowing for manufacturing of the color filters to occur in parallel with the manufacturing of the sub-pixels, and reducing the time for manufacturing.

Figure 6C:
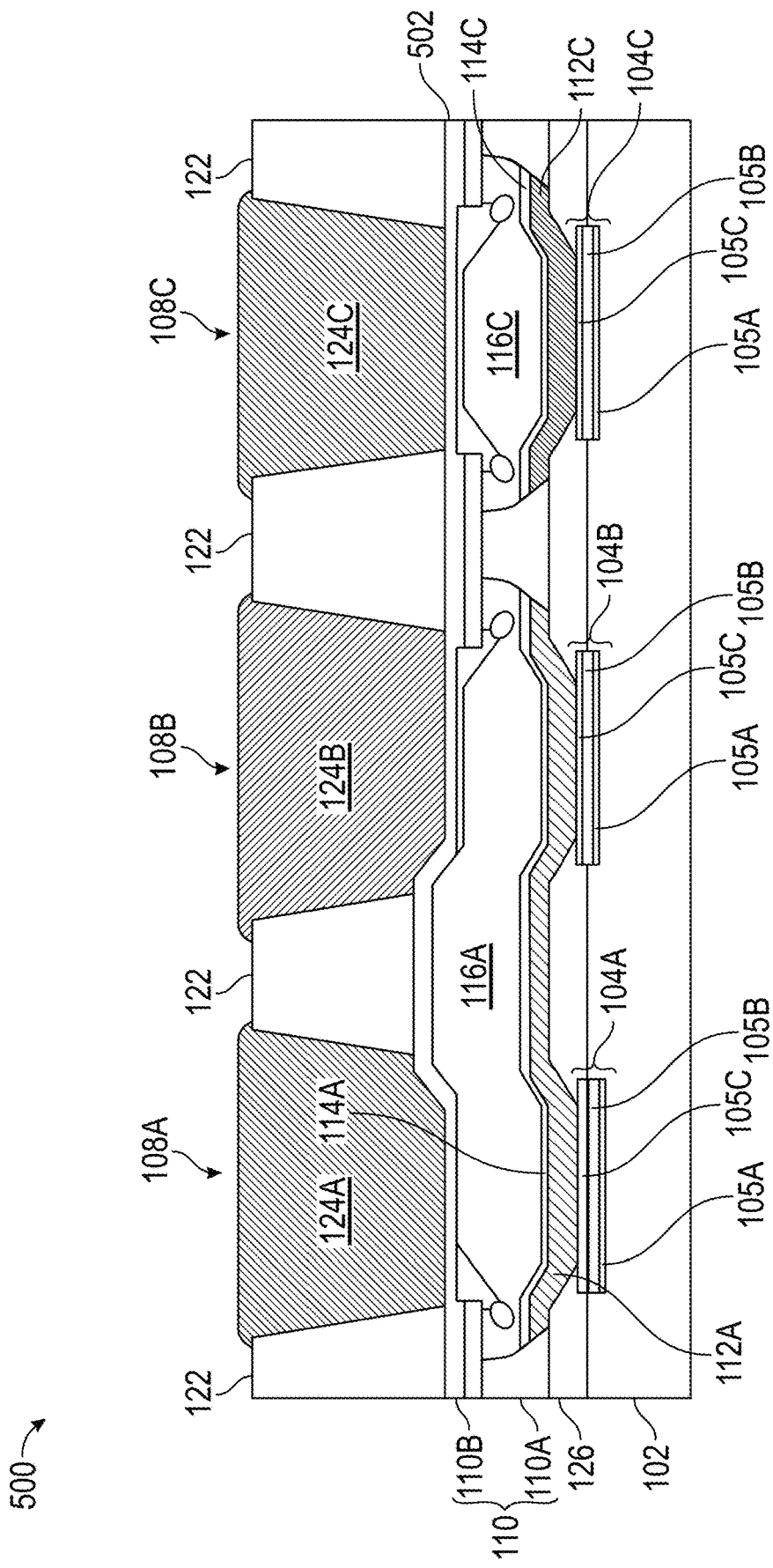

Optionally, the plurality of mask structures 122 may be patterned over the global passivation layer 502, as shown in FIG. 6C. The plurality of mask structures 122 may be patterned such that the plurality of mask structures directly contacts the global passivation layer 502. The color filters, e.g., the first color filter 124A, the second color filter 124B, or the third color filter 124C, are disposed over the global passivation layer 502, and between the plurality of mask structures 122. Without being bound by theory, by disposing the color filters over the global passivation layer 502, a reduction of manufacturing costs may occur.

Figure 7:
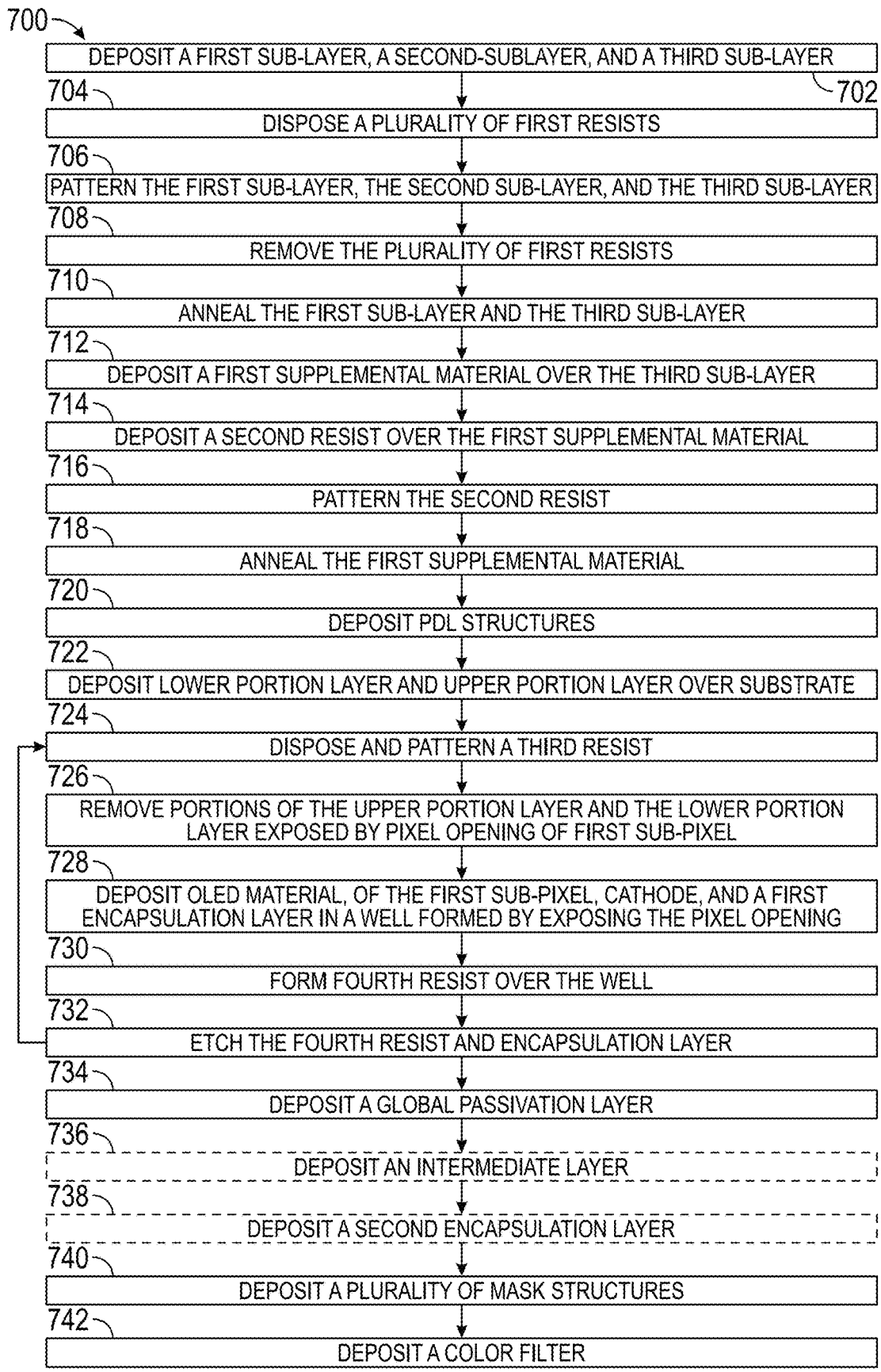
FIG. 7 is a flow diagram of a method for forming a sub-pixel circuit, according embodiments described herein.

FIG. 7 is a flow diagram of a method 700 for forming a sub-pixel circuit 500. FIGS. 8A-8U are schematic, cross-sectional views of a substrate 102 during the method 700 for forming the sub-pixel circuit 500 according embodiments described herein.

At operation 702, as shown in FIG. 8A, a first sub-layer 105A, a second sub-layer 105B, and a third sub-layer 105C is deposited on a substrate 102. The first sub-layer 105A, and the third sub-layer 105C include an amorphous transparent conductive oxide, e.g., amorphous indium tin oxide. The second sub-layer 105B includes a metal layer such as a silver layer. At operation 704, as shown in FIG. 8B, a plurality of first resists 401 are disposed the third sub-layer 105C. The plurality of first resists are deposited over the third sub-layer 105C such that each of a first metal layer 104A, a second metal layer 104B, and a third metal layer 104C is covered by each first resist of the plurality of first resists 401. At operation 706, as shown in FIG. 8C, the first sub-layer 105A, the second sub-layer 105B, and the third sub-layer 105C is patterned to form the first metal layer 104A, the second metal layer 104B, and the third metal layer 104C. The patterning is one of a photolithography, digital lithography process, or laser ablation process.

At operation 708, as shown in FIG. 8D, plurality of first resists 401 are removed to expose the first metal layer 104A, the second metal layer 104B, and the third metal layer 104C. At operation 710, as shown in FIG. 8E, the first sub-layer 105A and the third sub-layer 105C are annealed according to an annealing process. The first sub-layer 105A and the third sub-layer 105C are annealed to produce a poly-crystallized transparent conductive oxide from the amorphous transparent conductive oxide. For example, the first sub-layer 105A and the third sub-layer 105C may be annealed to form a poly-crystallized indium tin oxide.

At operation 712, as shown in FIG. 8F, a first supplemental material 402 is deposited over the third sub-layer 105C. The first supplemental material 402 includes an amorphous transparent conductive oxide, e.g., amorphous indium tin oxide. The first supplemental material 402 can be deposited to provide a thickness of about 50 nm to about 100 nm.

At operation 714, as shown in FIG. 8G, a second resist 403 is deposited over the first supplemental material 402. The second resist 403 is deposited over the first supplemental material 402 such that a first metal layer 104A is covered by the second resist 403. Optionally, the second resist 403 may be deposited over a lateral edge 406 of a second metal layer 104B and a third metal layer 104C, thereby exposing a top central surface 410 of the second metal layer 104B and the third metal layer 104C. Without being bound by theory, the second resist 403 may be deposited over the lateral edge of the second metal layer 104B and the third metal layer 104C such that the third sub-layer 105C does not get etched over the lateral edge, thereby providing enhanced protection of the edge of the second sub-layer 105B.

The second resist 403 is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the second resist 403 determines whether the resist is a positive resist or a negative resist.

At step 716, as shown in FIG. 8H, the second resist 403 is patterned to form an opening at the top central surface 410 of the third metal layer 104C. The patterning is one of a photolithography, digital lithography process, or laser ablation process. At step 718, as shown in FIG. 8I, the first supplemental material 402 is annealed. The first supplemental material 402 is annealed to produce a poly-crystallized transparent conductive oxide from the amorphous transparent conductive oxide. For example, the first supplemental material 402 may be annealed to form a poly-crystallized indium tin oxide. In some embodiments, which may be combined with other embodiments, by annealing the first supplemental material 402 to produce a poly-crystallized transparent conductive oxide, the first supplemental material 402 may be similar to the third sub-layer 105C. For example, the first supplemental material 402, when annealed, may become the third sub-layer 105C. At step 720, as shown in FIG. 8J, PDL structures 126 are deposited over the substrate 102 such that only the metal layers 104 remain exposed.

At operation 722, as shown in FIG. 8K, a lower portion layer 402A and an upper portion layer 402B are deposited over the substrate 102. The lower portion layer 402A is disposed over the PDL structures 126 and the metal layers 104, e.g., the first metal layer 104A, the second metal layer 104B, and the third metal layer 104C. The upper portion layer 402B is disposed over the lower portion layer 402A. In various embodiments, the lower portion layer 402A corresponds to the lower portion 110A and the upper portion layer 402B corresponds to the upper portion 110B of the inorganic overhang structures 110. In some embodiments, an assistant cathode layer is disposed between the lower portion layer 402A and the PDL structures 126 and the metal layers 104.

At operation 724, as shown in FIG. 8L, a third resist 408 is disposed and patterned. The third resist 408 is disposed over the upper portion layer 402B. The third resist 408 is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the third resist 408 determines whether the resist is a positive resist or a negative resist. The third resist 408 is patterned to form one of a pixel opening of a first sub-pixel 108a. The patterning is one of a photolithography, digital lithography process, or laser ablation process.

Figure 8M:
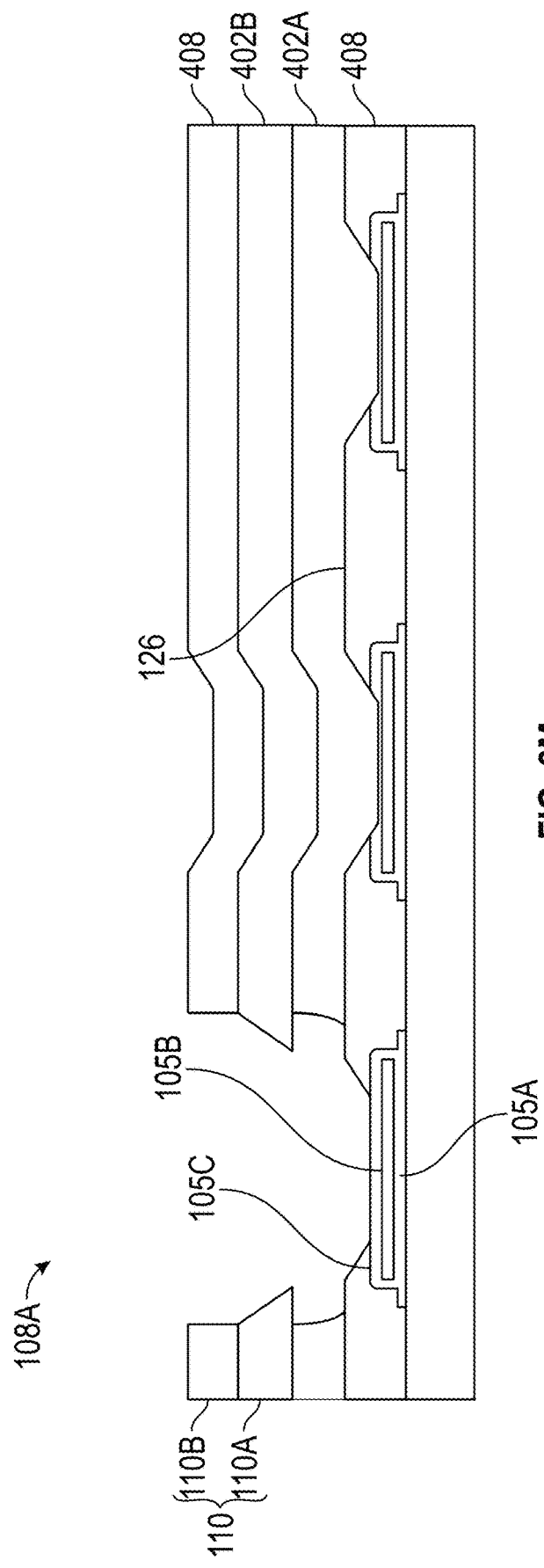
FIGS. 8A-8U are schematic, cross-sectional views of a substrate during a method for forming a sub-pixel circuit, according embodiments described herein.

At operation 726, as shown in FIG. 8M, portions of the upper portion layer 402B and the lower portion layer 402A exposed by the pixel opening are removed. The upper portion layer 402B exposed by the pixel opening may be removed by a dry etch process. The lower portion layer 402A exposed by the pixel opening may be removed by a wet etch process. In embodiments including the assistant cathode layer, a portion of the assistant cathode layer may be removed by a dry etch process or a wet etch process to form an assistant cathode (not shown) disposed under the lower portion 110A. Operation 726 forms the inorganic overhang structures 110 of the first sub-pixel 108a. The etch selectivity of the materials of the upper portion layer 402B (corresponding to the upper portion 110B) and the lower portion layer 402A (corresponding to the lower portion 110A) coupled with the etch processes can remove the exposed portions of the upper portion layer 402B and the lower portion layer 402A. This can provide for the bottom surface 107 of the upper portion 110B being wider than the top surface 105 of the lower portion 110A, thereby forming the overhang 109 (as shown in FIGS. 5A-5C).

Figure 8N:
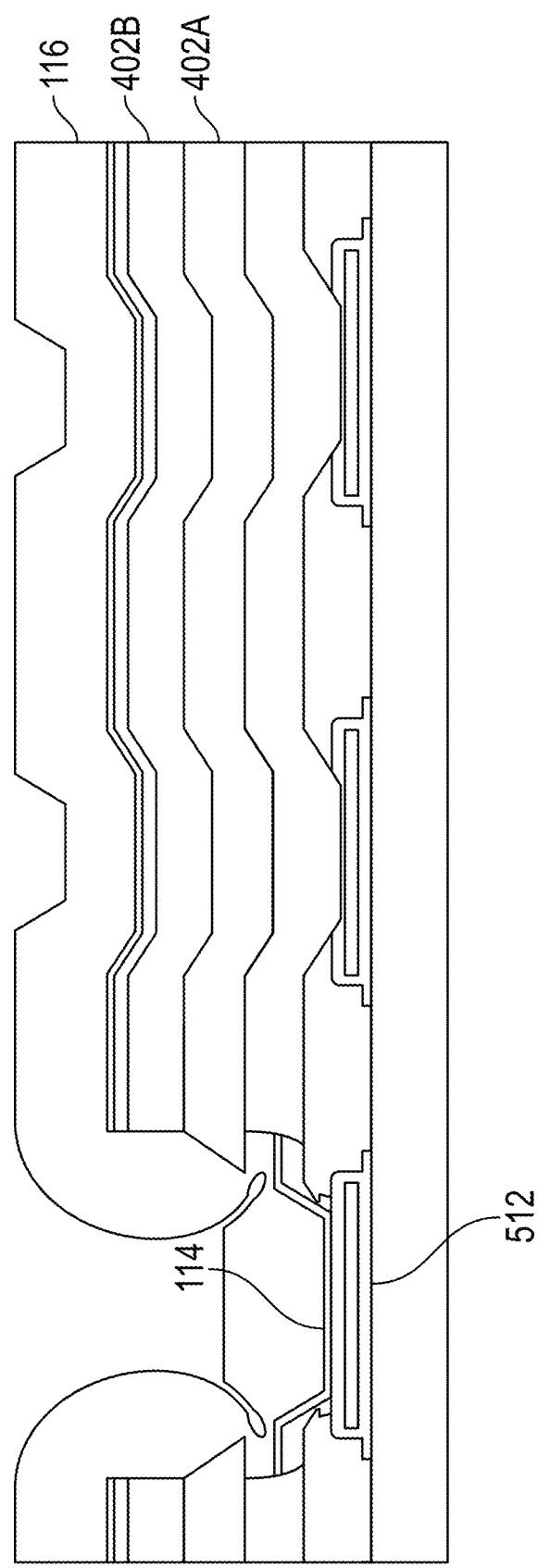

At operation 728, as shown in FIG. 8N, the first OLED material 112A of the first sub-pixel 108a, the first cathode 114A, and the first encapsulation layer 116A are deposited. In some embodiments, the first OLED material 112A does not contact the lower portion 110A and the first cathode 114A directly contacts the lower portion 110A of the inorganic overhang structures 110. The first encapsulation layer 116A is deposited over the first cathode 114A. In embodiments including capping layers (not shown), the capping layers are deposited between the first cathode 114A and the first encapsulation layer 116A. The capping layers may be deposited by evaporation deposition.

Figure 8O:
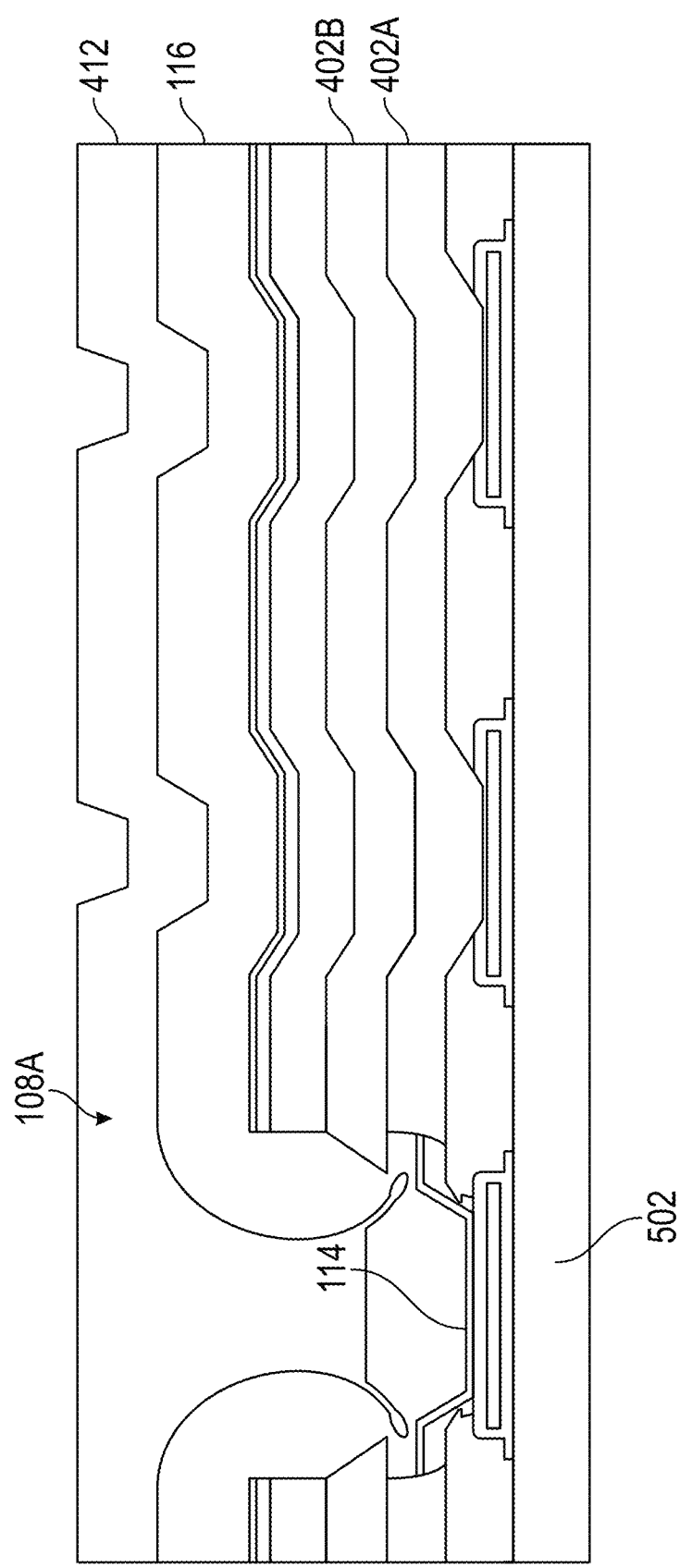
Figure 8P:
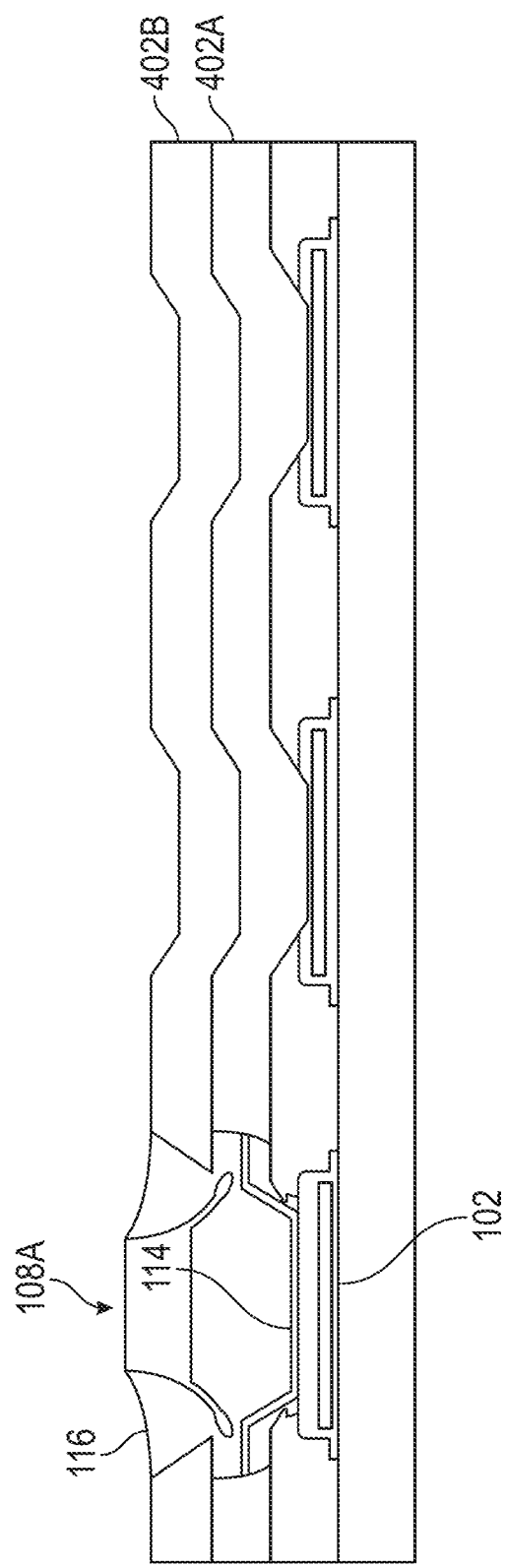

At operation 730, as shown in FIG. 8O, a fourth resist 412 is formed in a well of the first sub-pixel 108a and over the first encapsulation layer 116A disposed on the upper portion layer 402B. The fourth resist 412 can be formed in the well, in which the fourth resist 412 can fill the sub-pixel the well and one or more cavities within the encapsulation layer 116, which are formed due to the overhang 109. The fourth resist 412 can include a fourth resist thickness of about 0.1 μm to about 10 μm, e.g., about 0.1 μm to about 8 μm, about 0.5 μm to about 5 μm, or about 0.9 μm to about 1.1 μm, over the upper portion 110B. At operation 732, as shown in FIG. 8P, a portion of the fourth resist 412 is etched, wherein the portion of the fourth resist 412 that is removed is disposed outside of the well. For example, the portion of the fourth resist 412 that is removed can include the portion of the fourth resist 412 that is disposed over the upper portion layer 402B. The fourth resist 412 may be removed by a plasma ashing process.

Operations 724-732 are repeated to produce the second sub-pixel 108B and the third sub-pixel 108C. In some embodiments, which can be combined with other embodiments, operations 724-732 can be iteratively repeated to provide for the formation of a plurality of sub-pixels. Each sub-pixel of the plurality of sub-pixels can include an OLED for a specific color, e.g., white, green, red, blue, or a combination thereof.

Figure 8Q:
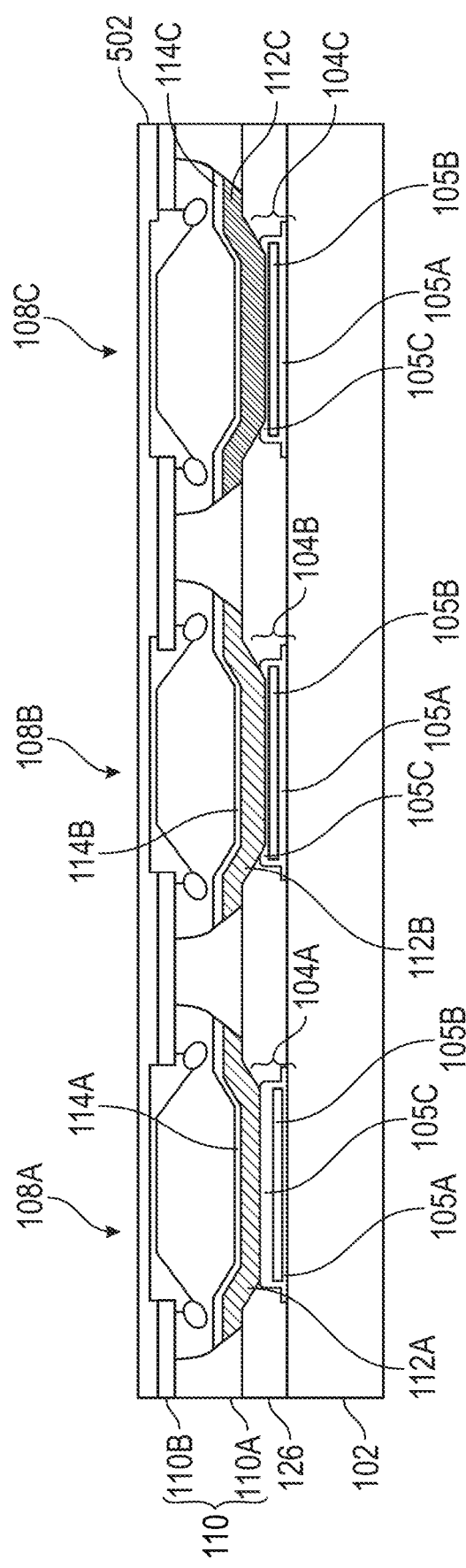

At operation 734, as shown in FIG. 8Q, a global passivation layer 502 is be deposited over the encapsulation layer 116 and the upper portion layer 402B. The global passivation layer 502 can include any of the global passivation layer as described in the present disclosure. The global passivation layer 502 can include a thickness of about 1 nm to about 3 μm, e.g., about 1 nm to about 1.8 μm, about 120 nm to about 1.5 μm, or about 500 nm to about 1 μm. In some embodiments, the global passivation layer 502 can include one or more non-conductive inorganic materials, such as the silicon-containing material. The silicon-containing material may include $Si_3N_4$ containing materials. Without being bound by theory, the global passivation layer 502 can have a uniform thickness across the upper portion layer 402B.

Figure 8R:
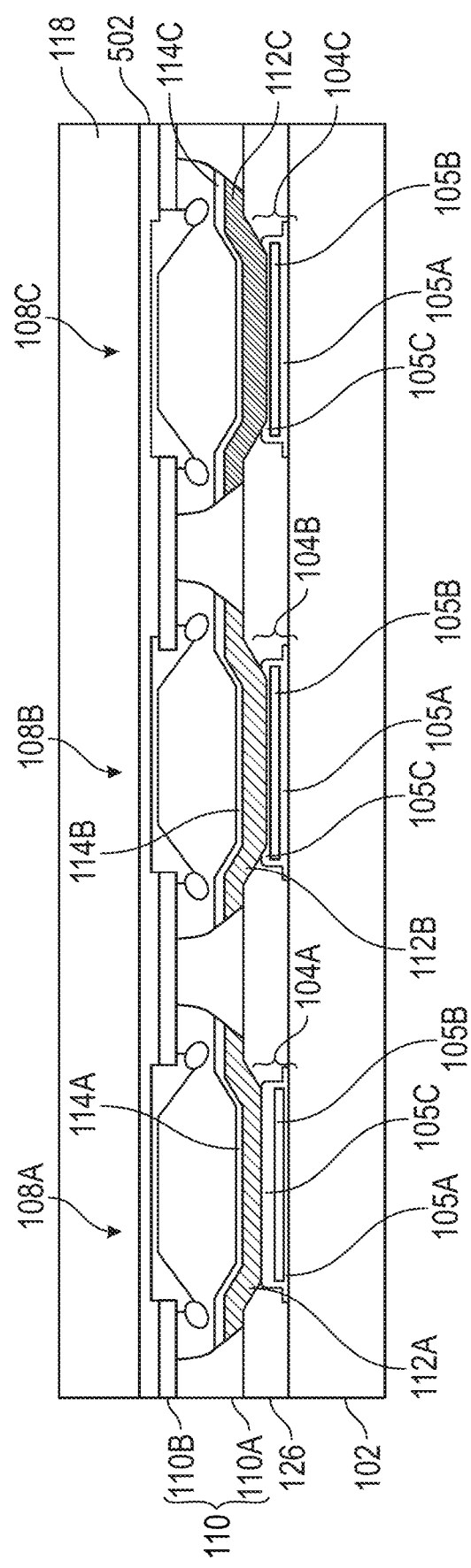
Figure 8S:
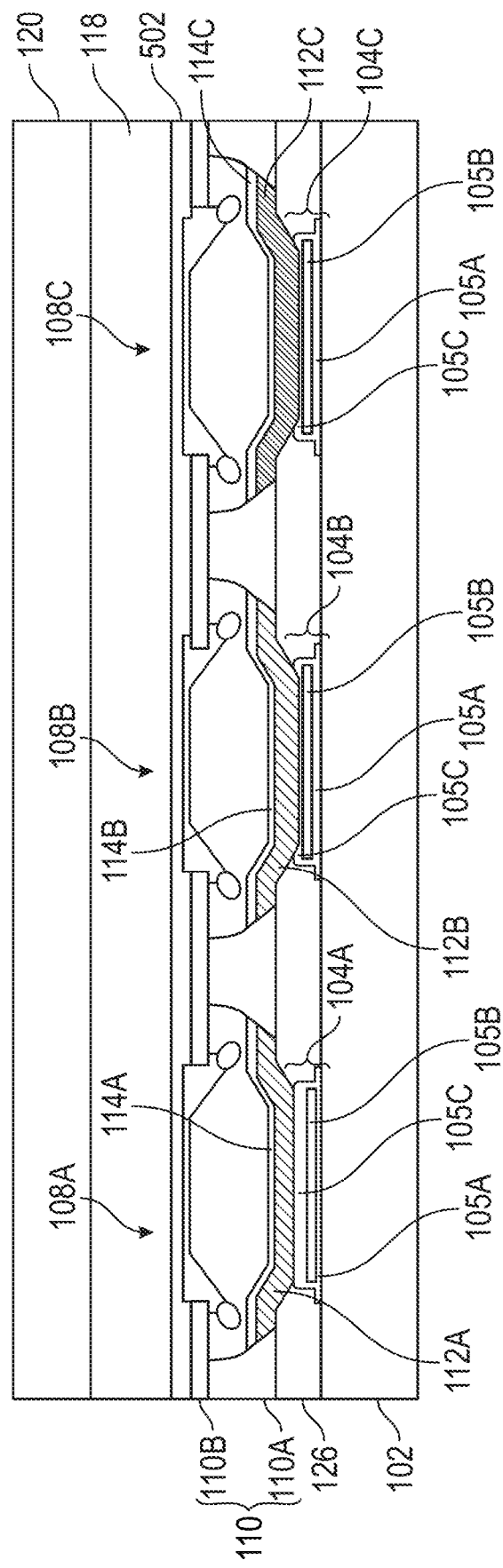

Optionally, at operation 736, as shown in FIG. 8R, an intermediate layer 118 may be deposited over the global passivation layer 502. The intermediate layer 118 can include a monomer and/or a polymer, e.g., an inorganic polymer or an organic polymer. In some embodiments, the intermediate layer 118 can include a thickness of about 1 μm to about 10 μm, e.g., about 1 μm to about 5 μm, about 2 μm to about 8 μm, or about 4 μm to about 6 μm. Optionally, at operation 738, as shown in FIG. 8S, a second encapsulation layer 120 is deposited over the intermediate layer 118. The second encapsulation layer 120 can include any of the encapsulation layer 116. The second encapsulation layer 120 can have a thickness of about 1 μm to about 10 μm, e.g., about 1 μm to about 5 μm, about 2 μm to about 8 μm, or about 4 μm to about 6 μm.

Figure 8T:
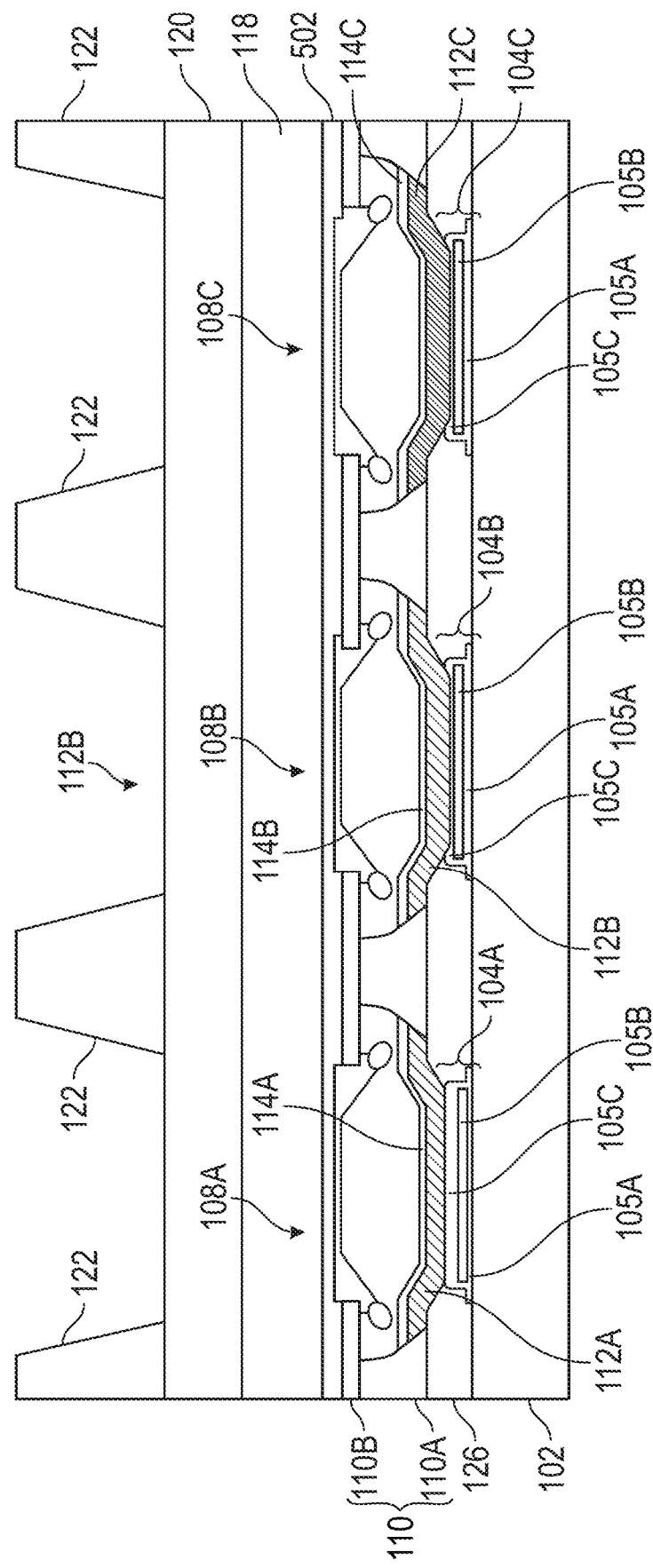
Figure 8U:
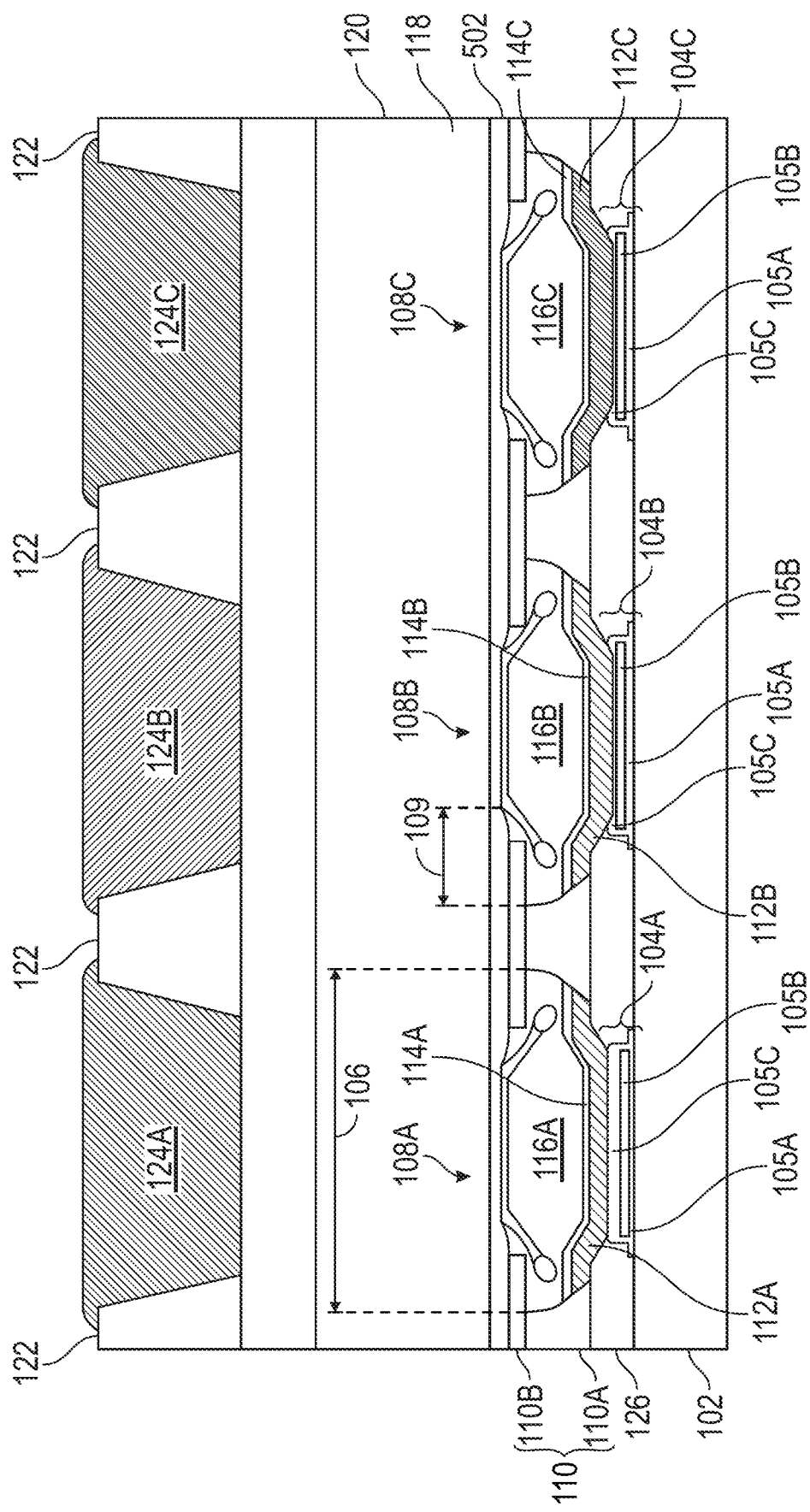

At operation 740, as shown in FIG. 8T, a plurality of mask structures 122 are disposed over the global passivation layer 502, the intermediate layer 118, and/or the second encapsulation layer 120. The plurality of mask structures 122 may be disposed according to the first sub-pixel 108A, a second sub-pixel 108B, and a third sub-pixel 108C. For example, the plurality of mask structures 122 may be disposed such that the mask structures align with the PDL structures 126 and/or the inorganic overhang structures 110, thereby allowing light emission emitted from the OLED materials through an opening between the plurality of mask structures 122.

At operation 742, as shown in FIG. 8U, a color filter 124 is disposed in the opening between the plurality of mask structures 122. A first color filter 124A may be aligned with the first sub-pixel 108A, a second color filter 124B may be aligned with the second sub-pixel 108B, and a third color filter 124C may be aligned with the third sub-pixel 108C. Each of the first color filter 124A, the second color filter 124B, or the third color filter 124C may be configured to restrict light transparency from a bottom surface of the color filter to a top surface of the color filter to a specific color and/or wavelength, e.g., red, green, and/or blue. For example, the first color filter 124A may receive a yellow, white, and/or red light and restrict light transparency to the color red, thereby only emitting red emission from the first sub-pixel 108A. As a further example, the second color filter 124B may receive a yellow, white, and/or red light and may restrict light transparency to the color green, thereby only emitting green emission from the second sub-pixel 108B. As a further example, the third color filter 124C may receive a blue, white, and/or yellow light and may restrict light transparency to the color blue, thereby only emitting blue emission from the third sub-pixel 108C.

Figure 9A:
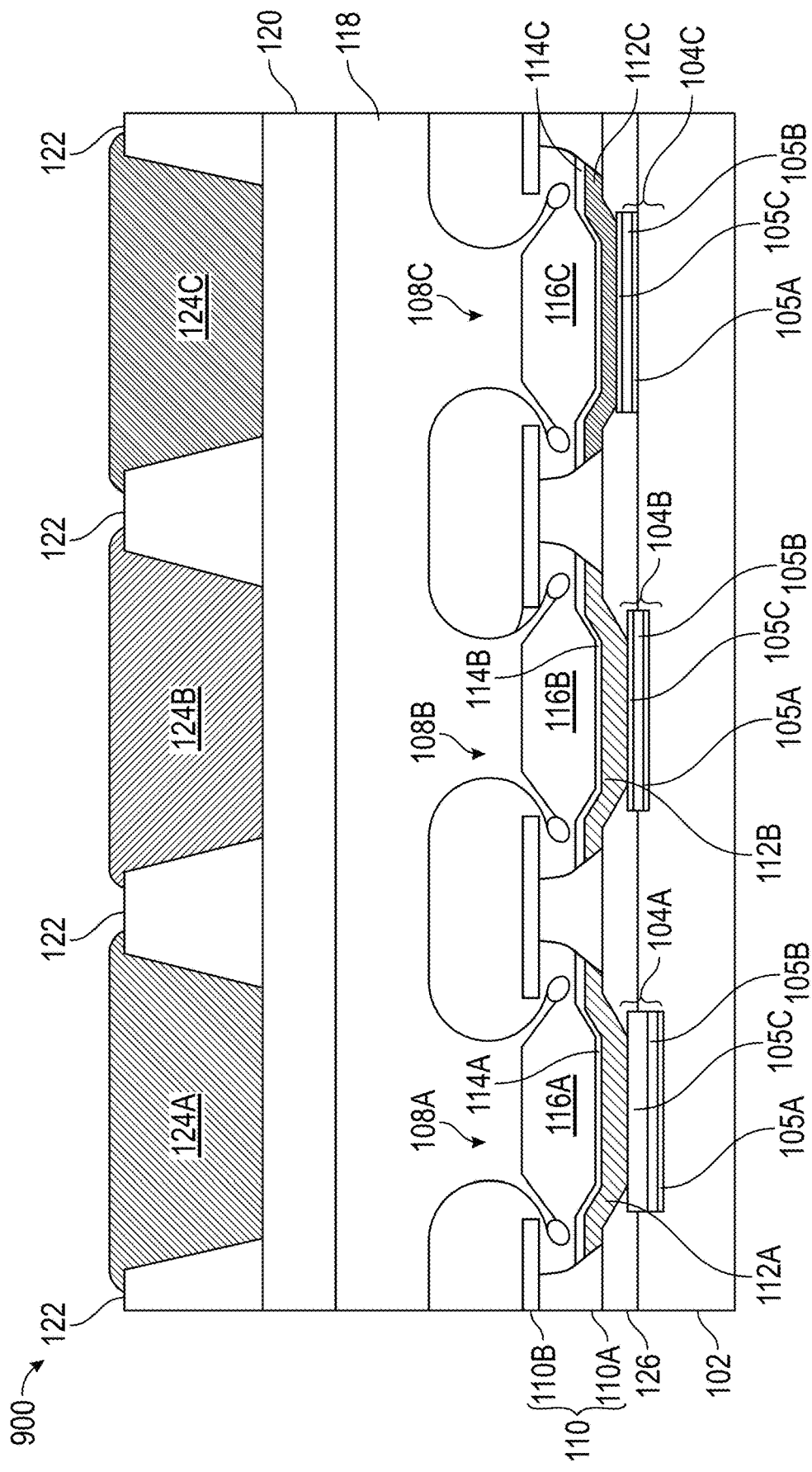
FIGS. 9A-9F are schematic, cross-sectional views of sub-pixel circuits, according to embodiments described herein.

FIG. 9A is a schematic, cross-sectional view of a sub-pixel circuit 900. The sub-pixel circuit 900 includes a substrate 102. Metal layers 104 are be patterned on the substrate 102. The metal layers 104 are configured to operate anodes of respective sub-pixels. The metal layers 104 are a layer stack of a first sub-layer 105A, a second sub-layer 105B disposed over the first sub-layer 105A, and a third sub-layer 105C disposed over the second sub-layer 105B. The first sub-layer 105A includes a transparent conductive oxide (TCO) layer, e.g., indium tin oxide or indium zinc oxide. The first sub-layer 105A can include a thickness of about 1 nm to about 50 nm.

The second sub-layer 105B includes a metal layer, e.g., chromium, titanium, gold, silver, copper, aluminum, or a combination thereof, disposed on the first sub-layer 105A. The second sub-layer 105B can include a thickness of about 50 nm to about 200 nm.

The third sub-layer 105C includes a transparent conductive oxide (TCO) layer, e.g., indium tin oxide or indium zinc oxide. The third sub-layer 105C can include a thickness of about 1 nm to about 200 nm. Optionally, the third sub-layer 105C has a thickness that is greater than the thickness of the first sub-layer 105A and/or the second sub-layer 105B. Optionally, the second sub-layer 105B has a thickness that is greater than the thickness of the first sub-layer 105A. Without being bound by theory, a thicker third sub-layer 105C can allow for controllable wavelength emission of the OLED material, thereby reducing power requirements during operation of the sub-pixel circuit 900.

Optionally, the third sub-layer 105C of a first sub-pixel 108A is thicker than a third sub-layer 105C of a second sub-pixel 108B and/or a third sub-pixel 108C. Optionally, the third sub-layer 105C of a second sub-pixel 108B is thicker than a third sub-layer 105C of a third sub-pixel 108C. Without being bound by theory, by having the third sub-layer 105C of a first sub-pixel 108A be thicker than the third sub-layer 105C of the second sub-pixel 108B and/or the third sub-pixel 108C, and the third sub-layer 105C of the second sub-pixel 108B be thicker than the third sub-layer 105C of the third sub-pixel 108C, the light emitted from the first OLED material 112A may be red-shifted and/or green-shifted, thereby causing emission of a white emitting OLED material to be more red or green, without the need for a red, yellow, or green OLED emitting material.

In one embodiment, which can be combined with other embodiments described herein, the metal layers 104 are pre-patterned on the substrate 102, e.g., the substrate 102 is a pre-patterned indium tin oxide (ITO) glass substrate. In one embodiment, which can be combined with other embodiments described herein, the metal layers 104 are pre-patterned on the substrate 102, e.g., the metal layers 104 include a first sub-layer 105A of indium tin oxide, a second sub-layer 105B of silver, and a third sub-layer 105C of indium tin oxide.

The pixels are defined by adjacent pixel-defining layer (PDL) structures disposed on the substrate 102. The PDL structures 126 can be disposed on the substrate 102. The PDL structures 126 include one of an organic material, an organic material with an inorganic coating disposed thereover, or an inorganic material. The organic material of the PDL structures 126 includes, but is not limited to, polyimides. The inorganic material of the PDL structures 126 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent PDL structures define a respective sub-pixel and expose the anode (i.e., metal layer 104) of the respective sub-pixel of the sub-pixel circuit 900.

The sub-pixel circuit 900 has a plurality of sub-pixels 106 including at least a first sub-pixel 108A, a second sub-pixel 108B, and a third sub-pixel 108C. While the Figures depict the first sub-pixel 108A, the second sub-pixel 108B, and the third sub-pixel 108C, the sub-pixel circuit 100 of the embodiments described herein may include three or more sub-pixels 106, such as a fourth and a fifth sub-pixel. Each sub-pixel 106 has an OLED material, e.g., first OLED material 112A, second OLED material 112B, and third OLED material 112C, configured to emit a white, red, green, blue or other color light when energized, e.g., the first OLED material 112A of the first sub-pixel 108A emits a yellow light when energized, the second OLED material 112B of the second sub-pixel 108B emits a yellow light when energized, the third OLED material 112C of the third sub-pixel 108C emits a blue light when energized, and the OLED material of a fourth sub-pixel emits a different color light when energized.

Inorganic overhang structures 110 are disposed over the substrate 102, thereby defining each sub-pixel of the plurality of sub-pixels. In some embodiments, as shown in FIG. 9A, the inorganic overhang structures 110 are disposed over each of the PDL structures 126. The inorganic overhang structures 110 are permanent to the sub-pixel circuit. The inorganic overhang structures 110 further define each sub-pixel 106 of the sub-pixel circuit 900. The inorganic overhang structures 110 include at least an upper portion 110B disposed on a lower portion 110A. A first configuration of the inorganic overhang structures 110 includes the upper portion 110B of a non-conductive inorganic material and the lower portion 110A of a conductive inorganic material. A second configuration of the inorganic overhang structures 110 includes the upper portion 110B of a conductive inorganic material and the lower portion 110A of a conductive inorganic material. A third configuration of the inorganic overhang structures 110 includes the upper portion 110B of a non-conductive inorganic material, the lower portion 110A of a non-conductive inorganic material, and an optional assistant cathode (not shown) disposed under the lower portion 110A. A fourth configuration of the inorganic overhang structures 110 includes the upper portion 110B of a conductive inorganic material, the lower portion 110A of a non-conductive inorganic material, and an optional assistant cathode (not shown) disposed under the lower portion 110A. The first, second, third, and fourth embodiments of the sub-pixel circuit 900 include inorganic overhang structures 110 of at least one of the first, second, third, or fourth configurations. The inorganic overhang structures 110 are able to remain in place, e.g., are permanent.

The non-conductive inorganic material includes, but is not limited to, an inorganic silicon-containing material, e.g., the silicon-containing material includes oxides or nitrides of silicon, or combinations thereof. The conductive inorganic material includes, but is not limited to, a metal-containing material, e.g., the metal-containing material includes copper, titanium, aluminum, molybdenum, silver, indium tin oxide, indium zinc oxide, or combinations thereof.

At least a bottom surface 107 of the upper portion 110B is wider than a top surface 105 of the lower portion 110A to form an overhang 109. The bottom surface 107 larger than the top surface 105 forming the overhang 109 allows for the upper portion 110B to shadow the lower portion 110A. The shadowing of the overhang 109 provides for evaporation deposition each of the OLED material 112 and a cathode 114.

The OLED material, e.g., e.g., first OLED material 112A, second OLED material 112B, and third OLED material 112C, may include one or more of a HIL, a HTL, an EML, and an ETL. The OLED material, e.g., first OLED material 112A, second OLED material 112B, and third OLED material 112C, is disposed on the metal layer 104. In some embodiments, which can be combined with other embodiments described herein, the OLED material, e.g., first OLED material 112A, second OLED material 112B, and third OLED material 112C, is disposed on the metal layer 104 and over a portion of the PDL structures 126. A first cathode 114A, a second cathode 114B, and a third cathode 114C is disposed over the first OLED material 112A, second OLED material 112B, and third OLED material 112C, respectively, of the PDL structures 126 in each sub-pixel 106. The first cathode 114A, the second cathode 114B, and the third cathode 114C may be disposed on a portion of a sidewall 111 of the lower portion 110A. The first cathode 114A, the second cathode 114B, and the third cathode 114C includes a conductive material, such as a metal, e.g., chromium, titanium, aluminum, ITO, or a combination thereof. In other embodiments, which can be combined with other embodiments described herein, the first OLED material 112A, second OLED material 112B, and third OLED material 112C and the first cathode 114A, the second cathode 114B, and the third cathode 114C are disposed over a top surface 115 of the upper portion 110B of the inorganic overhang structures 110, respectively.

Each sub-pixel 106 includes include an encapsulation layer 116. The encapsulation layer 116 may be or may correspond to a local passivation layer. The encapsulation layer 116 of a respective sub-pixel, e.g., first encapsulation layer 116A, second encapsulation layer 116B, and third encapsulation layer 116C, is disposed over the first cathode 114A, the second cathode 114B, and the third cathode 114C, respectively, with the encapsulation layer 116 extending under at least a portion of each of the inorganic overhang structures 110 and along a sidewall of each of the inorganic overhang structures 110. The encapsulation layer 116 is disposed over the cathode and over at least the sidewall 111 of the lower portion 110A. In some embodiments, which can be combined with other embodiments described herein, the encapsulation layer 116 is disposed over the sidewall 113 of the upper portion 110B. In some embodiments, which can be combined with other embodiments described herein, the encapsulation layer 116 is disposed over the top surface 115 of the upper portion 110B of the inorganic overhang structures 110. The encapsulation layer 116 can include a non-conductive inorganic material, such as the silicon-containing material. The silicon-containing material may include $Si_3N_4$ containing materials.

An intermediate layer 118 may be deposited over the encapsulation layer 116, as shown in FIG. 9A. The intermediate layer 118 can include a monomer and/or a polymer, e.g., an inorganic polymer or an organic polymer. In some embodiments, the intermediate layer 118 can include a thickness of about 1 µm to about 10 µm, e.g., about 1 µm to about 5 µm, about 2 µm to about 8 µm, or about 4 µm to about 6 µm. Optionally, a second encapsulation layer 120 may be deposited over the intermediate layer 118. The second encapsulation layer 120 can include any of the encapsulation layer 116. The second encapsulation layer 120 can include a thickness of about 1 µm to about 10 µm, e.g., about 1 µm to about 5 µm, about 2 µm to about 8 µm, or about 4 µm to about 6 µm.

A plurality of mask structures 122 may be disposed over the second encapsulation layer 120. The plurality of mask structures 122 can be a material suitable to absorb external and/or internal light, e.g., a black material such as a black absorbing material. The plurality of mask structures 122 are disposed according to the first sub-pixel 108A, a second sub-pixel 108B, and a third sub-pixel 108C. For example, the plurality of mask structures 122 are disposed to such that the plurality of mask structures are aligned with the PDL structures 126 and/or the inorganic overhang structures 110, thereby allowing light emission from the OLED materials through an opening between the plurality of mask structures 122.

A color filter is disposed in the opening between the plurality of mask structures 122. A first color filter 124A may be aligned with the first sub-pixel 108A, a second color filter 124B may be aligned with the second sub-pixel 108B, and a third color filter 124C may be aligned with the third sub-pixel 108C. Each of the first color filter 124A, the second color filter 124B, or the third color filter 124C may be configured to restrict light transparency from a bottom surface of the color filter to a top surface of the color filter to a specific color and/or wavelength, e.g., red, green, and/or blue. For example, the first color filter 124A may receive a yellow, white, and/or red light and restrict light transparency to the color red, thereby only emitting red emission from the first sub-pixel 108A. As a further example, the second color filter 124B may receive a yellow, white, and/or red light and may restrict light transparency to the color green, thereby only emitting green emission from the second sub-pixel 108B. As a further example, the third color filter 124C may receive a blue, white, and/or yellow light and may restrict light transparency to the color blue, thereby only emitting blue emission from the third sub-pixel 108C.

Figure 9B:
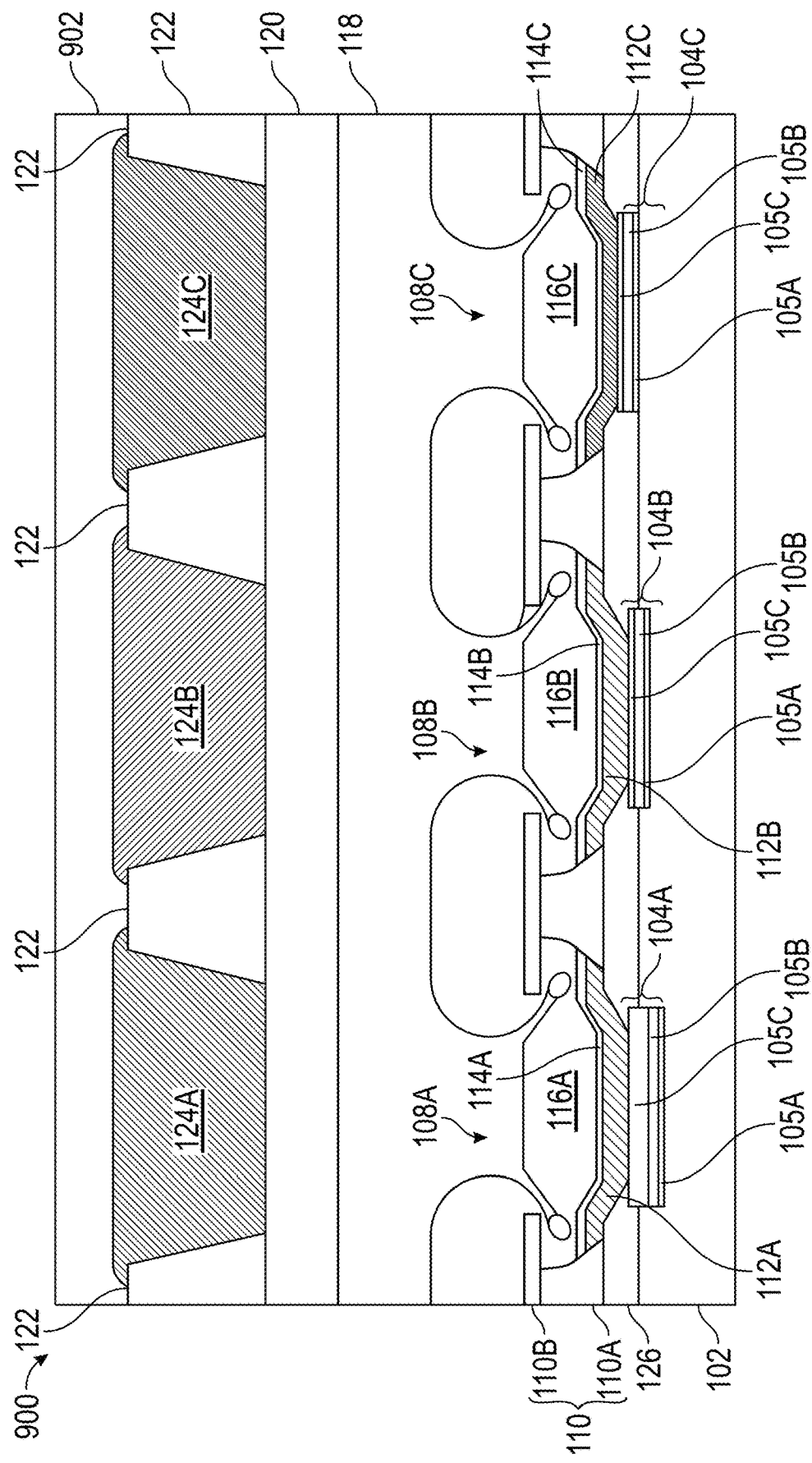

Optionally, a third encapsulation layer 902 may be deposited over the plurality of mask structures 122, the first color filter 124A, the second color filter 124B, and the third color filter 124C, as shown in FIG. 9B. The third encapsulation layer 902 can include any of the encapsulation layer 116 and/or the second encapsulation layer 120. The third encapsulation layer 902 can include a thickness of about 1 µm to about 10 µm, e.g., about 1 µm to about 5 µm, about 2 µm to about 8 µm, or about 4 µm to about 6 µm.

Figure 9C:
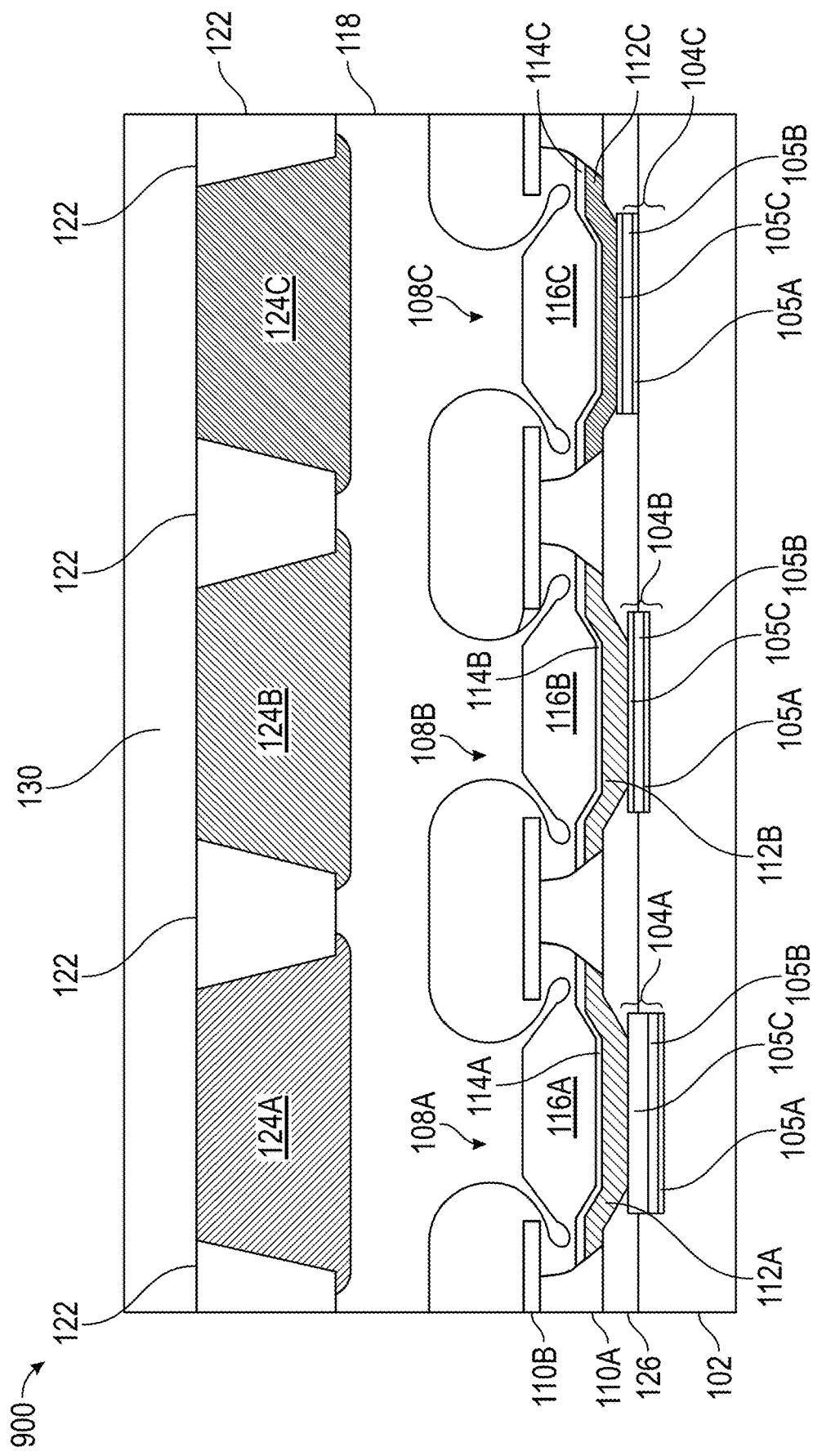

Optionally, the plurality of mask structures 122 and the color filters, e.g., the first color filter 124A, the second color filter 124B, or the third color filter 124C may be disposed on a backing material 130, as shown in FIG. 9C. The backing material 130 can include a transparent material suitable for supporting the plurality of mask structures 122 and the color filters, e.g., the first color filter 124A, the second color filter 124B, or the third color filter 124C. The plurality of mask structures 122 and the color filters, e.g., the first color filter 124A, the second color filter 124B, or the third color filter 124C may be disposed on the backing material 130, inverted, and placed on the intermediate layer 118, as shown in FIG. 9C, thereby allowing for manufacturing of the color filters to occur in parallel with the manufacturing of the sub-pixels, and reducing the time for manufacturing.

Figure 9D:
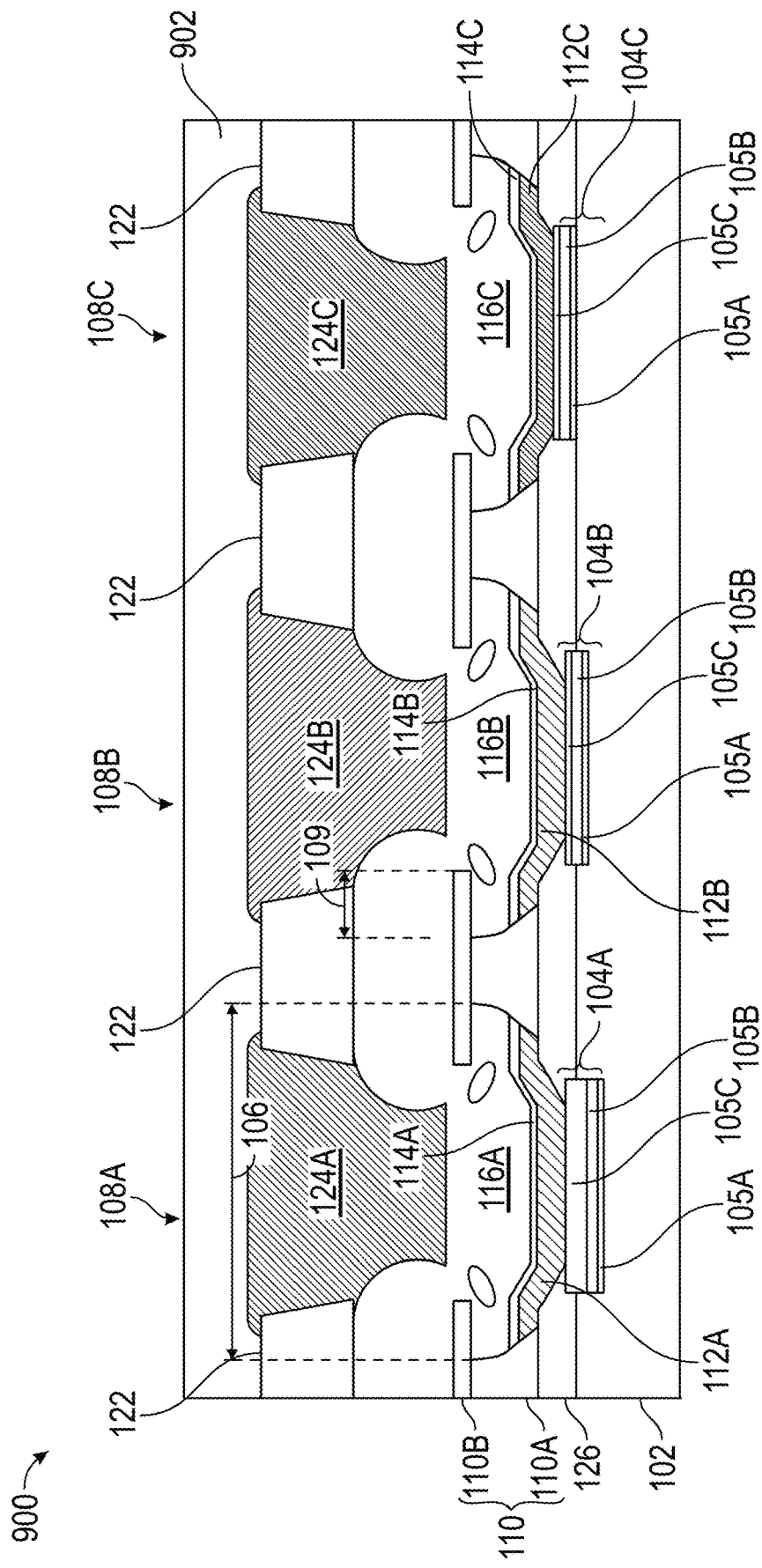

Optionally, the plurality of mask structures 122 may be deposited over the first encapsulation layer 116A, where no intermediate layer 118 separates the plurality of mask structures 122 and the first encapsulation layer 116A, as shown in FIG. 9D. The color filters, e.g., the first color filter 124A, the second color filter 124B, or the third color filter 124C, are disposed over the first encapsulation layer 116A, and between the plurality of mask structures 122. Without being bound by theory, by disposing the color filters over the encapsulation layer 116, a reduction of manufacturing costs may occur. Optionally, the third encapsulation layer 902 may be deposited over the plurality of mask structures 122, the first color filter 124A, the second color filter 124B, and the third color filter 124C, as shown in FIG. 9D.

Figure 9E:
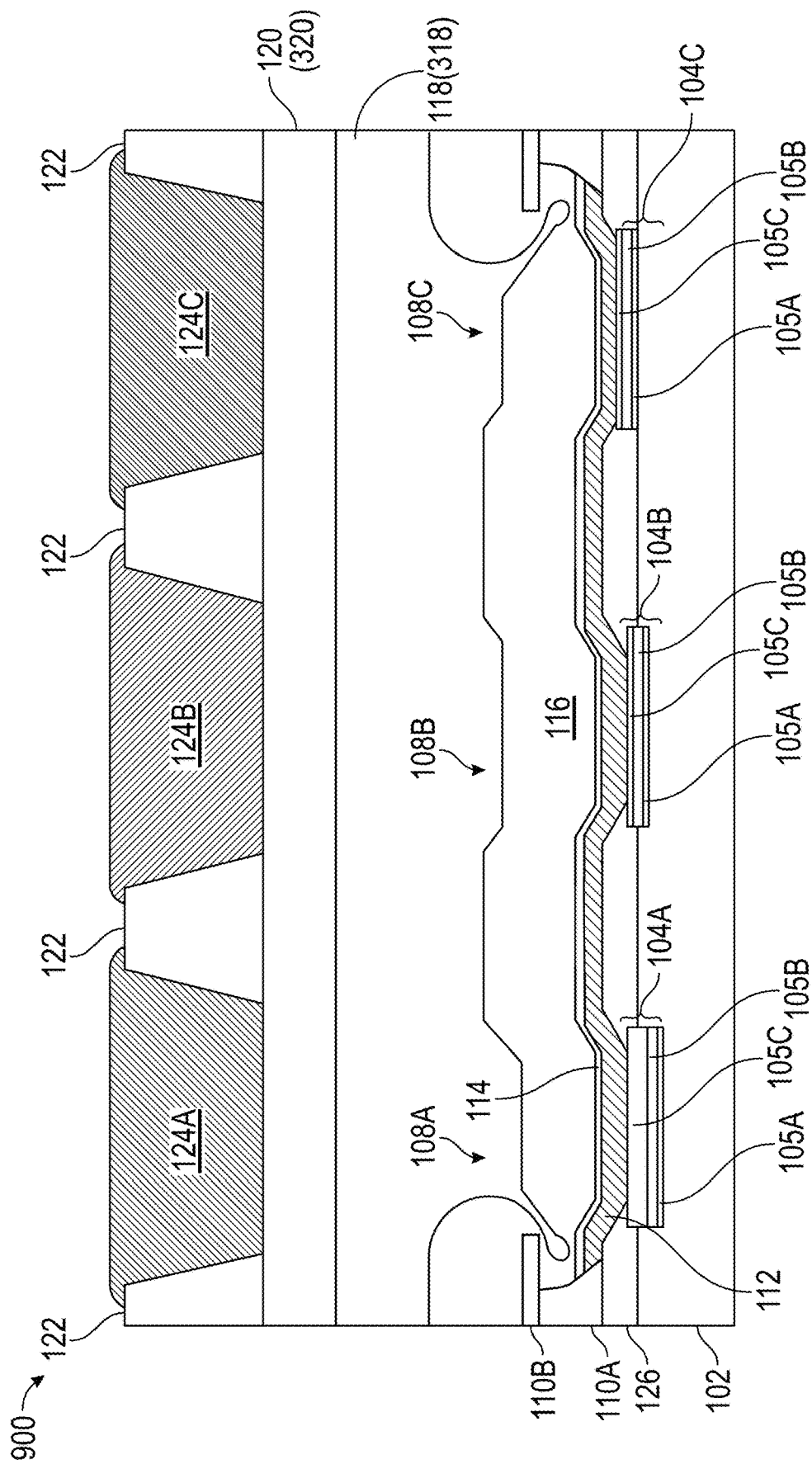

FIG. 9E is a schematic, cross-sectional view of a sub-pixel circuit 900, in which the sub-pixel circuit 500 has the OLED material 112 and the cathode 114 shared across the first sub-pixel 108A, the second sub-pixel 108B, and the third sub-pixel 108C. The OLED material 112 can includes a white emitting OLED material, as described herein. The OLED material 112 and the cathode 114 may be shared due to a removal of an inorganic overhangs structure 110 between the first sub-pixel 108A and the second sub-pixel 108B, and the second sub-pixel 108B and the third sub-pixel 108C.

The third sub-layer 105C of the first sub-pixel 108A is thicker than a third sub-layer 105C of the second sub-pixel 108B. Additionally, the third sub-layer 105C of the second sub-pixel 108B is thicker than the third sub-layer 105C of the third metal layer 104C. Without being bound by theory, by having the third sub-layer 105C of the first sub-pixel 108A be thicker than the third sub-layer 105C of the second sub-pixel 108B, and the third sub-layer 105C of the second sub-pixel 108B be thicker than the third sub-layer 105C of the third metal layer 104C, the light emitted from the OLED material 112 may be shifted such that the first sub-pixel 108A emits a red light, the second sub-pixel 108B emits a green light, and the third sub-pixel 108C emits a blue light. Additionally, and without being bound by theory, a reduction of manufacturing costs occurs due to the reduced materials required to produce the sub-pixel circuit 900, e.g., reduction of overhang structures, and reduction of individualized OLED materials.

Figure 9F:
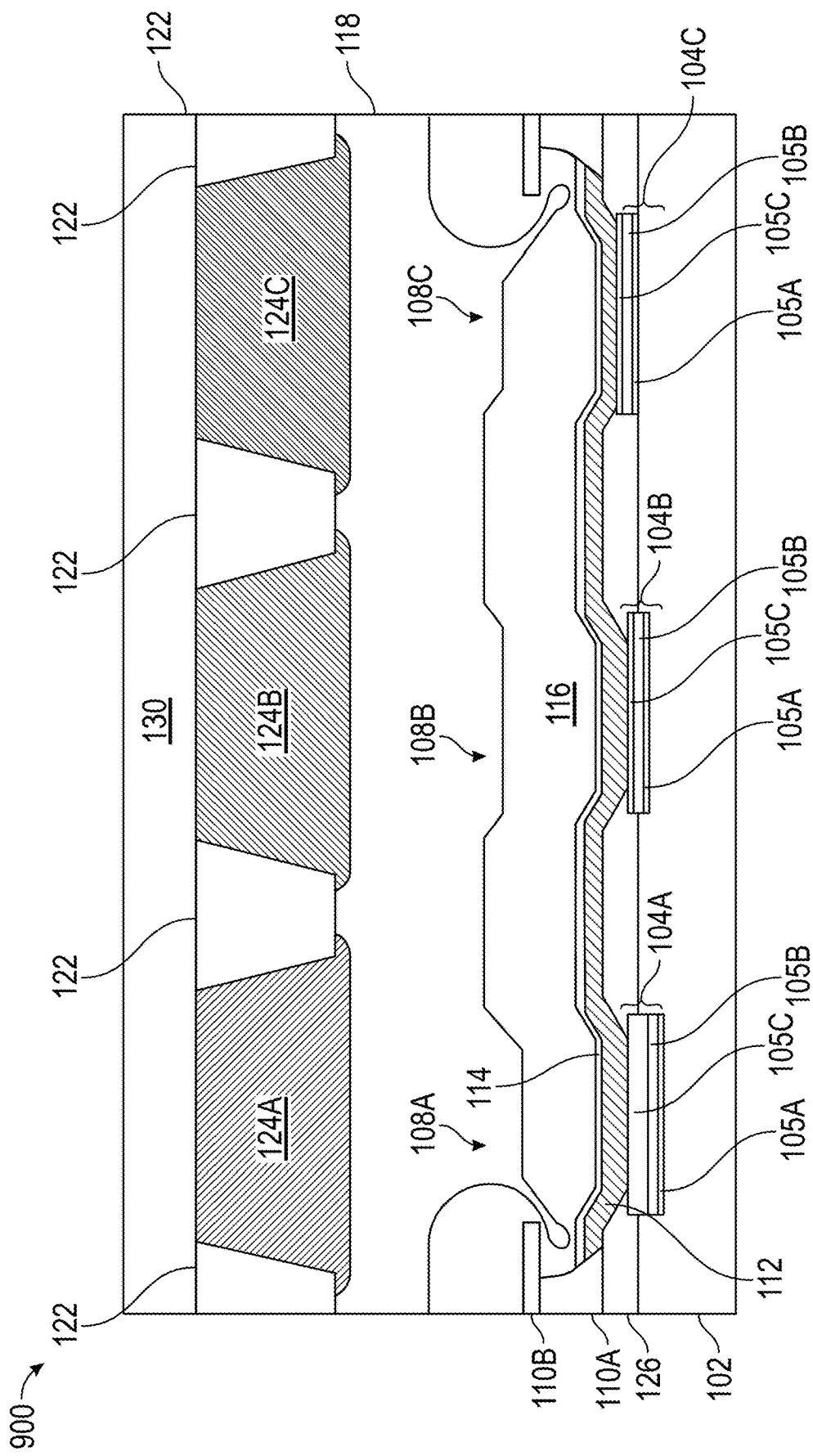

Optionally, the plurality of mask structures 122 and the color filters, e.g., the first color filter 124A, the second color filter 124B, or the third color filter 124C may be disposed on a backing material 130, as shown in FIG. 9F. The backing material 130 can include a transparent material suitable for supporting the plurality of mask structures 122 and the color filters, e.g., the first color filter 124A, the second color filter 124B, or the third color filter 124C. The plurality of mask structures 122 and the color filters, e.g., the first color filter 124A, the second color filter 124B, or the third color filter 124C may be disposed on the backing material 130, inverted, and placed on the intermediate layer 118, as shown in FIG. 9F, thereby allowing for manufacturing of the color filters to occur in parallel with the manufacturing of the sub-pixels, and reducing the time for manufacturing.

Figure 10A:
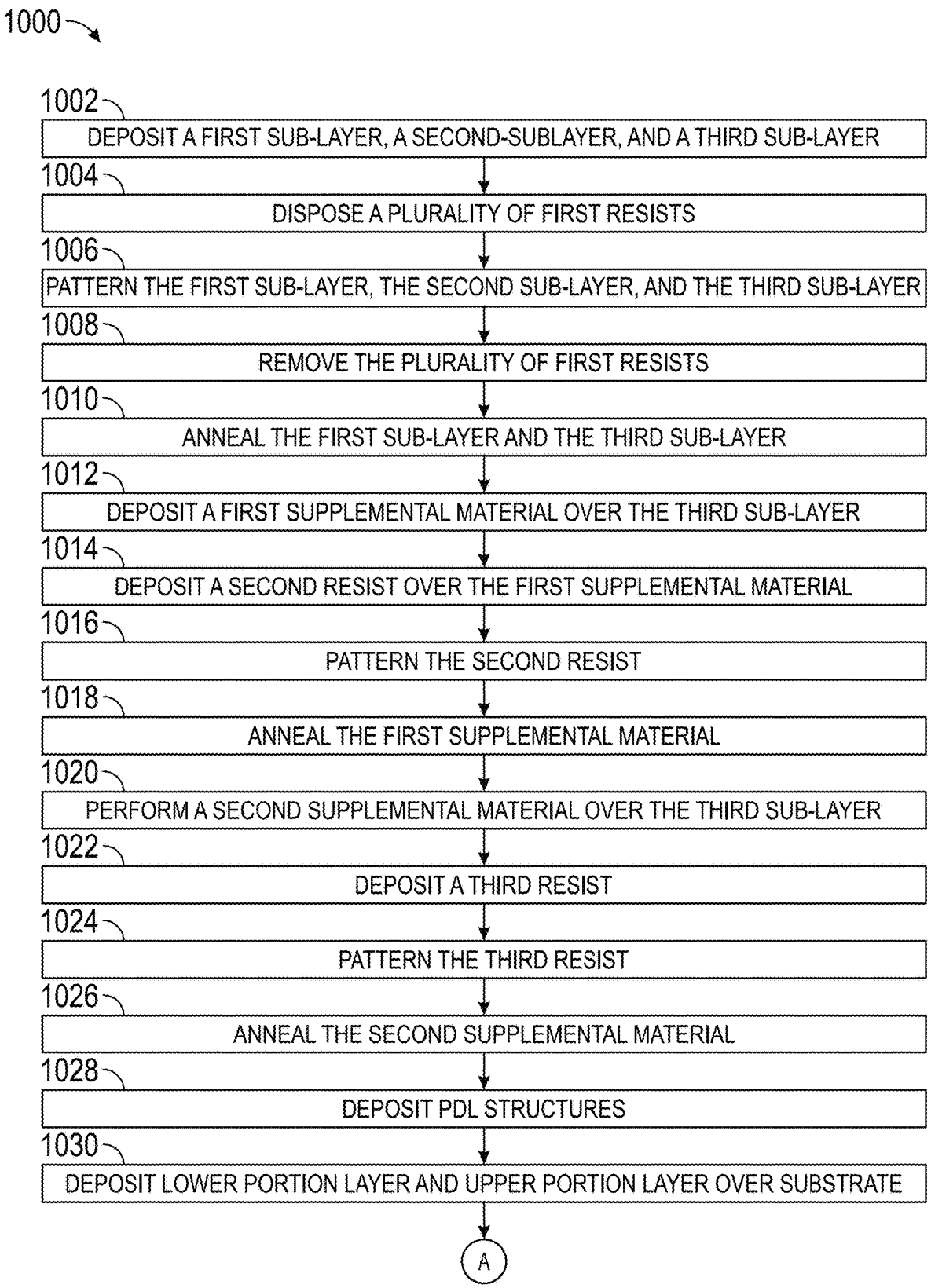
FIGS. 10A and 10B are flow diagrams of a method for forming a sub-pixel circuit, according embodiments described herein.
Figure 10B:
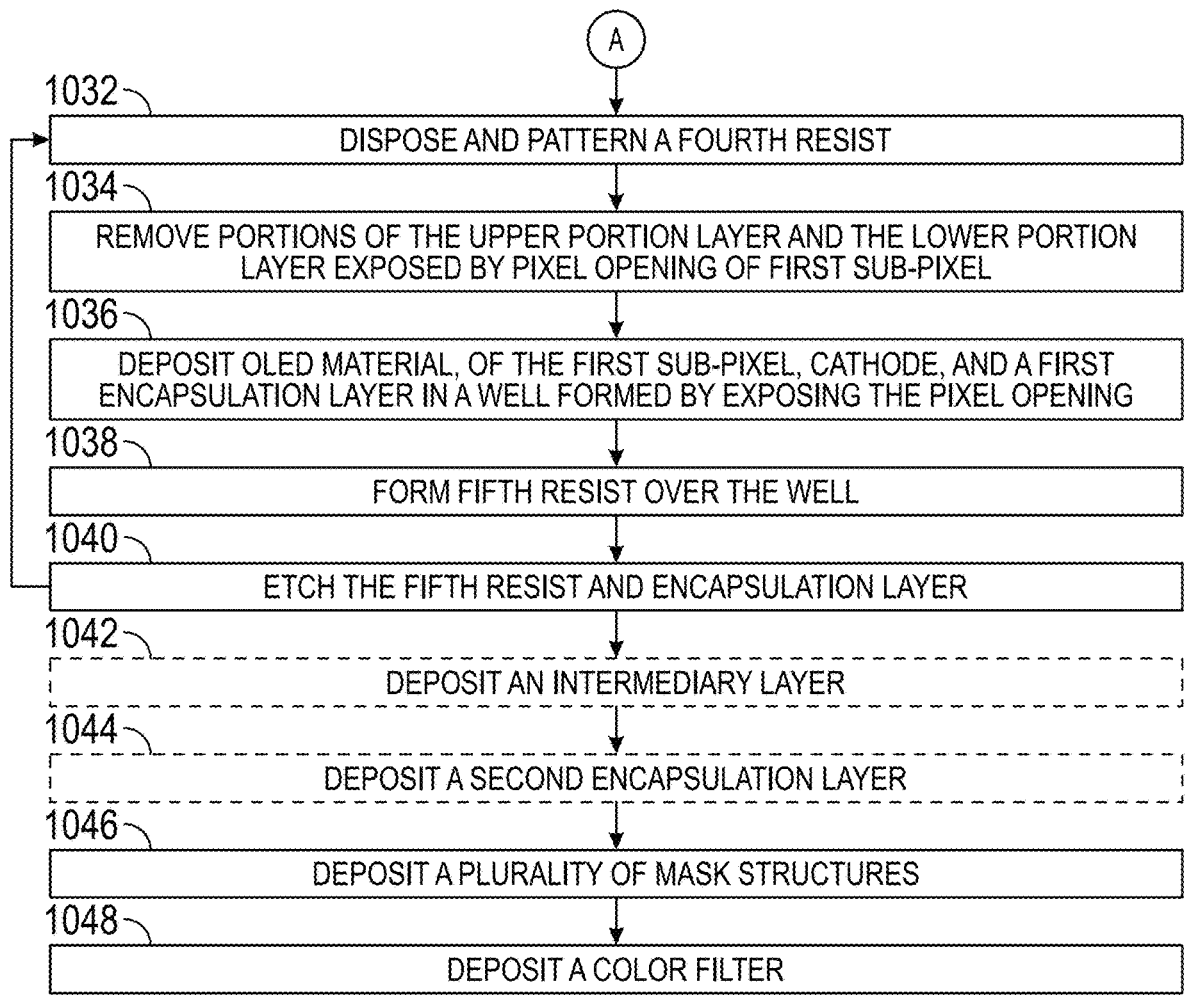
Figures 11A, 11B, 11C, 11D, 11E:
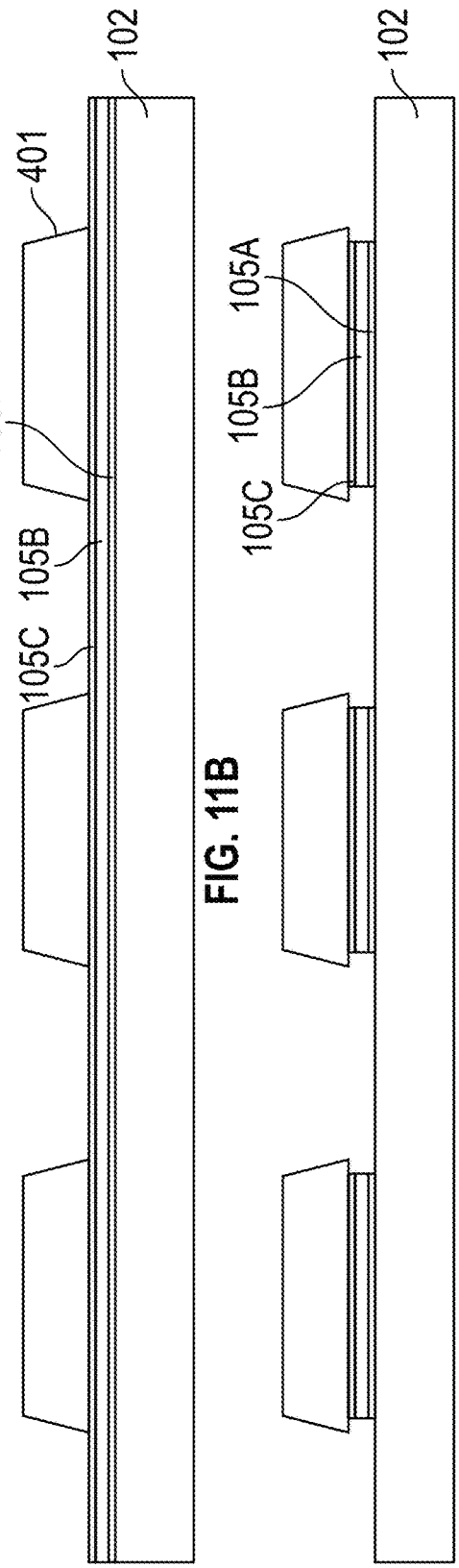
FIGS. 11A-11Y are schematic, cross-sectional views of a substrate during a method for forming a sub-pixel circuit, according embodiments described herein.

FIGS. 10A and 10B are flow diagrams of a method 1000 for forming a sub-pixel circuit 900. FIGS. 11A-11Y are schematic, cross-sectional views of a substrate 102 during the method 1000 for forming the sub-pixel circuit 900 according to embodiments described herein.

At operation 1002, as shown in FIG. 11A, a first sub-layer 105A, a second sub-layer 105B, and a third sub-layer 105C is deposited on a substrate 102. The first sub-layer 105A, and the third sub-layer 105C include an amorphous transparent conductive oxide, e.g., amorphous indium tin oxide. The second sub-layer 105B includes a metal layer such as a silver layer. At operation 1004, as shown in FIG. 11B, a plurality of first resists 401 are disposed the third sub-layer 105C. The plurality of first resists are deposited over the third sub-layer 105C such that each of a first metal layer 104A, a second metal layer 104B, and a third metal layer 104C is covered by each first resist of the plurality of first resists 401. At operation 1006, as shown in FIG. 11C, the first sub-layer 105A, the second sub-layer 105B, and the third sub-layer 105C is patterned to form the first metal layer 104A, the second metal layer 104B, and the third metal layer 104C. The patterning is one of a photolithography, digital lithography process, or laser ablation process.

At operation 1008, as shown in FIG. 11D, the plurality of first resists 401 are removed to expose the first metal layer 104A, the second metal layer 104B, and the third metal layer 104C. At operation 1010, as shown in FIG. 11E, the first sub-layer 105A and the third sub-layer 105C are annealed according to an annealing process. The first sub-layer 105A and the third sub-layer 105C are annealed to produce a poly-crystallized transparent conductive oxide from the amorphous transparent conductive oxide. For example, the first sub-layer 105A and the third sub-layer 105C may be annealed to form a poly-crystallized indium tin oxide.

At operation 1012, as shown in FIG. 11F, a first supplemental material 402 is deposited over the third sub-layer 105C. The first supplemental material 402 includes an amorphous transparent conductive oxide, e.g., amorphous indium tin oxide. The first supplemental material 402 can be deposited to provide a thickness of about 50 nm to about 100 nm.

At operation 1014, as shown in FIG. 11G, a second resist 403 is deposited over the first supplemental material 402. The second resist 403 is deposited over the first supplemental material 402 such that a first metal layer 104A is covered by the second resist 403. Optionally, the second resist 403 may be deposited over a lateral edge 406 of a second metal layer 104B and a third metal layer 104C, thereby exposing a top central surface 410 of the second metal layer 104B and the third metal layer 104C. Without being bound by theory, the second resist 403 may be deposited over the lateral edge of the second metal layer 104B and the third metal layer 104C such that the third sub-layer 105C does not get etched over the lateral edge, thereby providing enhanced protection of the edge of the second sub-layer 105B.

The second resist 403 is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the second resist 403 determines whether the resist is a positive resist or a negative resist.

Figure 11H:
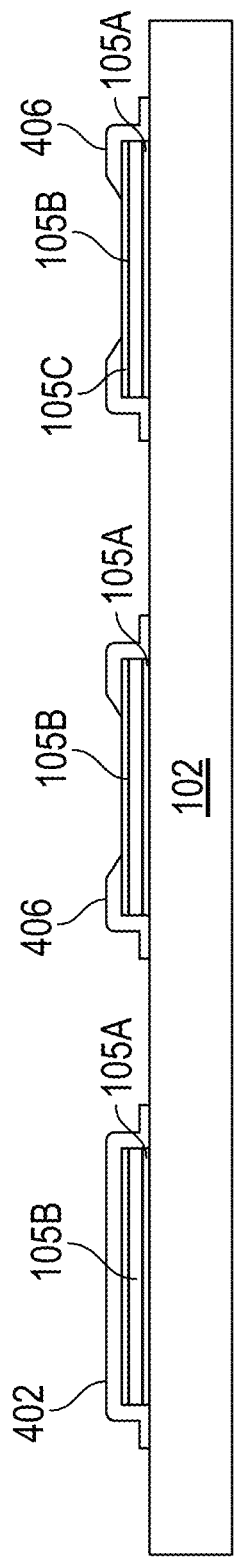
Figure 11I:
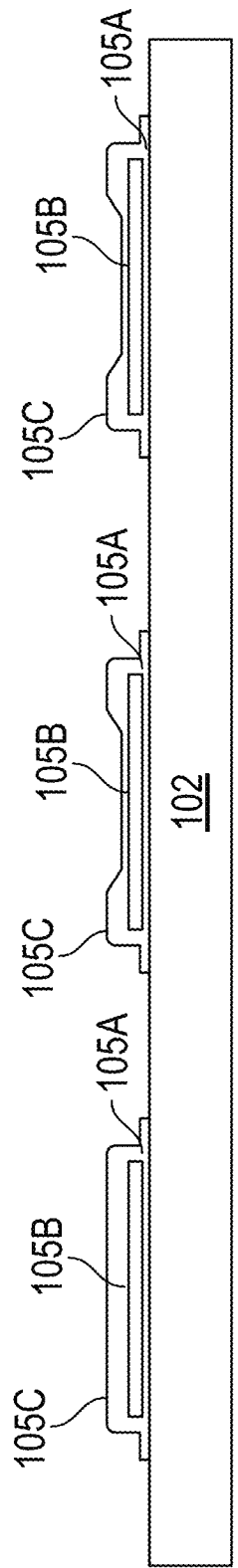

At step 1016, as shown in FIG. 11H, the second resist 403 is patterned to form an opening at the top central surface 410 of the second metal layer 104B and the third metal layer 104C. The patterning is one of a photolithography, digital lithography process, or laser ablation process. At step 1018, as shown in FIG. 11I, the first supplemental material 402 is annealed. The first supplemental material 402 is annealed to produce a poly-crystallized transparent conductive oxide from the amorphous transparent conductive oxide. For example, the first supplemental material 402 may be annealed to form a poly-crystallized indium tin oxide. In some embodiments, which may be combined with other embodiments, by annealing the first supplemental material 402 to produce a poly-crystallized transparent conductive oxide, the first supplemental material 402 may be similar to the third sub-layer 105C. For example, the first supplemental material 402, when annealed, may become the third sub-layer 105C.

Figure 11J:
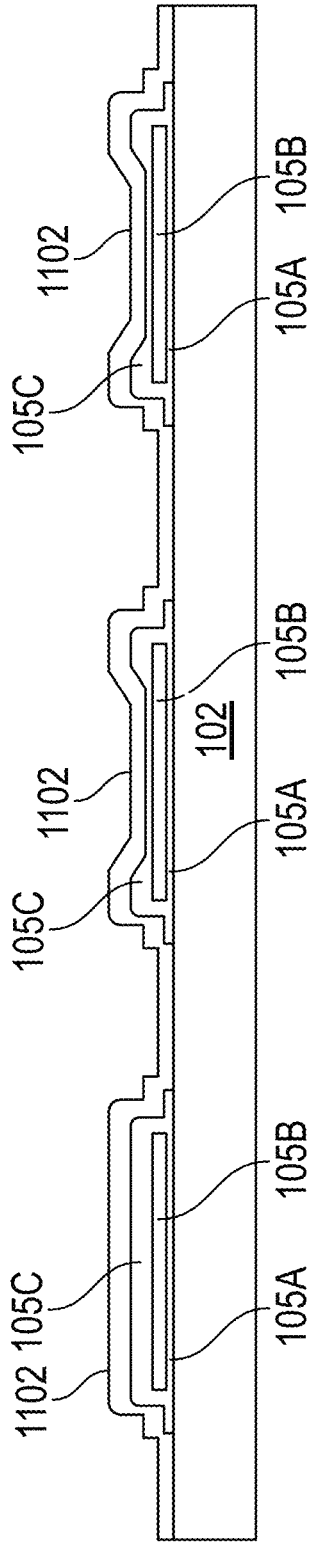

At operation 1020, as shown in FIG. 11J, a second supplemental material 1102 is disposed on the third sub-layer 105C. The second deposition process includes depositing of the second supplemental material 1102 over the third sub-layer 105C of the first metal layer 104A, the second metal layer 104B, and/or the third metal layer 104C. The second supplemental material 1102 can be deposited to provide a thickness of about 50 nm to about 100 nm of the second supplemental material 1102.

At operation 1022, as shown in FIG. 11K, a third resist 1104 is deposited over the second supplemental material 1102. The third resist 1104 is deposited over the second supplemental material 1102 such that a first metal layer 104A and a second metal layer 104B is covered by the third resist 1104. Optionally, the third resist 1104 is not deposited over a third metal layer 104C, thereby exposing the third metal layer 104C. The third resist 1104 is a positive resist or a negative resist. The chemical composition of the third resist 1104 determines whether the resist is a positive resist or a negative resist.

Figure 11M:
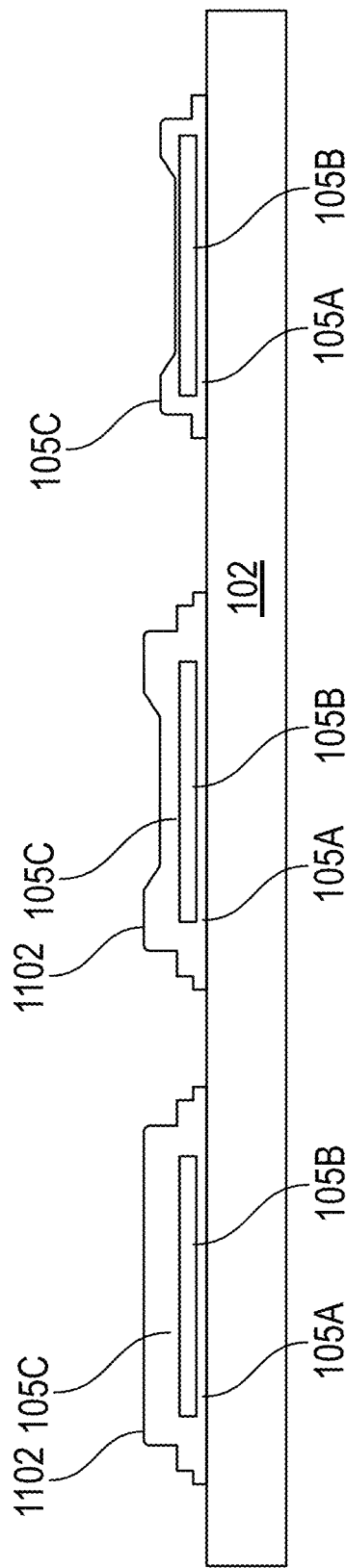

At step 1024, as shown in FIG. 11L, the third resist 1104 is patterned to form an opening at the top central surface 410 of the third metal layer 104C. The patterning is one of a photolithography, digital lithography process, or laser ablation process. At step 1026, as shown in FIG. 11M, the second supplemental material 1102 is annealed. The second supplemental material 1102 is annealed to produce a poly-crystallized transparent conductive oxide from the amorphous transparent conductive oxide. For example, the second supplemental material 1102 may be annealed to form a poly-crystallized indium tin oxide. In some embodiments, when annealed, the second supplemental material 1102 may be the third sub-layer 105C.

Figure 11N:
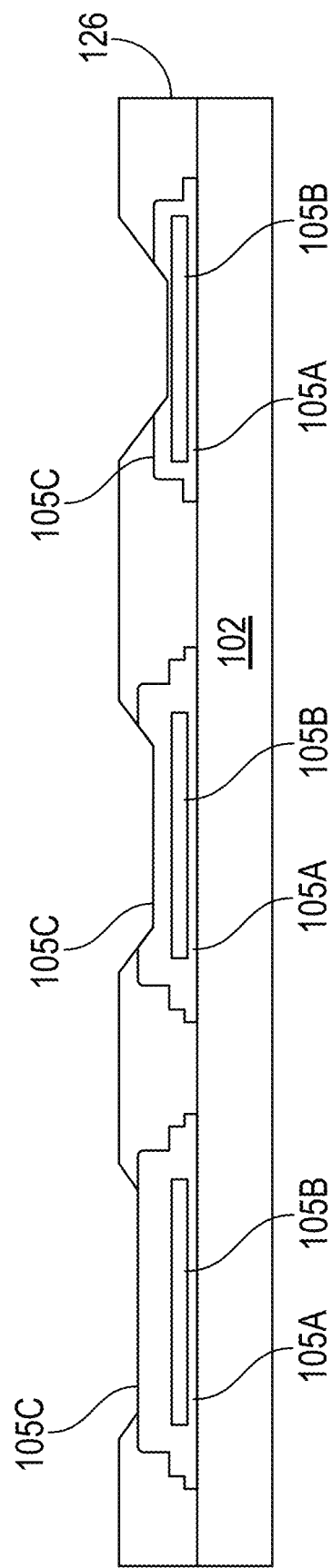
Figure 11O:
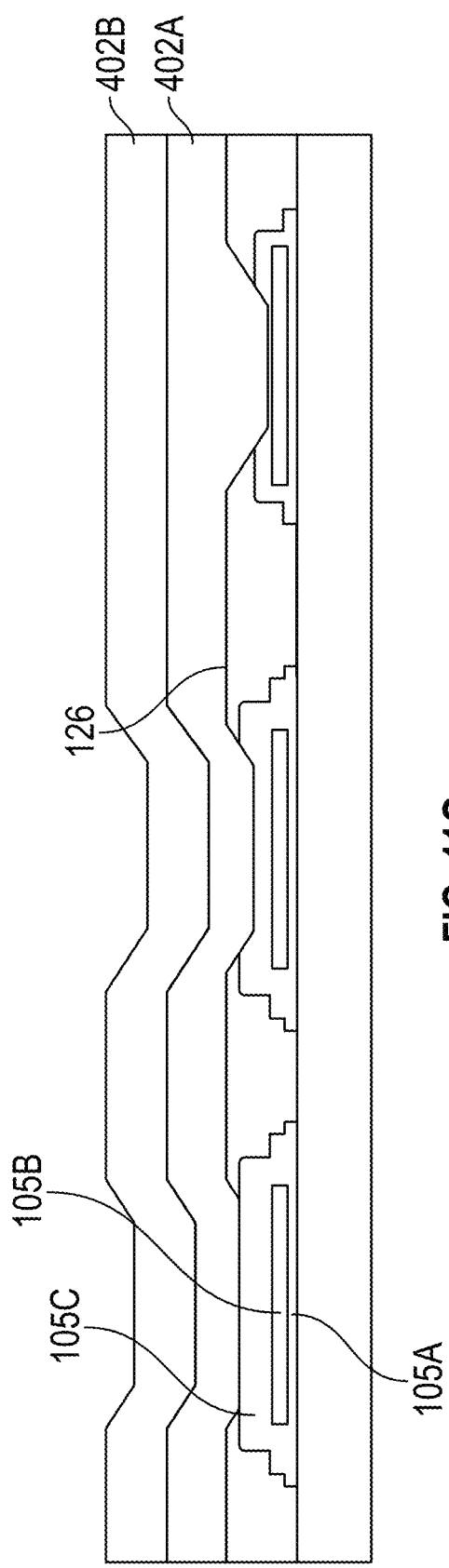

At operation 1028, as shown in FIG. 11N, PDL structures 126 are deposited over the substrate 102 such that only the metal layers 104 remain exposed. At operation 1030, as shown in FIG. 11O, a lower portion layer 402A and an upper portion layer 402B are deposited over the substrate 102. The lower portion layer 402A is disposed over the PDL structures 126 and the metal layers 104, e.g., the first metal layer 104A, the second metal layer 104B, and the third metal layer 104C. The upper portion layer 402B is disposed over the lower portion layer 402A. In various embodiments, the lower portion layer 402A corresponds to the lower portion 110A and the upper portion layer 402B corresponds to the upper portion 110B of the inorganic overhang structures 110. In some embodiments, an assistant cathode layer is disposed between the lower portion layer 402A and the PDL structures 126 and the metal layers 104.

Figure 11P:
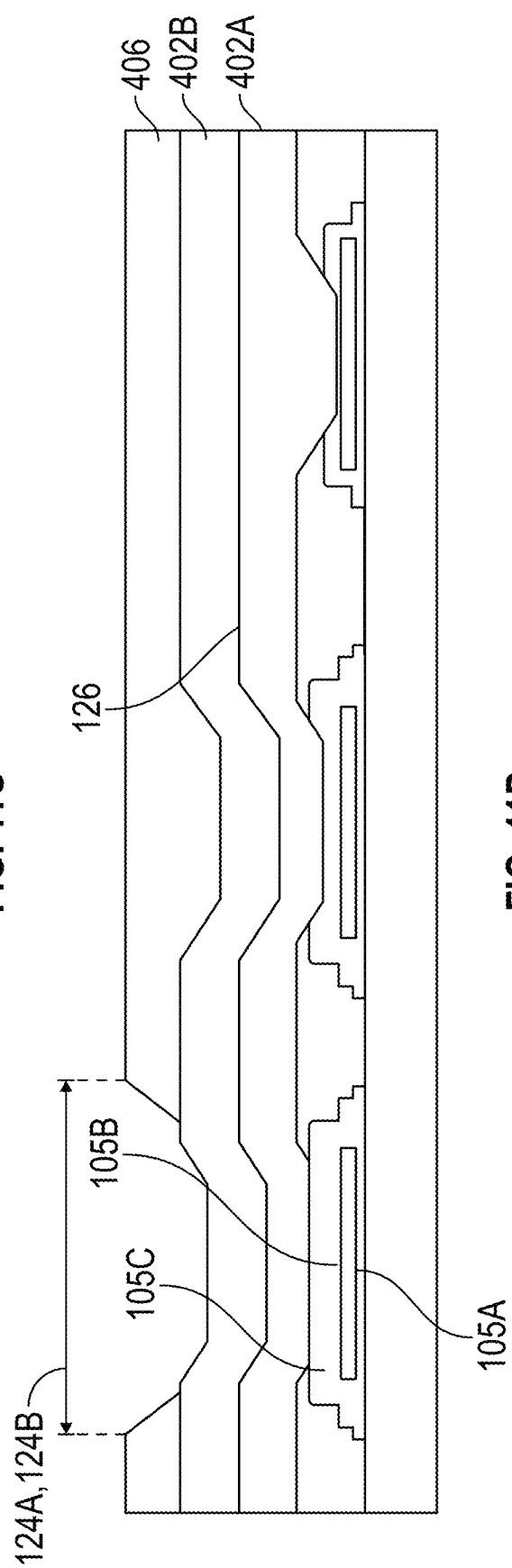

At operation 1032, as shown in FIG. 11P, a fourth resist 1106 is disposed and patterned. The fourth resist 1106 is disposed over the upper portion layer 402B. The fourth resist 1106 is a positive resist or a negative resist. The chemical composition of the fourth resist 1106 determines whether the resist is a positive resist or a negative resist. The fourth resist 1106 is patterned to form one of a pixel opening of a first sub-pixel 108a. The patterning is one of a photolithography, digital lithography process, or laser ablation process.

Figure 11Q:
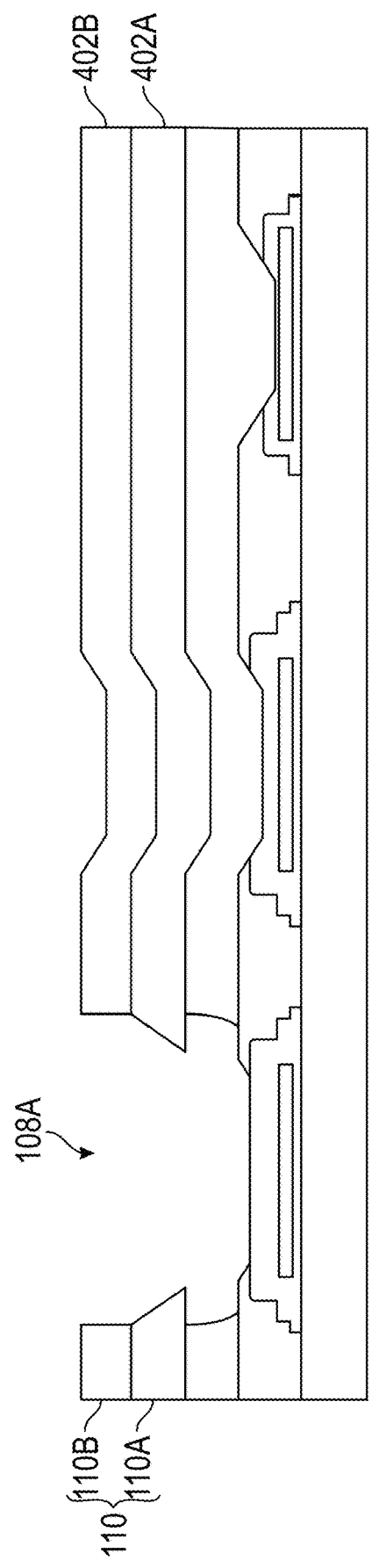

At operation 1034, as shown in FIG. 11Q, portions of the upper portion layer 402B and the lower portion layer 402A exposed by the pixel opening are removed. The upper portion layer 402B exposed by the pixel opening may be removed by a dry etch process. The lower portion layer 402A exposed by the pixel opening may be removed by a wet etch process. In embodiments including the assistant cathode layer, a portion of the assistant cathode layer may be removed by a dry etch process or a wet etch process to form an assistant cathode (not shown) disposed under the lower portion 110A. Operation 1034 forms the inorganic overhang structures 110 of the first sub-pixel 108a. The etch selectivity of the materials of the upper portion layer 402B (corresponding to the upper portion 110B) and the lower portion layer 402A (corresponding to the lower portion 110A) coupled with the etch processes can remove the exposed portions of the upper portion layer 402B and the lower portion layer 402A. This can provide for the bottom surface 107 of the upper portion 110B being wider than the top surface 105 of the lower portion 110A, thereby forming the overhang 109 (as shown in FIGS. 9A-9F).

Figure 11R:
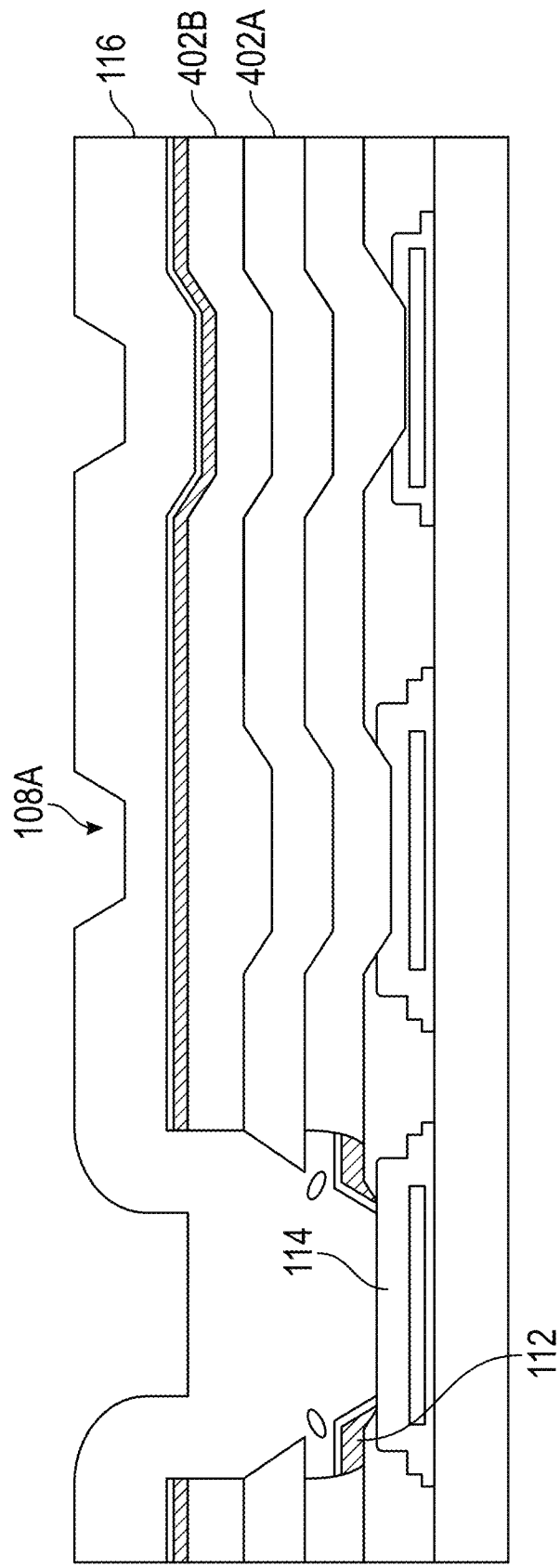

At operation 1036, as shown in FIG. 11R, the first OLED material 112A of the first sub-pixel 108a, the first cathode 114A, and the first encapsulation layer 116A are deposited. In some embodiments, the first OLED material 112A does not contact the lower portion 110A and the first cathode 114A directly contacts the lower portion 110A of the inorganic overhang structures 110. The first encapsulation layer 116A is deposited over the first cathode 114A. In embodiments including capping layers (not shown), the capping layers are deposited between the first cathode 114A and the first encapsulation layer 116A. The capping layers may be deposited by evaporation deposition.

Figure 11S:
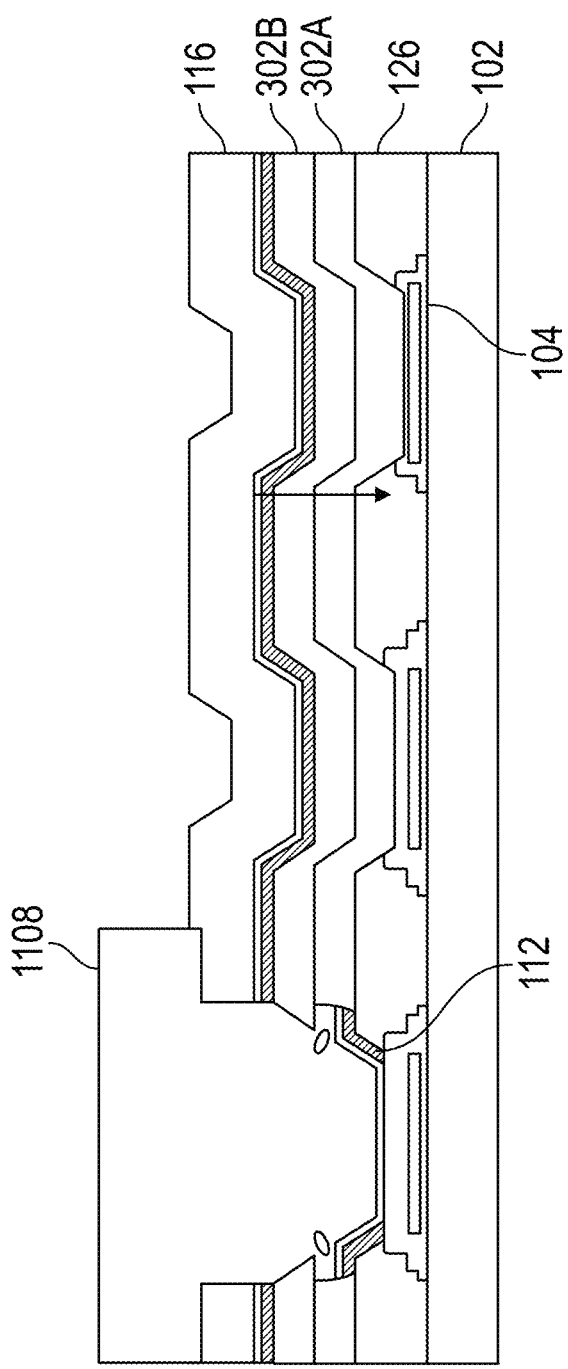
Figure 11T:
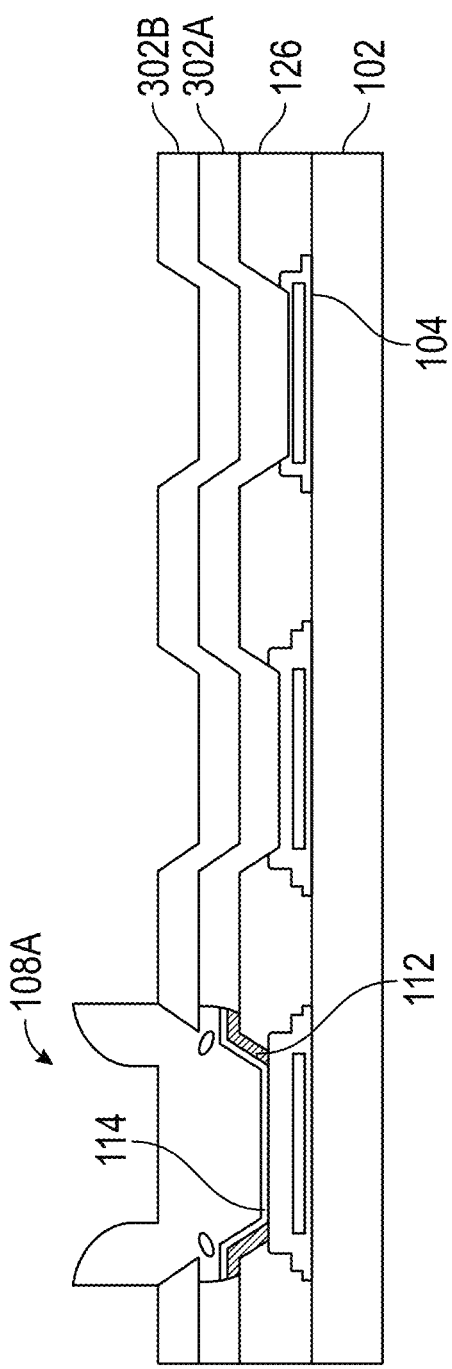

At operation 1038, as shown in FIG. 11S, a fifth resist 1108 is formed in a well of the first sub-pixel 108a and over the first encapsulation layer 116A disposed on the upper portion layer 402B. The fifth resist 1108 can be formed in the well, in which the fifth resist 1108 can fill the sub-pixel the well and one or more cavities within the encapsulation layer 116, which are formed due to the overhang 109. The fifth resist 1108 can include a fifth resist thickness of about 0.1 µm to about 10 µm, e.g., about 0.1 µm to about 8 µm, about 0.5 µm to about 5 µm, or about 0.9 µm to about 1.1 µm, over the upper portion 110B. At operation 1040, as shown in FIG. 11T, the fifth resist 1108 and the encapsulation layer 116 is etched.

Figure 11U:
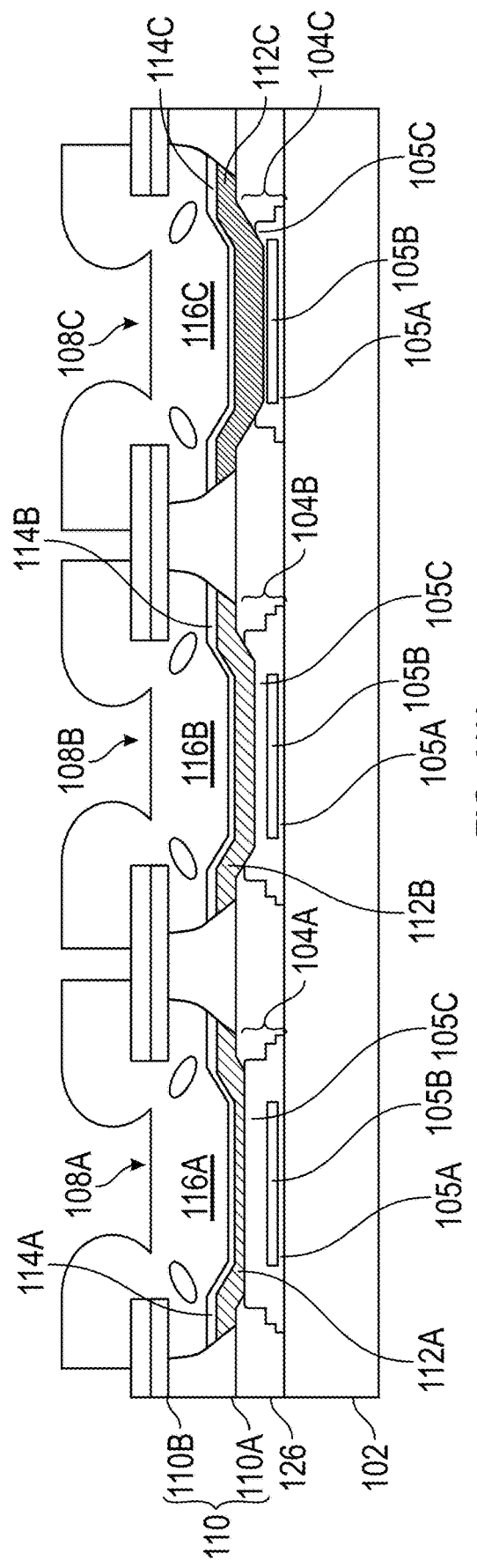

Operations 1032-1040 are repeated to produce the second sub-pixel 108B and the third sub-pixel 108C, as shown in FIG. 11U. In some embodiments, which can be combined with other embodiments, operations 1032-1040 can be iteratively repeated to provide for the formation of a plurality of sub-pixels. Each sub-pixel of the plurality of sub-pixels can include an OLED for a specific color, e.g., white, green, red, blue, or a combination thereof.

Figure 11V:
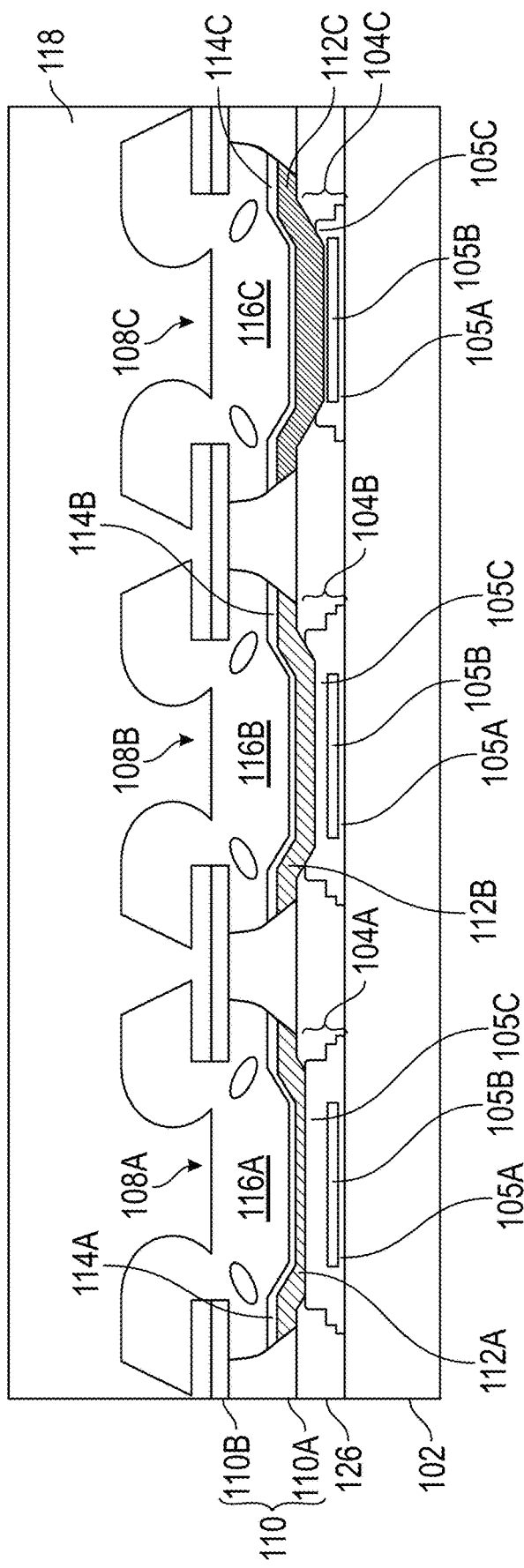
Figure 11W:
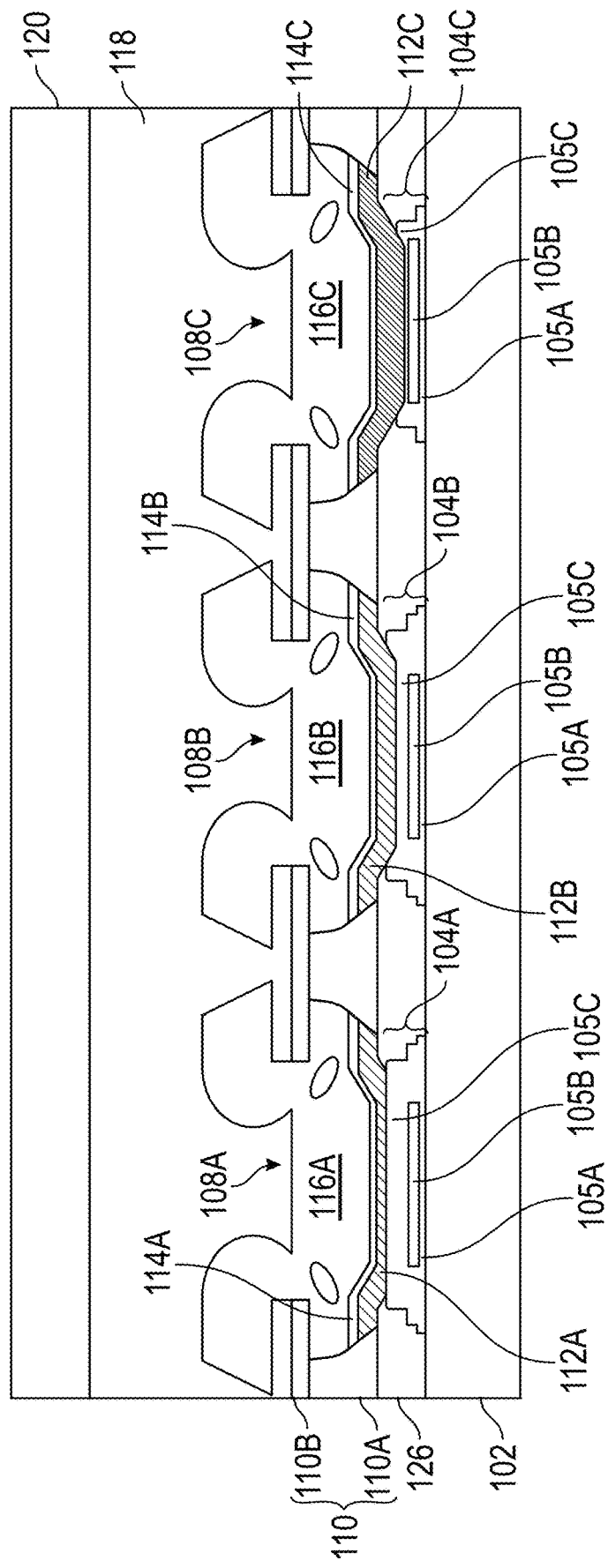

Optionally, at operation 1042, as shown in FIG. 11V, an intermediate layer 118 may be deposited over the encapsulation layer 116 and the inorganic overhang structures 110. The intermediate layer 118 can include a monomer and/or a polymer, e.g., an inorganic polymer or an organic polymer. In some embodiments, the intermediate layer 118 can include a thickness of about 1 µm to about 10 µm, e.g., about 1 µm to about 5 µm, about 2 µm to about 8 µm, or about 4 µm to about 6 µm. Optionally, at operation 1044, as shown in FIG. 11W, a second encapsulation layer 120 is deposited over the intermediate layer 118. The second encapsulation layer 120 can include any of the encapsulation layer 116. The second encapsulation layer 120 can have a thickness of about 1 µm to about 10 µm, e.g., about 1 µm to about 5 µm, about 2 µm to about 8 µm, or about 4 µm to about 6 µm.

Figure 11X:
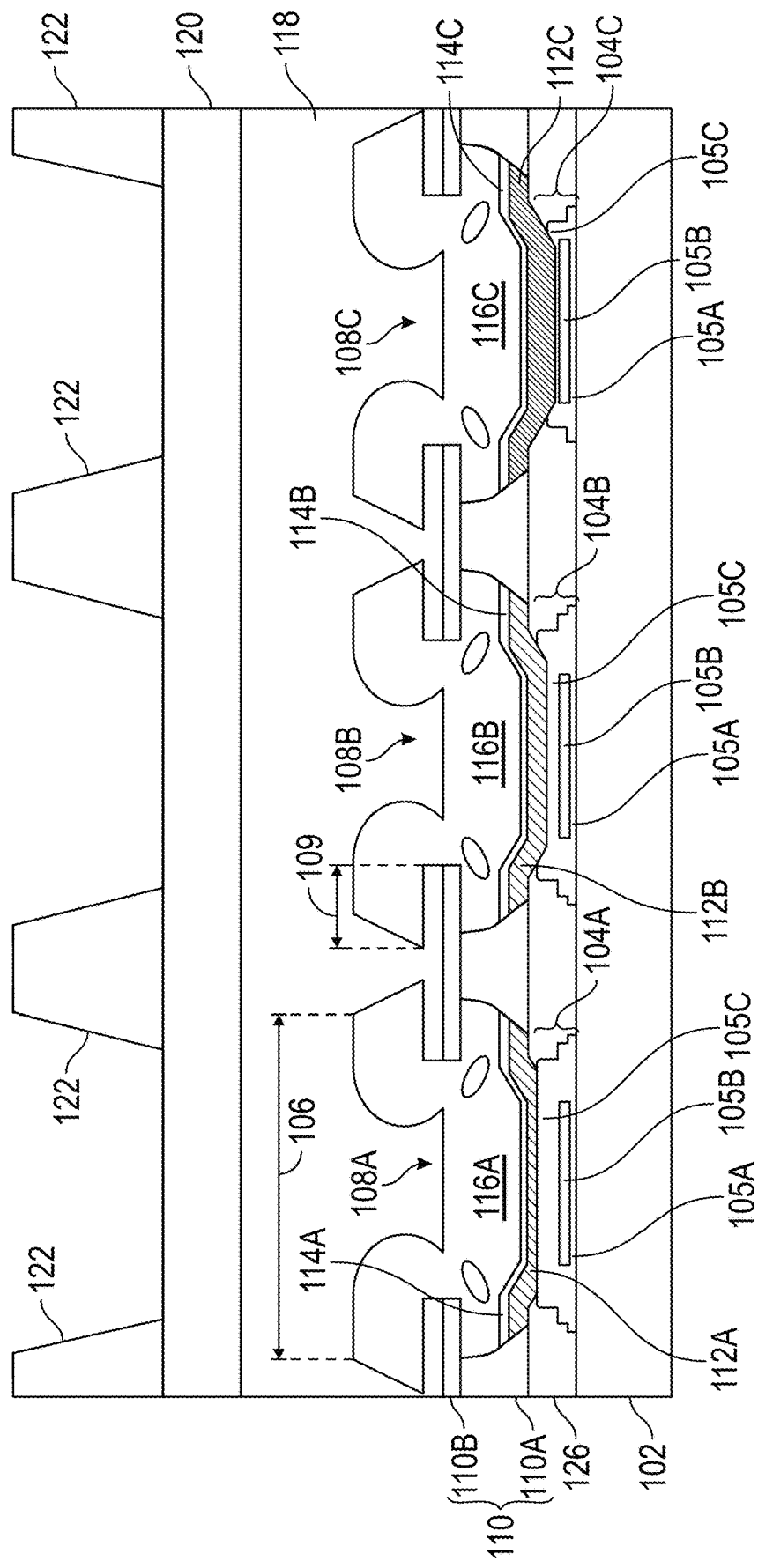
Figure 11Y:
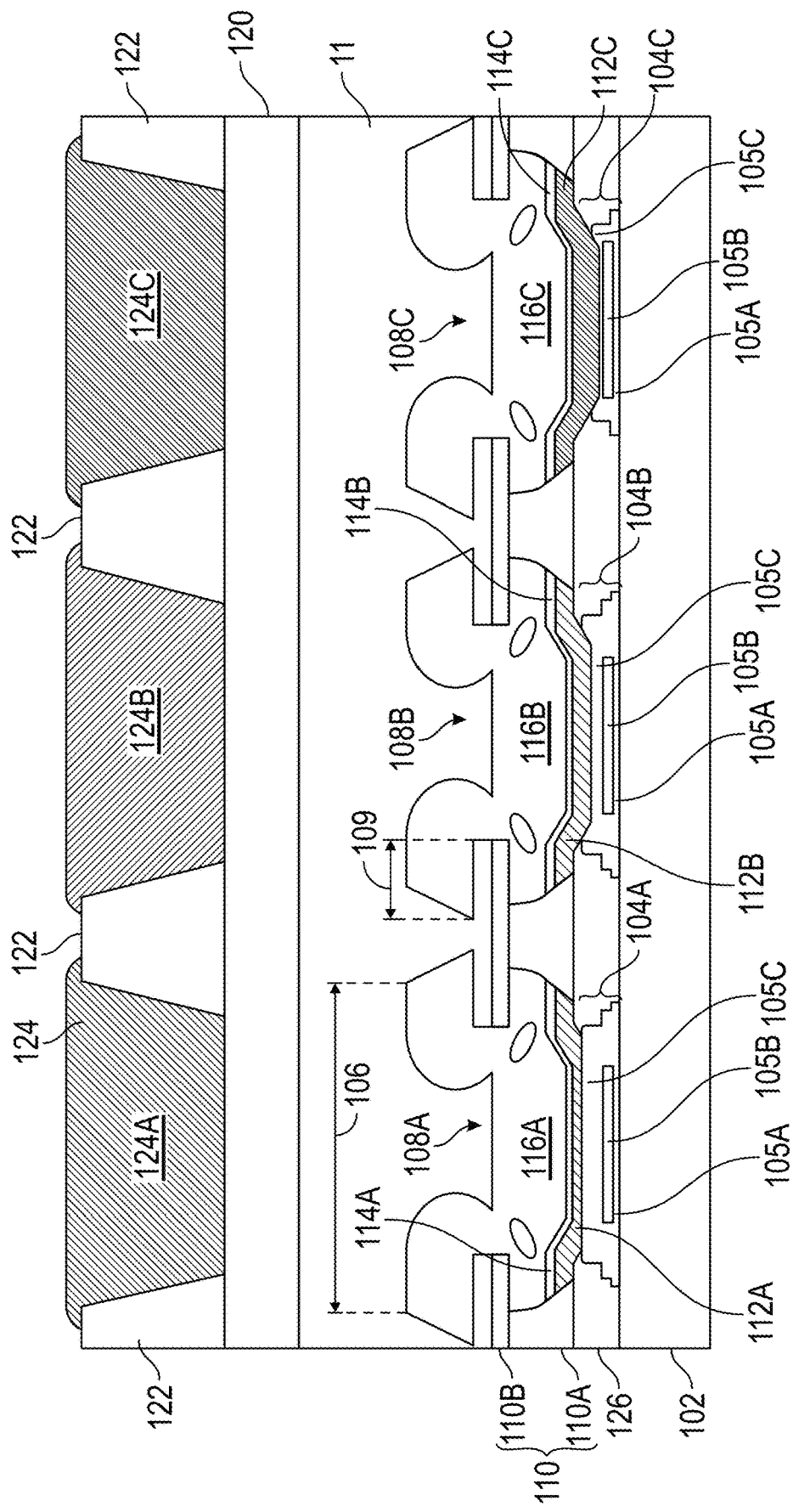

At operation 1046, as shown in FIG. 11X a plurality of mask structures 122 are disposed over the intermediate layer 118 and/or the second encapsulation layer 120. The plurality of mask structures 122 may be disposed according to the first sub-pixel 108A, a second sub-pixel 108B, and a third sub-pixel 108C. For example, the plurality of mask structures 122 may be disposed such that the mask structures align with the PDL structures 126 and/or the inorganic overhang structures 110, thereby allowing light emission emitted from the OLED materials through an opening between the plurality of mask structures 122.

At operation 1048, as shown in FIG. 11Y, a color filter 124 is disposed in the opening between the plurality of mask structures 122. A first color filter 124A may be aligned with the first sub-pixel 108A, a second color filter 124B may be aligned with the second sub-pixel 108B, and a third color filter 124C may be aligned with the third sub-pixel 108C. Each of the first color filter 124A, the second color filter 124B, or the third color filter 124C may be configured to restrict light transparency from a bottom surface of the color filter to a top surface of the color filter to a specific color and/or wavelength, e.g., red, green, and/or blue. For example, the first color filter 124A may receive a yellow, white, and/or red light and restrict light transparency to the color red, thereby only emitting red emission from the first sub-pixel 108A. As a further example, the second color filter 124B may receive a yellow, white, and/or red light and may restrict light transparency to the color green, thereby only emitting green emission from the second sub-pixel 108B. As a further example, the third color filter 124C may receive a blue, white, and/or yellow light and may restrict light transparency to the color blue, thereby only emitting blue emission from the third sub-pixel 108C.

Figure 12A:
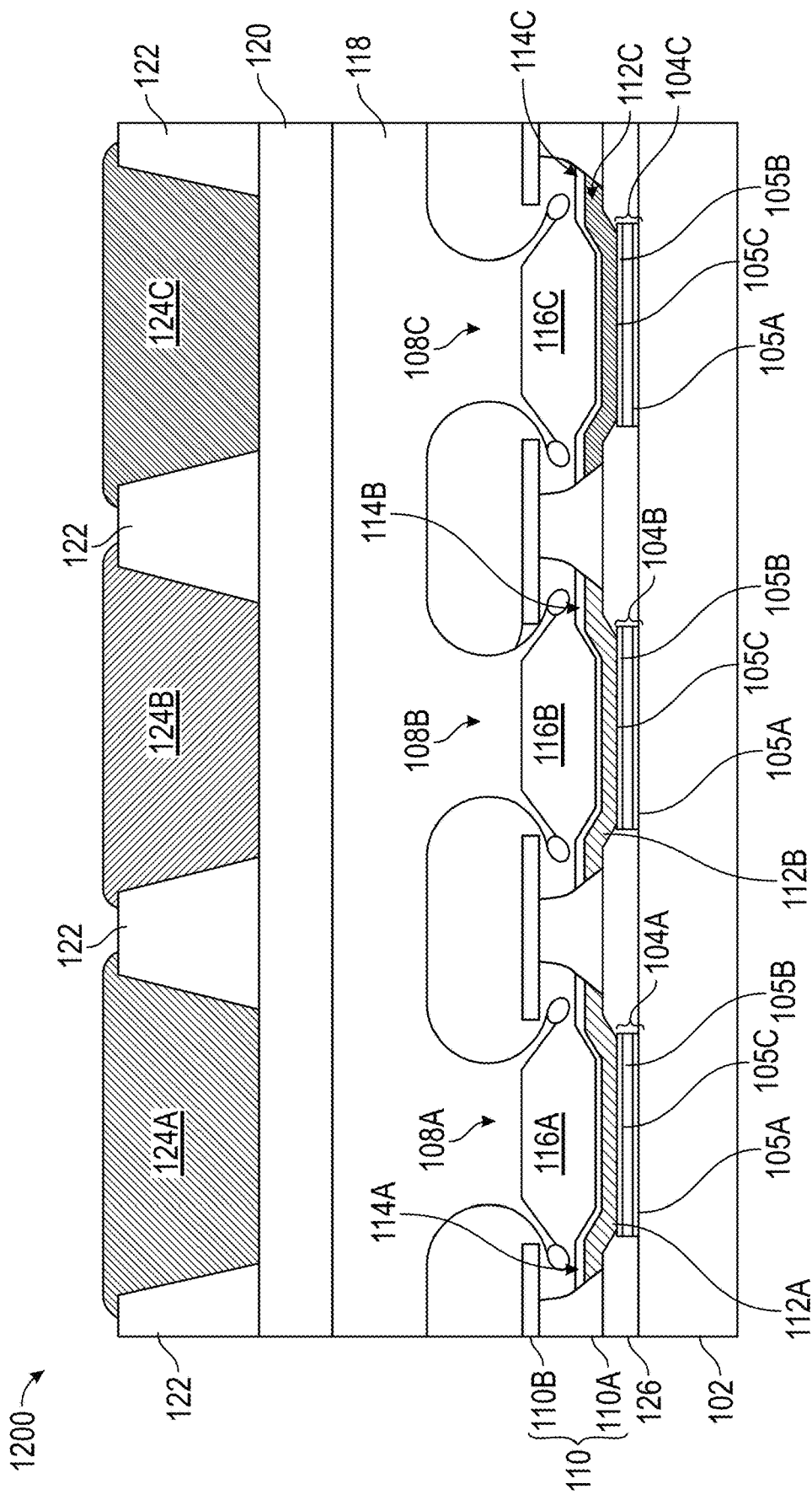
FIGS. 12A-12D are schematic, cross-sectional views of sub-pixel circuits, according to embodiments described herein.

FIG. 12A is a schematic, cross-sectional view of a sub-pixel circuit 1200. The sub-pixel circuit 1200 includes a substrate 102. Metal layers 104 are be patterned on the substrate 102. The metal layers 104 are configured to operate anodes of respective sub-pixels. The metal layers 104 are a layer stack of a first sub-layer 105A, a second sub-layer 105B disposed over the first sub-layer 105A, and a third sub-layer 105C disposed over the second sub-layer 105B. The first sub-layer 105A includes a transparent conductive oxide (TCO) layer, e.g., indium tin oxide or indium zinc oxide. The first sub-layer 105A can include a thickness of about 1 nm to about 50 nm.

The second sub-layer 105B includes a metal layer, e.g., chromium, titanium, gold, silver, copper, aluminum, or a combination thereof, disposed on the first sub-layer 105A. The second sub-layer 105B can include a thickness of about 50 nm to about 200 nm.

The third sub-layer 105C includes a transparent conductive oxide (TCO) layer, e.g., indium tin oxide or indium zinc oxide. The third sub-layer 105C can include a thickness of about 1 nm to about 200 nm. Optionally, the first sub-layer 105A, the second sub-layer 105B, and the third sub-layer 105C has a similar thickness.

In one embodiment, which can be combined with other embodiments described herein, the metal layers 104 are pre-patterned on the substrate 102, e.g., the substrate 102 is a pre-patterned indium tin oxide (ITO) glass substrate. In one embodiment, which can be combined with other embodiments described herein, the metal layers 104 are pre-patterned on the substrate 102, e.g., the metal layers 104 include a first sub-layer 105A of indium tin oxide, a second sub-layer 105B of silver, and a third sub-layer 105C of indium tin oxide.

The pixels are defined by adjacent pixel-defining layer (PDL) structures disposed on the substrate 102. The PDL structures 126 can be disposed on the substrate 102. The PDL structures 126 include one of an organic material, an organic material with an inorganic coating disposed thereover, or an inorganic material. The organic material of the PDL structures 126 includes, but is not limited to, polyimides. The inorganic material of the PDL structures 126 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent PDL structures define a respective sub-pixel and expose the anode (i.e., metal layer 104) of the respective sub-pixel of the sub-pixel circuit 1200.

The sub-pixel circuit 1200 has a plurality of sub-pixels 106 including at least a first sub-pixel 108A, a second sub-pixel 108B, and a third sub-pixel 108C. While the Figures depict the first sub-pixel 108A, the second sub-pixel 108B, and the third sub-pixel 108C, the sub-pixel circuit 1200 of the embodiments described herein may include three or more sub-pixels 106, such as a fourth and a fifth sub-pixel. Each sub-pixel 106 has an OLED material, e.g., first OLED material 112A, second OLED material 112B, and third OLED material 112C, configured to emit a white, red, green, blue or other color light when energized, e.g., the first OLED material 112A of the first sub-pixel 108A emits a yellow light when energized, the second OLED material 112B of the second sub-pixel 108B emits a yellow light when energized, the third OLED material 112C of the third sub-pixel 108C emits a blue light when energized, and the OLED material of a fourth sub-pixel emits a different color light when energized.

Inorganic overhang structures 110 are disposed over the substrate 102, thereby defining each sub-pixel of the plurality of sub-pixels. In some embodiments, as shown in FIG. 12A, the inorganic overhang structures 110 are disposed over each of the PDL structures 126. The inorganic overhang structures 110 are permanent to the sub-pixel circuit. The inorganic overhang structures 110 further define each sub-pixel 106 of the sub-pixel circuit 900. The inorganic overhang structures 110 include at least an upper portion 110B disposed on a lower portion 110A. A first configuration of the inorganic overhang structures 110 includes the upper portion 110B of a non-conductive inorganic material and the lower portion 110A of a conductive inorganic material. A second configuration of the inorganic overhang structures 110 includes the upper portion 110B of a conductive inorganic material and the lower portion 110A of a conductive inorganic material. A third configuration of the inorganic overhang structures 110 includes the upper portion 110B of a non-conductive inorganic material, the lower portion 110A of a non-conductive inorganic material, and an optional assistant cathode (not shown) disposed under the lower portion 110A. A fourth configuration of the inorganic overhang structures 110 includes the upper portion 110B of a conductive inorganic material, the lower portion 110A of a non-conductive inorganic material, and an optional assistant cathode (not shown) disposed under the lower portion 110A. The first, second, third, and fourth embodiments of the sub-pixel circuit 1200 include inorganic overhang structures 110 of at least one of the first, second, third, or fourth configurations. The inorganic overhang structures 110 are able to remain in place, e.g., are permanent.

The non-conductive inorganic material includes, but is not limited to, an inorganic silicon-containing material, e.g., the silicon-containing material includes oxides or nitrides of silicon, or combinations thereof. The conductive inorganic material includes, but is not limited to, a metal-containing material, e.g., the metal-containing material includes copper, titanium, aluminum, molybdenum, silver, indium tin oxide, indium zinc oxide, or combinations thereof.

At least a bottom surface 107 of the upper portion 110B is wider than a top surface 105 of the lower portion 110A to form an overhang 109. The bottom surface 107 larger than the top surface 105 forming the overhang 109 allows for the upper portion 110B to shadow the lower portion 110A. The shadowing of the overhang 109 provides for evaporation deposition each of the OLED material 112 and a cathode 114.

The OLED material, e.g., e.g., first OLED material 112A, second OLED material 112B, and third OLED material 112C, may include one or more of a HIL, a HTL, an EML, and an ETL. The OLED material, e.g., first OLED material 112A, second OLED material 112B, and third OLED material 112C, is disposed on the metal layer 104. In some embodiments, which can be combined with other embodiments described herein, the OLED material, e.g., first OLED material 112A, second OLED material 112B, and third OLED material 112C, is disposed on the metal layer 104 and over a portion of the PDL structures 126. A first cathode 114A, a second cathode 114B, and a third cathode 114C is disposed over the first OLED material 112A, second OLED material 112B, and third OLED material 112C, respectively, of the PDL structures 126 in each sub-pixel 106. The first cathode 114A, the second cathode 114B, and the third cathode 114C may be disposed on a portion of a sidewall 111 of the lower portion 110A. The first cathode 114A, the second cathode 114B, and the third cathode 114C includes a conductive material, such as a metal, e.g., chromium, titanium, aluminum, ITO, or a combination thereof. In other embodiments, which can be combined with other embodiments described herein, the first OLED material 112A, second OLED material 112B, and third OLED material 112C and the first cathode 114A, the second cathode 114B, and the third cathode 114C are disposed over a top surface 115 of the upper portion 110B of the inorganic overhang structures 110, respectively.

Each sub-pixel 106 includes include an encapsulation layer 116. The encapsulation layer 116 may be or may correspond to a local passivation layer. The encapsulation layer 116 of a respective sub-pixel, e.g., first encapsulation layer 116A, second encapsulation layer 116B, and third encapsulation layer 116C, is disposed over the first cathode 114A, the second cathode 114B, and the third cathode 114C, respectively, with the encapsulation layer 116 extending under at least a portion of each of the inorganic overhang structures 110 and along a sidewall of each of the inorganic overhang structures 110. The encapsulation layer 116 is disposed over the cathode and over at least the sidewall 111 of the lower portion 110A. In some embodiments, which can be combined with other embodiments described herein, the encapsulation layer 116 is disposed over the sidewall 113 of the upper portion 110B. In some embodiments, which can be combined with other embodiments described herein, the encapsulation layer 116 is disposed over the top surface 115 of the upper portion 110B of the inorganic overhang structures 110. The encapsulation layer 116 can include a non-conductive inorganic material, such as the silicon-containing material. The silicon-containing material may include $Si_3N_4$ containing materials.

An intermediate layer 118 may be deposited over the encapsulation layer 116, as shown in FIG. 12A. The intermediate layer 118 can include a monomer and/or a polymer, e.g., an inorganic polymer or an organic polymer. In some embodiments, the intermediate layer 118 can include a thickness of about 1 µm to about 10 µm, e.g., about 1 µm to about 5 µm, about 2 µm to about 8 µm, or about 4 µm to about 6 µm. Optionally, a second encapsulation layer 120 may be deposited over the intermediate layer 118. The second encapsulation layer 120 can include any of the encapsulation layer 116. The second encapsulation layer 120 can include a thickness of about 1 µm to about 10 µm, e.g., about 1 µm to about 5 µm, about 2 µm to about 8 µm, or about 4 µm to about 6 µm.

A plurality of mask structures 122 may be disposed over the second encapsulation layer 120. The plurality of mask structures 122 can be a material suitable to absorb external and/or internal light, e.g., a black material such as a black absorbing material. The plurality of mask structures 122 are disposed according to the first sub-pixel 108A, a second sub-pixel 108B, and a third sub-pixel 108C. For example, the plurality of mask structures 122 are disposed to such that the plurality of mask structures are aligned with the PDL structures 126 and/or the inorganic overhang structures 110, thereby allowing light emission from the OLED materials through an opening between the plurality of mask structures 122.

A color filter is disposed in the opening between the plurality of mask structures 122. A first color filter 124A may be aligned with the first sub-pixel 108A, a second color filter 124B may be aligned with the second sub-pixel 108B, and a third color filter 124C may be aligned with the third sub-pixel 108C. Each of the first color filter 124A, the second color filter 124B, or the third color filter 124C may be configured to restrict light transparency from a bottom surface of the color filter to a top surface of the color filter to a specific color and/or wavelength, e.g., red, green, and/or blue. For example, the first color filter 124A may receive a yellow, white, and/or red light and restrict light transparency to the color red, thereby only emitting red emission from the first sub-pixel 108A. As a further example, the second color filter 124B may receive a yellow, white, and/or red light and may restrict light transparency to the color green, thereby only emitting green emission from the second sub-pixel 108B. As a further example, the third color filter 124C may receive a blue, white, and/or yellow light and may restrict light transparency to the color blue, thereby only emitting blue emission from the third sub-pixel 108C.

Figure 12B:
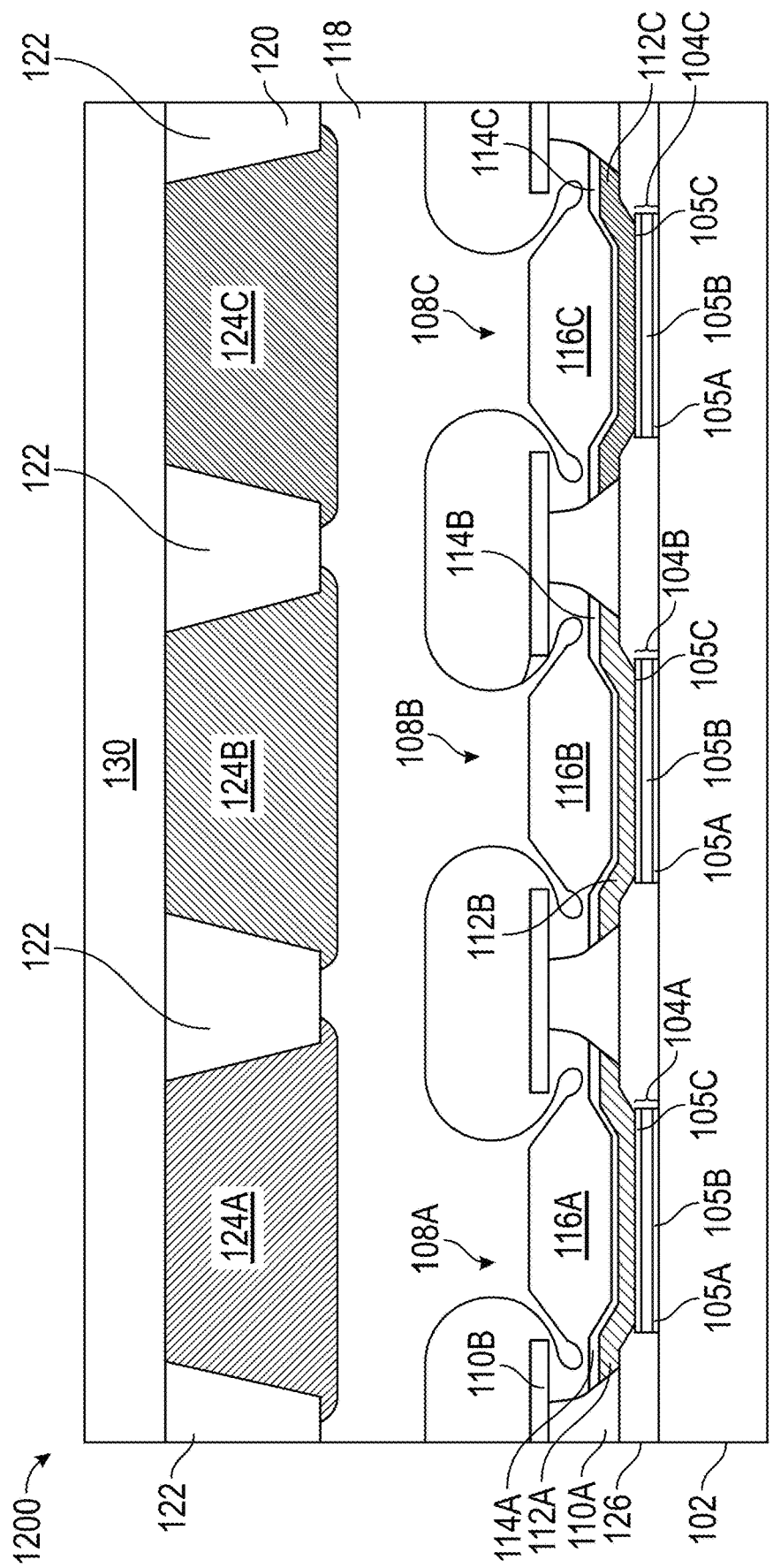

Optionally, the plurality of mask structures 122 and the color filters, e.g., the first color filter 124A, the second color filter 124B, or the third color filter 124C may be disposed on a backing material 130, as shown in FIG. 12B. The backing material 130 can include a transparent material suitable for supporting the plurality of mask structures 122 and the color filters, e.g., the first color filter 124A, the second color filter 124B, or the third color filter 124C. The plurality of mask structures 122 and the color filters, e.g., the first color filter 124A, the second color filter 124B, or the third color filter 124C may be disposed on the backing material 130, inverted, and placed on the intermediate layer 118, as shown in FIG. 12B, thereby allowing for manufacturing of the color filters to occur in parallel with the manufacturing of the sub-pixels, and reducing the time for manufacturing.

Figure 12C:
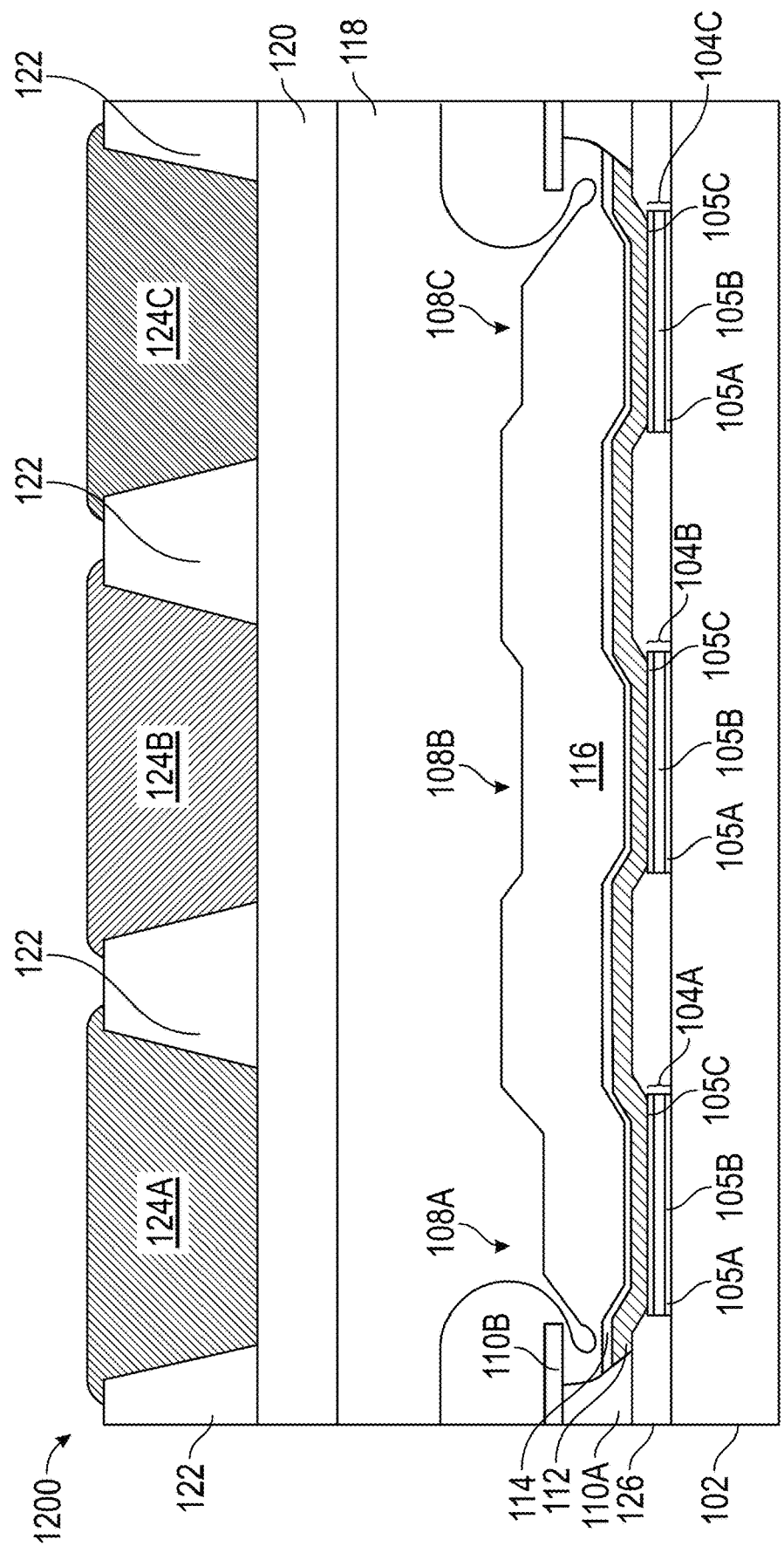

FIG. 12C is a schematic, cross-sectional view of a sub-pixel circuit 1200, in which the sub-pixel circuit 1200 has the OLED material 112 and the cathode 114 shared across the first sub-pixel 108A, the second sub-pixel 108B, and the third sub-pixel 108C. The OLED material 112 can includes a white emitting OLED material, as described herein. The OLED material 112 and the cathode 114 may be shared due to a removal of an inorganic overhangs structure 110 between the first sub-pixel 108A and the second sub-pixel 108B, and the second sub-pixel 108B and the third sub-pixel 108C.

The third sub-layer 105C of the first sub-pixel 108A, the second sub-pixel 108B, and the third sub-pixel 108C is similar. Without being bound by theory, a reduction of manufacturing costs occurs due to the reduced materials required to produce the sub-pixel circuit 1200, e.g., reduction of overhang structures, and reduction of individualized OLED materials.

Figure 12D:
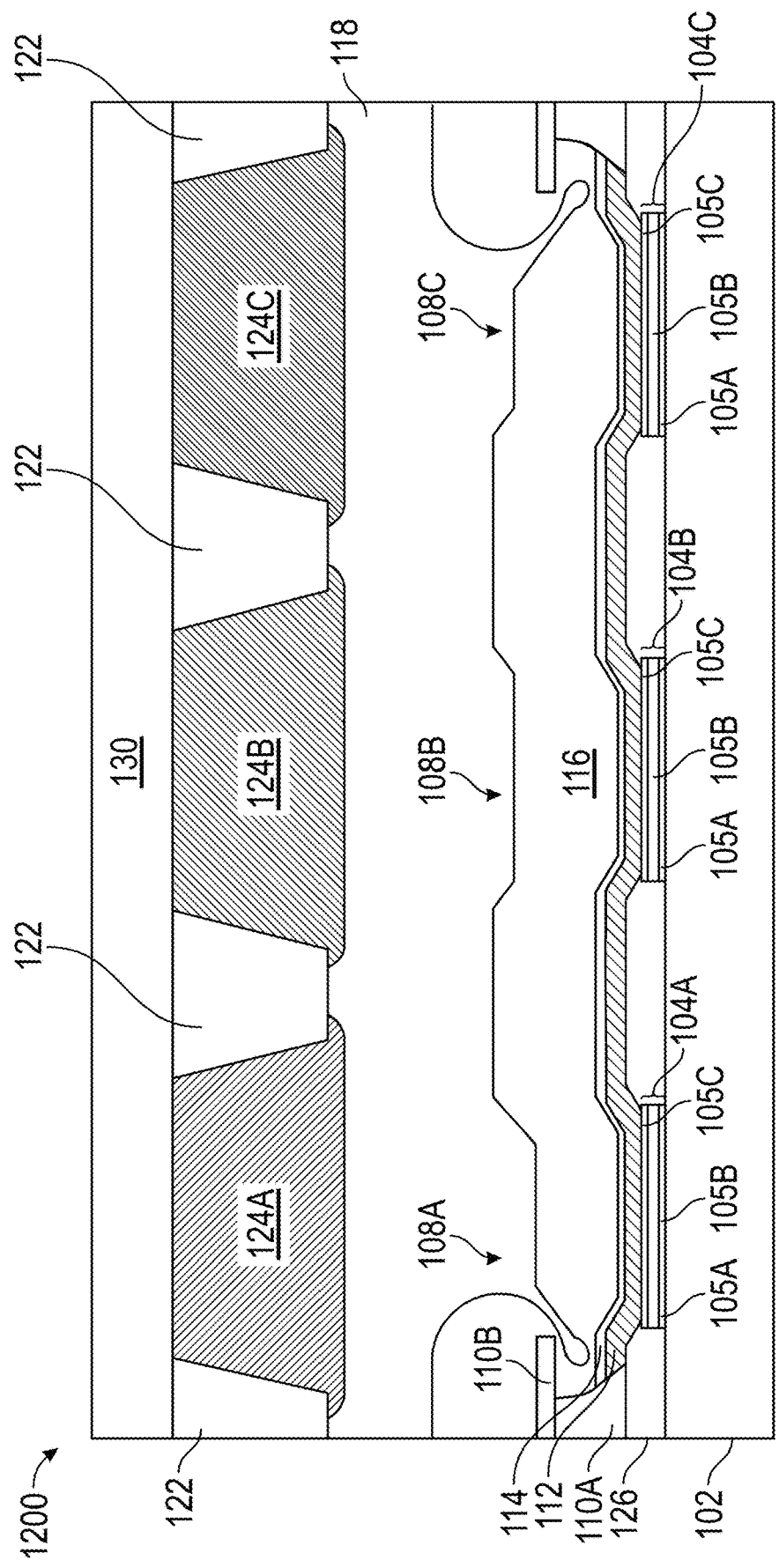

Optionally, the plurality of mask structures 122 and the color filters, e.g., the first color filter 124A, the second color filter 124B, or the third color filter 124C may be disposed on a backing material 130, as shown in FIG. 12D. The backing material 130 can include a transparent material suitable for supporting the plurality of mask structures 122 and the color filters, e.g., the first color filter 124A, the second color filter 124B, or the third color filter 124C. The plurality of mask structures 122 and the color filters, e.g., the first color filter 124A, the second color filter 124B, or the third color filter 124C may be disposed on the backing material 130, inverted, and placed on the intermediate layer 118, as shown in FIG. 12D, thereby allowing for manufacturing of the color filters to occur in parallel with the manufacturing of the sub-pixels, and reducing the time for manufacturing.

Figure 13A:
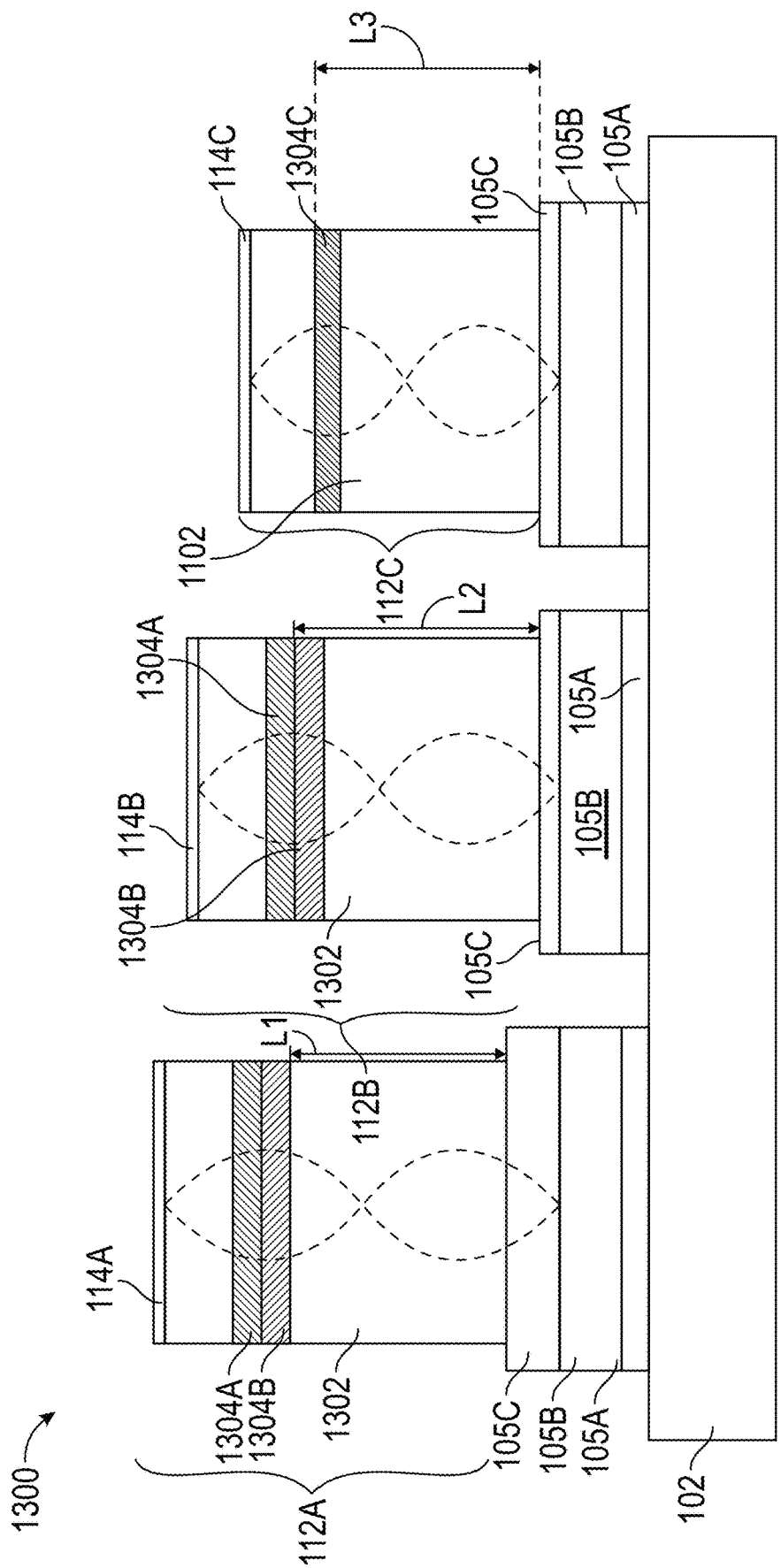
FIGS. 13A-13D are schematic, cross-sectional views of an substrate, according to embodiments described herein.

FIG. 13A shows a schematic, cross-sectional views of a substrate 1300. The substrate 1300 includes a plurality of metal layers, each metal layer 104 including a first sub-layer 105A, a second sub-layer 105B, and a third sub-layer 105C. The plurality of metal layers includes a first metal layer 104A, a second metal layer 104B, and a third metal layer 104C. The first metal layer 104A includes a third sub-layer 105C that is thicker than a third sub-layer 105C of the second metal layer 104B, and/or the third metal layer 104C.

The substrate 1300 includes a first OLED material 112A. The first OLED material 112A including a bulk OLED material 1302. The bulk OLED material 1302 includes a non-emission material of the first OLED material 112A. The first OLED material 112A includes a first emission material 1304A. The first emission material 1304A can include a material configured to emit a red, green, blue, or yellow wavelength of light upon receiving a current. For example, the first emission material 1304A can include a material configured to emit a red wavelength of light. The first OLED material 112A includes a second emission material 1304B. The second emission material 1304B can include a material configured to emit a red, green, blue, or yellow wavelength of light upon receiving a current. For example, the second emission material 1304B can include a material configured to emit a green wavelength of light.

The first emission material 1304A is separated by a distance "L1" from the second sub-layer 105B. The second sub-layer 105B is configured to emit a standing wave, the standing wave including nodes, e.g., locations where the waves intersect at the mean position of the wave, and anti-nodes, e.g., locations where the waves include a displacement of greater than 90% from a mean position. The distance "L1" is a distance where the first emission material 1304A intersects an anti-node location in the first OLED material 112A. Without being bound by theory, the thickness of the third sub-layer 105C adjusts the location of the anti-node in the first OLED material 112A, such that the first emission material 1304A may emit a red light from the first OLED material 112A.

The substrate 1300 includes a second OLED material 112B. The second OLED material 112B including a bulk OLED material 1302. The first OLED material 112A includes the first emission material 1304A and the second emission material 1304B. The second emission material 1304B is separated by a distance "L2" from the second sub-layer 105B. The distance "L2" is shorter than the distance "L1". The distance "L2" is a distance where the second emission material 1304B intersects an anti-node location in the second OLED material 112B. Without being bound by theory, the thickness of the third sub-layer 105C adjusts the location of the anti-node in the second OLED material 112B, such that the second emission material 1304B may emit a green light from the second OLED material 112B.

The substrate 1300 includes a third OLED material 112C. The third OLED material 112C including a bulk OLED material 1302. The third OLED material 112C includes a third emission material 1304C. The third emission material 1304C can include a material configured to emit a red, green, blue, or yellow wavelength of light upon receiving a current. For example, the third emission material 1304C can include a material configured to emit a blue wavelength of light. The third emission material 1304C is separated by a distance "L3" from the second sub-layer 105B. The distance "L3" is shorter than the distance "L1" and/or "L2". The distance "L3" is a distance where the third emission material 1304C intersects an anti-node location in the third OLED material 112C. Without being bound by theory, the thickness of the third sub-layer 105C adjusts the location of the anti-node in the third OLED material 112C, such that the third emission material 1304C may emit a blue light from the third OLED material 112C.

Figure 13B:
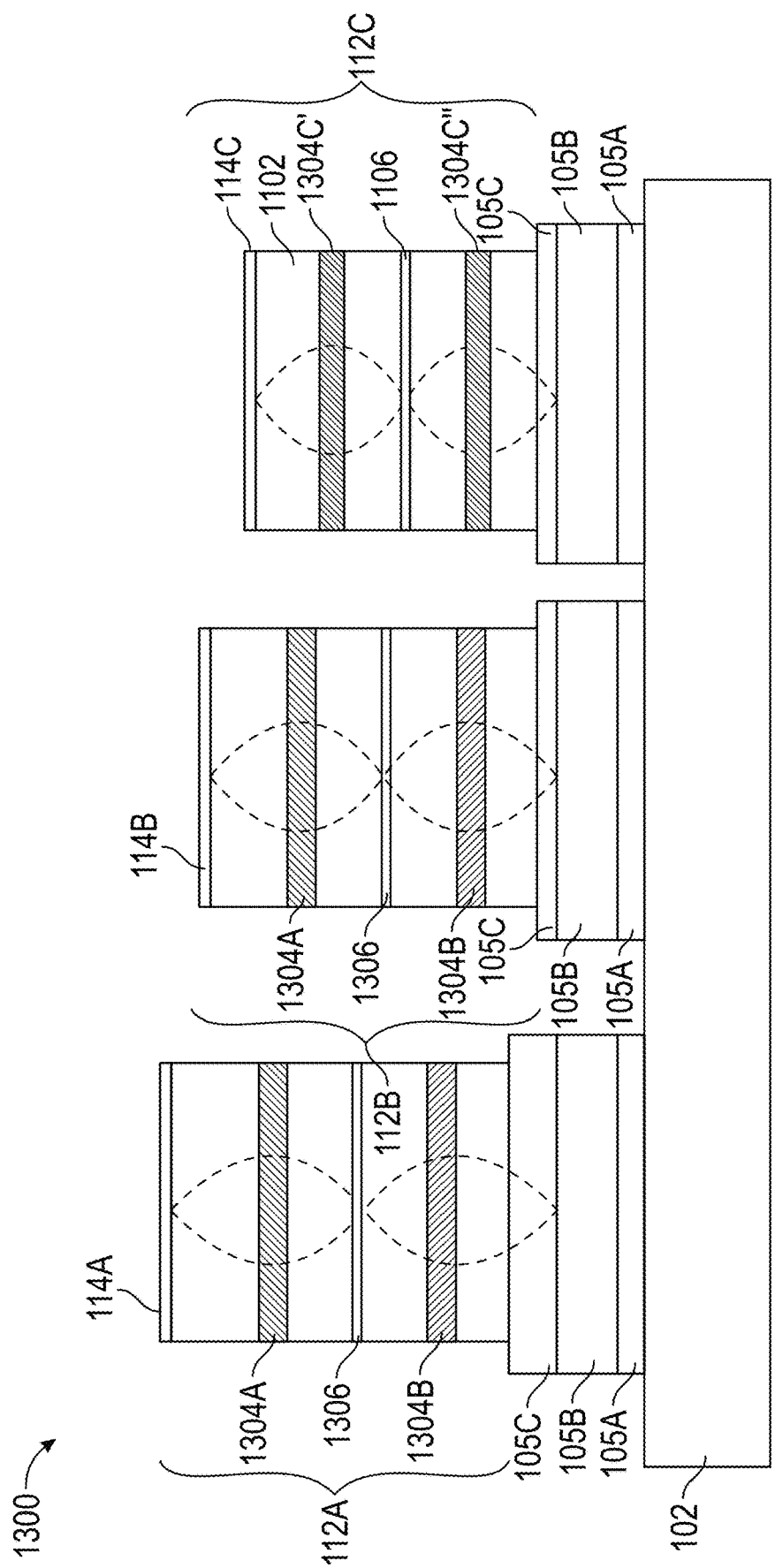

Optionally, a charge generation layer 1306 may be disposed between the first emission material 1304A and the second emission material 1304B, as shown in FIG. 13B. Optionally, the charge generation layer 1306 may be disposed between an upper third emission layer 1304C' and a lower third emission layer 1304C". A charge generation layer 1306 includes a donor and an acceptor material. Without being bound by theory, the charge generation layer 1306 can act as an artificial metal anode and/or cathode, thereby providing a source for electrons to flow to and/or from in the OLED material 112. Without being bound by theory, the charge generation layer 1306 can provide an enhanced standing wave current, thereby increasing intensity and/or brightness of the emission of the wavelength from the OLED material 112.

Figure 13C:
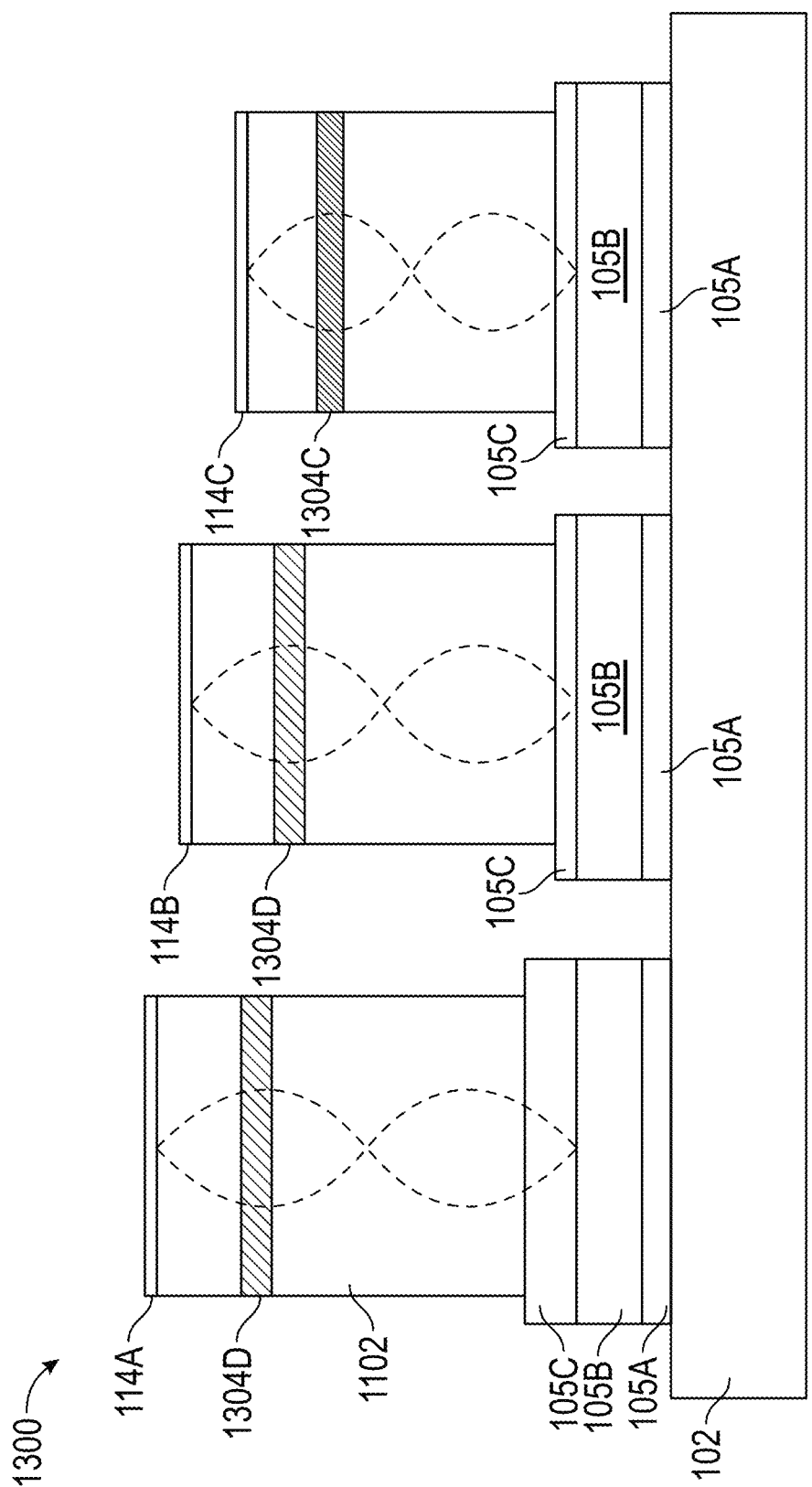
Figure 13D:
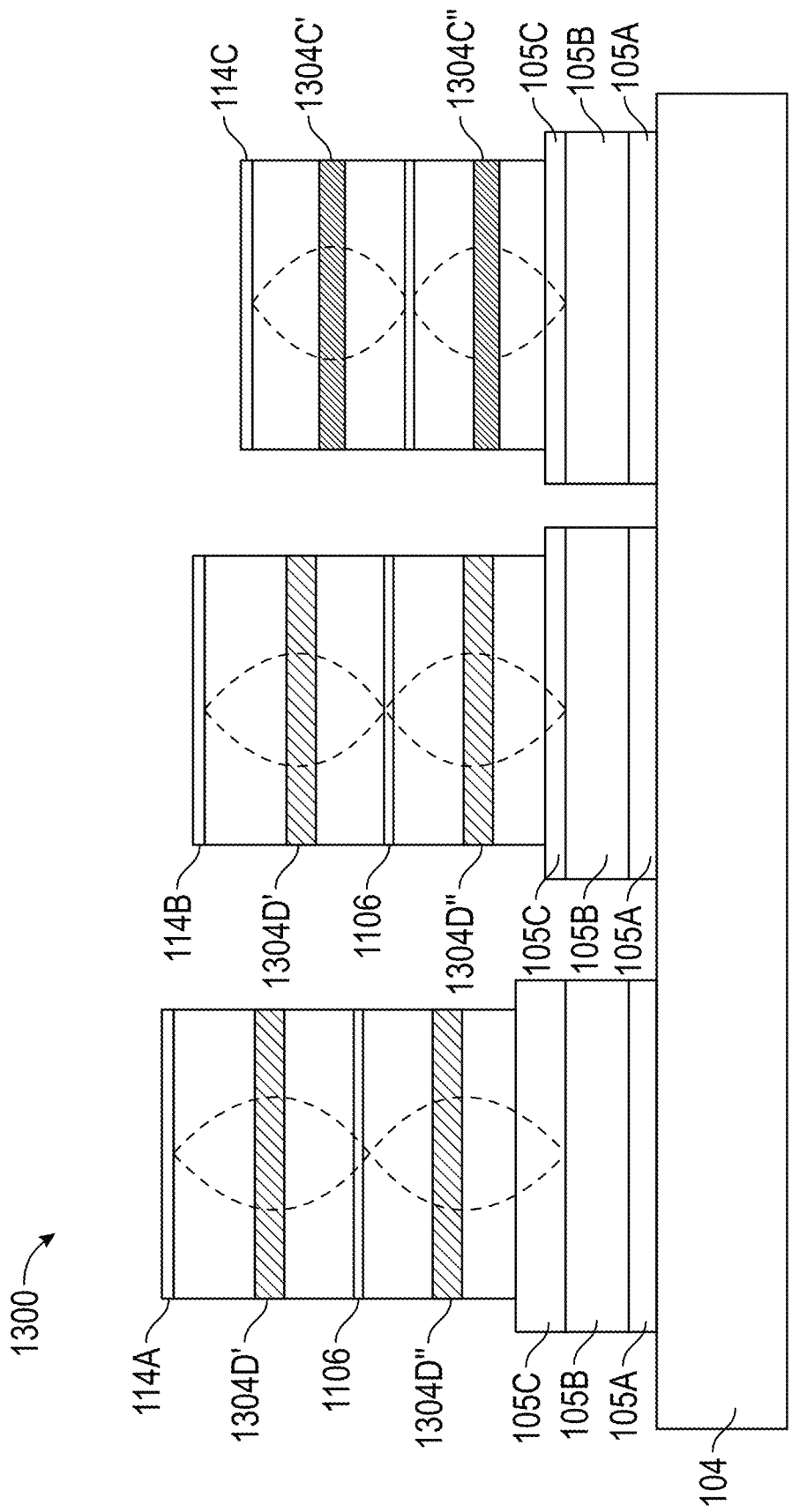

Optionally, a fourth emission material 1304D may be disposed between the in the bulk OLED material 1302, as shown in FIG. 13C. The fourth emission material 1304D can include a material configured to emit a red, green, blue, or yellow wavelength of light upon receiving a current. For example, the fourth emission material 1304D can include a material configured to emit a yellow wavelength of light. Without being bound by theory, the thickness of the third sub-layer 105C adjusts the location of the anti-node in the first OLED material 112A and the second OLED material 112B, such that wavelength of light may be adjusted. Optionally, a charge generation layer 1306 may be disposed between an upper fourth emission layer 1304D' and a lower fourth emission layer 1304D", as shown in FIG. 13D. Optionally, the charge generation layer 1306 may be disposed between an upper third emission layer 1304C' and a lower third emission layer 1304C".

Figure 14A:
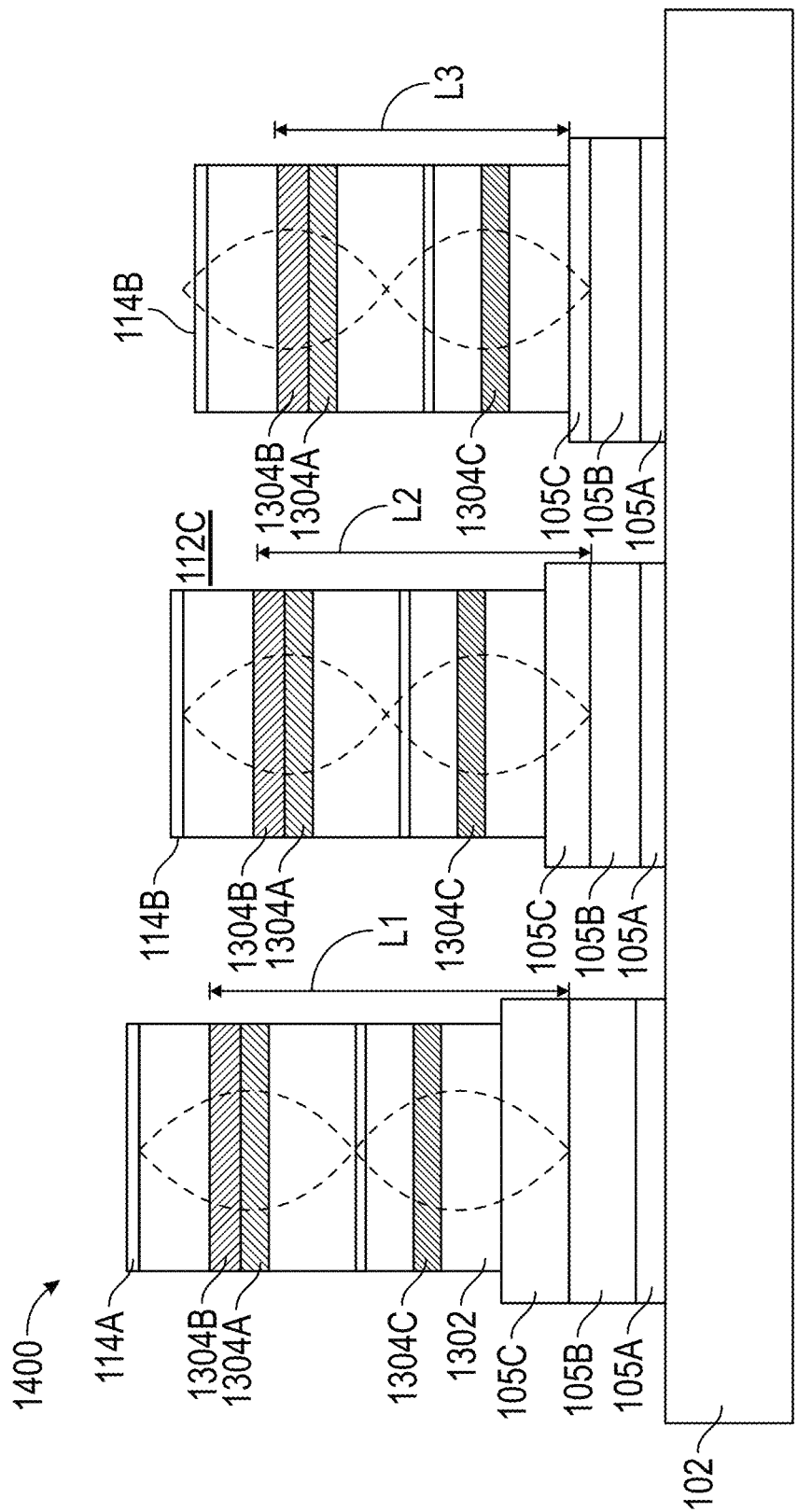
FIGS. 14A-14B are schematic, cross-sectional views of an substrate, according to embodiments described herein.

FIG. 14A shows a schematic, cross-sectional views of a substrate 1400. The substrate 1400 includes a plurality of metal layers, each metal layer 104 including a first sub-layer 105A, a second sub-layer 105B, and a third sub-layer 105C. The plurality of metal layers includes a first metal layer 104A, a second metal layer 104B, and a third metal layer 104C. The first metal layer 104A includes a third sub-layer 105C that is thicker than a third sub-layer 105C of the second metal layer 104B, and/or the third metal layer 104C.

The substrate 1400 includes a first OLED material 112A. The first OLED material 112A including a bulk OLED material 1302. The first OLED material 112A includes a first emission material 1304A, a second emission material 1304B and a third emission material 1304C. The first emission material 1304A and the second emission material 1304B are separated from the third emission material 1304C by a charge generation layer 1306. The first emission material 1304A is separated by the distance "L1" from the second sub-layer 105B. Without being bound by theory, the first OLED material 112A can emit a white light due to the thickness of the third sub-layer 105C and the distance "L1" of the first emission material 1304A to the second sub-layer 105B. The substrate 1400 includes a second OLED material 112B. The second OLED material 112B includes a first emission material 1304A, a second emission material 1304B, and a third emission material 1304C. The first emission material 1304A and the second emission material 1304B are separated from the third emission material 1304C by a charge generation layer 1306. The second emission material 1304B is separated by the distance "L2" from the second sub-layer 105B. Without being bound by theory, the second OLED material 112B can emit a white light due to the thickness of the third sub-layer 105C and the distance "L2" of the second emission material 1304B to the second sub-layer 105B. The substrate 1400 includes a third OLED material 112C. The third OLED material 112C includes a first emission material 1304A, a second emission material 1304B, and a third emission material 1304C. The first emission material 1304A and the second emission material 1304B are separated from the third emission material 1304C by a charge generation layer 1306. The second emission material 1304B is separated by the distance "L3" from the second sub-layer 105B. Without being bound by theory, the third OLED material 112C can emit a white light due to the thickness of the third sub-layer 105C and the distance "L3" of the second emission material 1304B to the second sub-layer 105B.

Figure 14B:
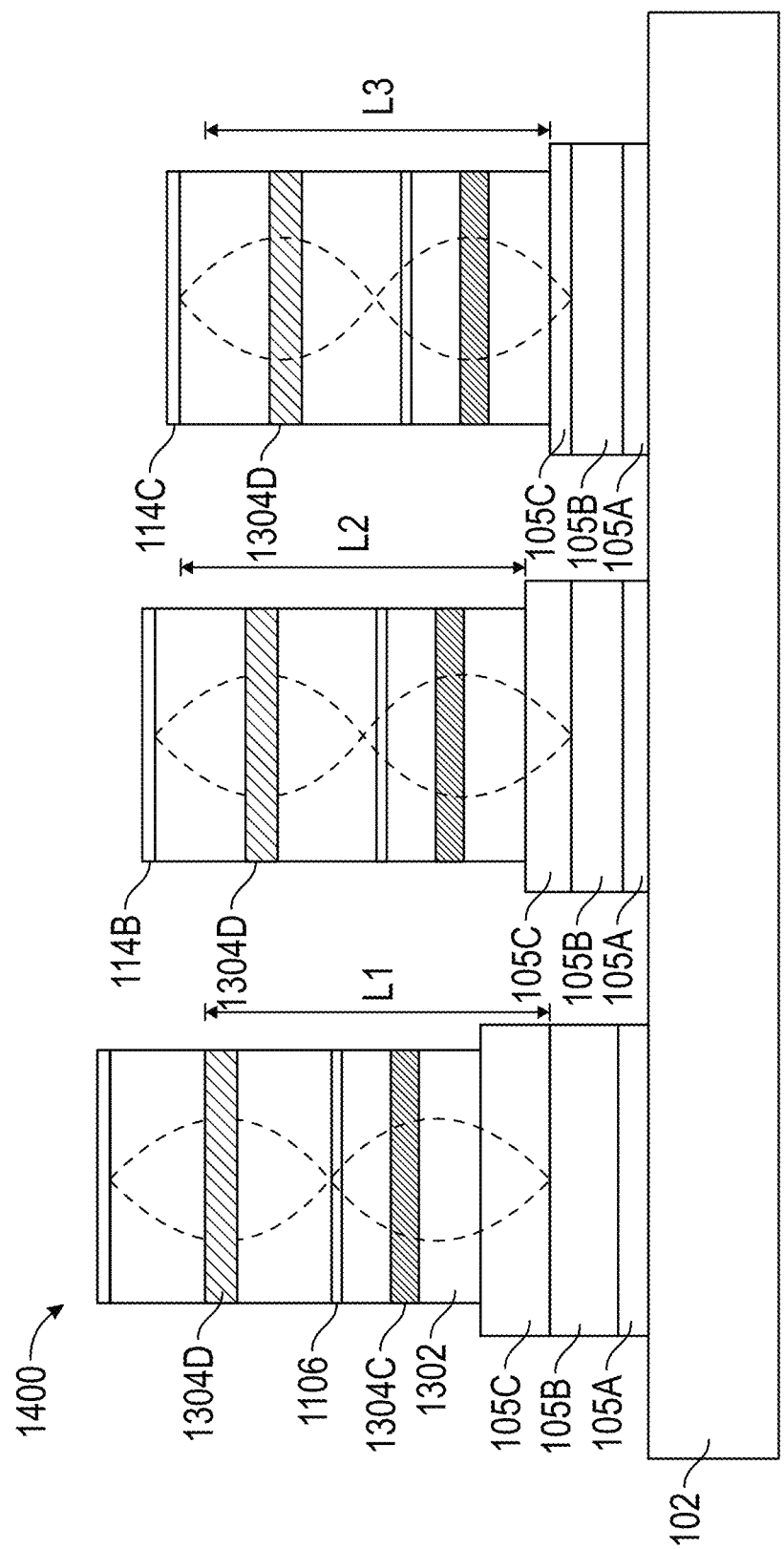

Optionally, a fourth emission material 1304D may be disposed above the charge generation layer 1306, thereby replacing the first emission material 1304A and/or the second emission material 1304B, as shown in FIG. 14B. The fourth emission material 1304D can include a material configured to emit a red, green, blue, or yellow wavelength of light upon receiving a current. For example, the fourth emission material 1304D can include a material configured to emit a yellow wavelength of light.

Figure 15A:
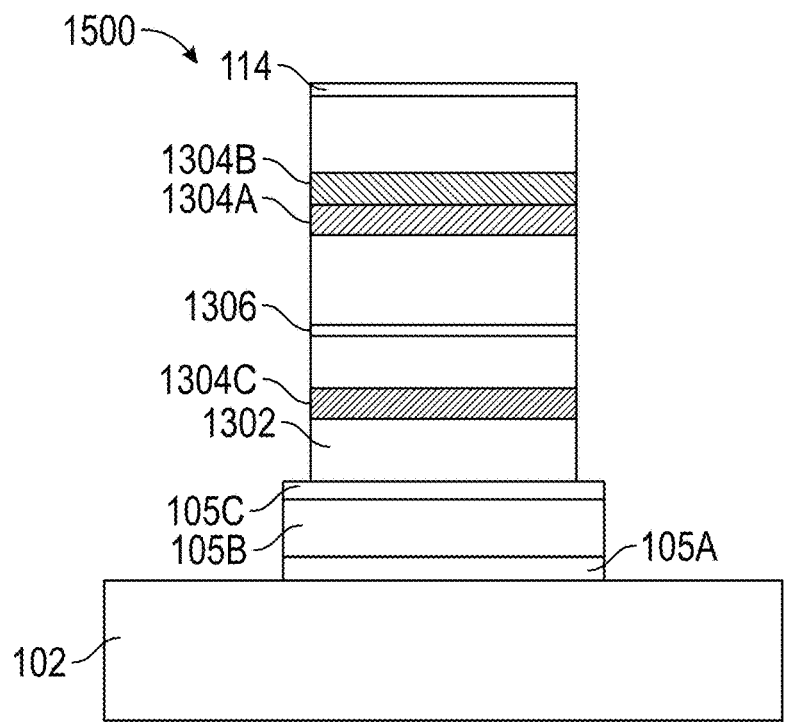
FIGS. 15A-15B are schematic, cross-sectional views of an substrate, according to embodiments described herein.
Figure 15B:
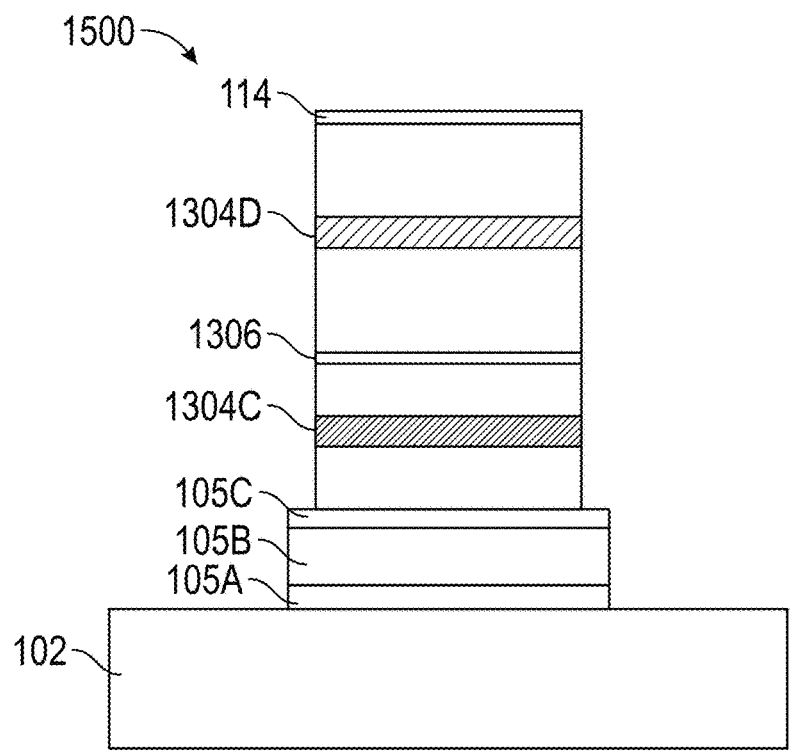

FIG. 15A shows a schematic, cross-sectional views of a substrate 1500. The substrate 1500 includes a metal layer 104 including a first sub-layer 105A, a second sub-layer 105B, and a third sub-layer 105C. The first sub-layer 105A, the second sub-layer 105B, and the third sub-layer 105C include a similar thickness. The substrate 1500 includes an OLED material 112. The OLED material 112 includes a bulk OLED material 1302. The OLED material 112 includes a first emission material 1304A, a second emission material 1304B and a third emission material 1304C. The first emission material 1304A and the second emission material 1304B are separated from the third emission material 1304C by a charge generation layer 1306. Optionally, a fourth emission material 1304D may be disposed above the charge generation layer 1306, thereby replacing the first emission material 1304A and/or the second emission material 1304B, as shown in FIG. 15B. The fourth emission material 1304D can include a material configured to emit a red, green, blue, or yellow wavelength of light upon receiving a current. For example, the fourth emission material 1304D can include a material configured to emit a yellow wavelength of light.

Overall, a sub-pixel circuit for an OLED device and methods of forming a sub-pixel circuit are described herein. The sub-pixel circuits include varying thicknesses of a third sub-layer of a metal layer, thereby allowing for control of an emission wavelength of the OLED material. By controlling the emission of the wavelength, one or more overhang structures may be eliminated and/or removed, while maintaining color intensity and contrast, thereby reducing manufacturing costs. Moreover, by controlling the emission of the wavelength by varying the thickness of the third sub-layer of a metal layer, a plurality of OLED material configurations may be implemented, thereby allowing for various wavelength emissions to be utilized while still maintaining color intensity and contrast.

While the foregoing is directed to embodiments of the present disclosure, other and further embodiments of the disclosure may be devised without departing from the basic scope thereof, and the scope thereof is determined by the claims that follow.

What is claimed is:
1. A device, comprising:
 a substrate;
 an inorganic layer disposed on the substrate, the inorganic layer defining sub-pixels of the device, wherein the inorganic layer comprises a plurality of overhang structures defining overhangs;
 a first sub-pixel comprising:
  a first anode having a first sub-layer, a second sub-layer, and a third sub-layer disposed over the substrate, the third sub-layer having a first thickness disposed over the substrate;
  a first organic light-emitting diode (OLED) material disposed over and in direct contact with the third sub-layer of the first anode; and
  a first encapsulation layer contacting a sidewall of the overhang structures under an overhang and an underside surface of the overhang structures of the first sub-pixel;
 a second sub-pixel comprising:
  a second anode having a first sub-layer, a second sub-layer, and a third sub-layer disposed over the substrate, the third sub-layer having a second thickness disposed over the substrate;
  a second OLED material disposed over and in direct contact with the third sub-layer of the second anode; and
  the first encapsulation layer or a second encapsulation, the second encapsulation layer contacting the sidewall of the overhang structures under the overhangs and the underside surface of the overhang structures of the second sub-pixel; and
 a third sub-pixel comprising:
  a third anode having a first sub-layer, a second sub-layer, and a third sub-layer disposed over the sub- strate, the third sub-layer having a third thickness disposed over the substrate; and
a third organic light-emitting diode (OLED) material disposed over and in direct contact with the third sub-layer of the third anode, wherein:
the first thickness is greater than the second thickness, and
the first OLED material and the second OLED material are the same; and
a third encapsulation layer contacting the sidewall of the overhang structures under the overhangs and the underside surface of the overhang structures of the third sub-pixel, wherein the first encapsulation layer and the third encapsulation layer are separated from each other.

2. The device of claim 1, further comprising:
a first color filter disposed over the first sub-pixel;
a second color filter disposed over the second sub-pixel; and
a third color filter disposed over the third sub-pixel.

3. The device of claim 1, wherein the second thickness is greater than the third thickness.

4. The device of claim 1, wherein the first OLED material, the second OLED material, and the third OLED material are the same.

5. The device of claim 1, further comprising a pixel defining layer (PDL) disposed on the substrate and below the inorganic layer.

6. The device of claim 1, wherein the first sub-pixel and the second sub-pixel share the first OLED material and the second OLED material.

7. The device of claim 1, further comprising a plurality of mask structures disposed over an encapsulation layer, the plurality of mask structures aligned with the plurality of overhang structures.

8. The device of claim 7, wherein a color filter is disposed between the plurality of mask structures.

9. The device of claim 8, further comprising a backing material disposed over the color filter and the plurality of mask structures.

10. The device of claim 1, wherein an intermediate layer is disposed on the first encapsulation layer and the third encapsulation layer and the intermediate layer is disposed in a gap between the first encapsulation layer and the third encapsulation layer.

11. A device, comprising:
a substrate;
an inorganic layer disposed on the substrate, the inorganic layer defining sub-pixels of the device, wherein the inorganic layer comprises a plurality of overhang structures;
a first sub-pixel comprising:
a first anode comprising a first sub-layer, a second sub-layer, and a third sub-layer disposed over the substrate, the third sub-layer having a first thickness disposed over the substrate; and
a first organic light-emitting diode (OLED) material disposed over and in direct contact with the third sub-layer of the first anode;
a second sub-pixel comprising:
a second anode the first sub-layer, the second sub-layer, and the third sub-layer disposed over the substrate, the third sub-layer of the second anode having a second thickness disposed over the substrate; and
a second OLED material disposed over and in direct contact with the third sub-layer of the second anode; and a third sub-pixel comprising:
a third anode having a third thickness disposed over the substrate; and
a third organic light-emitting diode (OLED) material disposed over and in direct contact with the third sub-layer of the third anode; and
a global passivation layer disposed over the first sub-pixel, the second sub-pixel, the third sub-pixel, and the plurality of overhang structures;
wherein the first thickness of the third sub-layer of the first anode is greater than the second thickness of the third sub-layer of the second anode, and
wherein the first OLED material and the second OLED material are the same.

12. The device of claim 11, further comprising a pixel defining layer (PDL) disposed on the substrate and below the inorganic layer.

13. The device of claim 11, wherein the first sub-pixel and the second sub-pixel share the first OLED material and the second OLED material.

14. The device of claim 11, further comprising a plurality of mask structures disposed over the global passivation layer, wherein the plurality of mask structures aligned with the plurality of overhang structures, and wherein a color filter is disposed between the plurality of mask structures.

15. The device of claim 14, further comprising a backing material disposed over the color filter and the plurality of mask structures.

16. The device of claim 11, further comprising:
a first color filter disposed over the first sub-pixel;
a second color filter disposed over the second sub-pixel; and
a third color filter disposed over the third sub-pixel.

17. The device of claim 11, wherein the second thickness is greater than the third thickness.

18. The device of claim 11, wherein the second thickness and the third thickness are the same.

19. The device of claim 11, wherein the first OLED material, the second OLED material, and the third OLED material are the same.

20. A device, comprising:
a substrate;
an inorganic layer disposed on the substrate, the inorganic layer defining sub-pixels of the device, wherein the inorganic layer comprises a plurality of overhang structures;
a first sub-pixel comprising:
a first anode comprising a first sub-layer, a second sub-layer, and a third sub-layer disposed over the substrate, the third sub-layer having a first thickness disposed over the substrate; and
a first organic light-emitting diode (OLED) material disposed over and in direct contact with the third sub-layer of the first anode;
a second sub-pixel comprising:
a second anode, the first sub-layer, the second sub-layer, and the third sub-layer disposed over the substrate, the third sub-layer of the second anode having a second thickness disposed over the substrate; and
a second OLED material disposed over and in direct contact with the third sub-layer of the second anode; and
a third sub-pixel comprising:
a third anode, the first sub-layer, the second sub-layer, and the third sub-layer disposed over the substrate, the third sub-layer of the second anode having a third thickness disposed over the substrate; and a third organic light-emitting diode (OLED) material disposed over and in direct contact with the third sub-layer of the third anode, wherein the first thickness of the third sub-layer of the first anode is greater than the second thickness of the third sub-layer of the second anode, wherein the second thickness of the third sub-layer of the second anode is greater than the third thickness of the third sub-layer of the third anode, and wherein the first OLED material and the second OLED material are the same.

21. The device of claim 20, further comprising a pixel defining layer (PDL) disposed on the substrate and below the inorganic layer.

22. The device of claim 20, wherein the first sub-pixel and the second sub-pixel share the first OLED material and the second OLED material.

23. The device of claim 20, further comprising a plurality of mask structures disposed over an encapsulation layer, the plurality of mask structures aligned with the plurality of overhang structures.

24. The device of claim 23, wherein a color filter is disposed between the plurality of mask structures.

25. The device of claim 20, further comprising:
a first color filter disposed over the first sub-pixel;
a second color filter disposed over the second sub-pixel; and
a third color filter disposed over the third sub-pixel.

26. The device of claim 20, wherein the first OLED material, the second OLED material, and the third OLED material are the same.

27. A device, comprising:
a substrate;
an inorganic layer disposed on the substrate, the inorganic layer defining sub-pixels of the device, wherein the inorganic layer comprises a plurality of overhang structures defining overhangs;
a plurality of sub-pixels, each sub-pixel comprising:
an anode comprising:
a first sub-layer;
a second sub-layer disposed over the first sub-layer; and
a third sub-layer disposed over the second sub-layer;
an organic light-emitting diode (OLED) material disposed over and in direct contact with the third sub-layer of the anode, the OLED material comprising:
a first emission material;
a charge generation layer; and
a second emission material;
a cathode disposed over and in direct contact with the OLED material;
an encapsulation layer disposed over the OLED material, the encapsulation layer contacting a sidewall of the overhang structures under the overhangs and an underside surface of the overhang structures;
an intermediate layer is disposed on the first encapsulation layer; and
a color filter disposed over the intermediate layer;
wherein the device comprises at least a first anode comprising a first thickness, a second anode comprising a second thickness, and a third anode comprising a third thickness.

28. The device of claim 27, wherein the first thickness, the second thickness and the third thickness are the same.

29. The device of claim 27, wherein the first thickness, the second thickness and the third thickness are different.

30. The device of claim 27, wherein encapsulation layers of a first sub-pixel, a second sub-pixel, and a third sub-pixel are separated from each other and the intermediate layer is disposed in gaps between the encapsulation layers.

* * * * *

UNITED STATES PATENT AND TRADEMARK OFFICE
CERTIFICATE OF CORRECTION

| | | |
|---|---|---|
| PATENT NO. | : 12,453,252 B1 | Page 1 of 1 |
| APPLICATION NO. | : 18/826732 | |
| DATED | : October 21, 2025 | |
| INVENTOR(S) | : Yu-Hsin Lin et al. | |

It is certified that error appears in the above-identified patent and that said Letters Patent is hereby corrected as shown below:

In the Claims

In Column 40, Lines 21-22, in Claim 27, delete "first encapsulation" and insert -- encapsulation --.

Signed and Sealed this
Sixteenth Day of December, 2025

John A. Squires
*Director of the United States Patent and Trademark Office*